(12) United States Patent
Ahn

(10) Patent No.: US 10,930,667 B2
(45) Date of Patent: Feb. 23, 2021

(54) SEMICONDUCTOR DEVICE AND MANUFACTURING METHOD OF THE SAME

(71) Applicant: SK hynix Inc., Icheon-si (KR)

(72) Inventor: Jung Ryul Ahn, Namyangju-si (KR)

(73) Assignee: SK hynix Inc., Icheon-si (KR)

( * ) Notice: Subject to any disclaimer, the term of this patent is extended or adjusted under 35 U.S.C. 154(b) by 62 days.

(21) Appl. No.: 15/922,707

(22) Filed: Mar. 15, 2018

(65) Prior Publication Data
US 2018/0204850 A1 Jul. 19, 2018

Related U.S. Application Data

(63) Continuation of application No. 15/042,362, filed on Feb. 12, 2016, now Pat. No. 9,960,177.

(30) Foreign Application Priority Data

May 26, 2015 (KR) .................. 10-2015-0073035
Sep. 2, 2015 (KR) .................. 10-2015-0124390

(51) Int. Cl.
*H01L 27/11582* (2017.01)
*H01L 27/11573* (2017.01)
*H01L 27/1157* (2017.01)

(52) U.S. Cl.
CPC .... *H01L 27/11582* (2013.01); *H01L 27/1157* (2013.01); *H01L 27/11573* (2013.01)

(58) Field of Classification Search
CPC ......... H01L 27/11568; H01L 27/11578; H01L 27/11573; H01L 27/11582; H01L 27/1157; H01L 27/115; H01L 27/11551
See application file for complete search history.

(56) References Cited

U.S. PATENT DOCUMENTS

| 2010/0090286 A1 | 4/2010 | Lee et al. |
| 2011/0031546 A1 | 2/2011 | Uenaka et al. |
| 2011/0151667 A1 | 6/2011 | Hwang et al. |
| 2011/0220987 A1* | 9/2011 | Tanaka ............ H01L 27/11578 257/324 |
| 2012/0061744 A1* | 3/2012 | Hwang ............ H01L 27/11565 257/324 |
| 2012/0184078 A1 | 7/2012 | Kiyotoshi |
| 2012/0276719 A1 | 11/2012 | Han et al. |
| 2013/0178048 A1* | 7/2013 | Sun .................. H01L 21/76889 438/478 |

(Continued)

FOREIGN PATENT DOCUMENTS

| KR | 1020120026881 A | 3/2012 |
| KR | 1020120122764 A | 11/2012 |

*Primary Examiner* — Kenneth Parker
*Assistant Examiner* — John Lin
(74) *Attorney, Agent, or Firm* — William Park & Associates Ltd.

(57) ABSTRACT

A semiconductor device includes a substrate including a cell region and a peripheral region, a cell stacked structure stacked on the substrate in the cell region, a channel layer in one structure penetrating the cell stacked structure, a driving transistor formed in the peripheral region, and a plug structure coupled to the driving transistor and including a stacking structure of at least two contact plugs shorter than the channel layer, wherein each of the contact plugs is arranged at a same height as a part of the cell stacked structure.

18 Claims, 36 Drawing Sheets

(56) References Cited

U.S. PATENT DOCUMENTS

2015/0236038 A1     8/2015    Pachamuthu et al.
2015/0372005 A1*   12/2015    Yon .................. H01L 27/11582
                                                                                  257/5

* cited by examiner

SEMICONDUCTOR DEVICE AND MANUFACTURING METHOD OF THE SAME

CROSS-REFERENCE TO RELATED APPLICATION

The present application is a continuation application of U.S. Ser. No. 15/042,362 and claims priority under 35 U.S.C. § 119(a) to Korean patent application 10-2015-0073035 filed on May 26, 2015 in the Korean Intellectual Property Office and Korean patent application 10-2015-0124390 filed on Sep. 2, 2015 in the Korean Intellectual Property Office, the entire disclosure of which is incorporated by reference herein.

BACKGROUND

1. Technical Field

An aspect of the disclosure relates to a semiconductor device and a manufacturing method of the same, and more particularly, to a semiconductor device including a three-dimensional memory device and a manufacturing method of the same.

2. Related Art

A three-dimensional memory device including memory cells stacked on a substrate has been proposed for the purpose of high integration of a semiconductor device. Various technologies are being developed in order to improve operational reliability of the three-dimensional memory device and reproducibility of a manufacturing process used to produce the device.

DETAILED DESCRIPTION

Figure 1A:
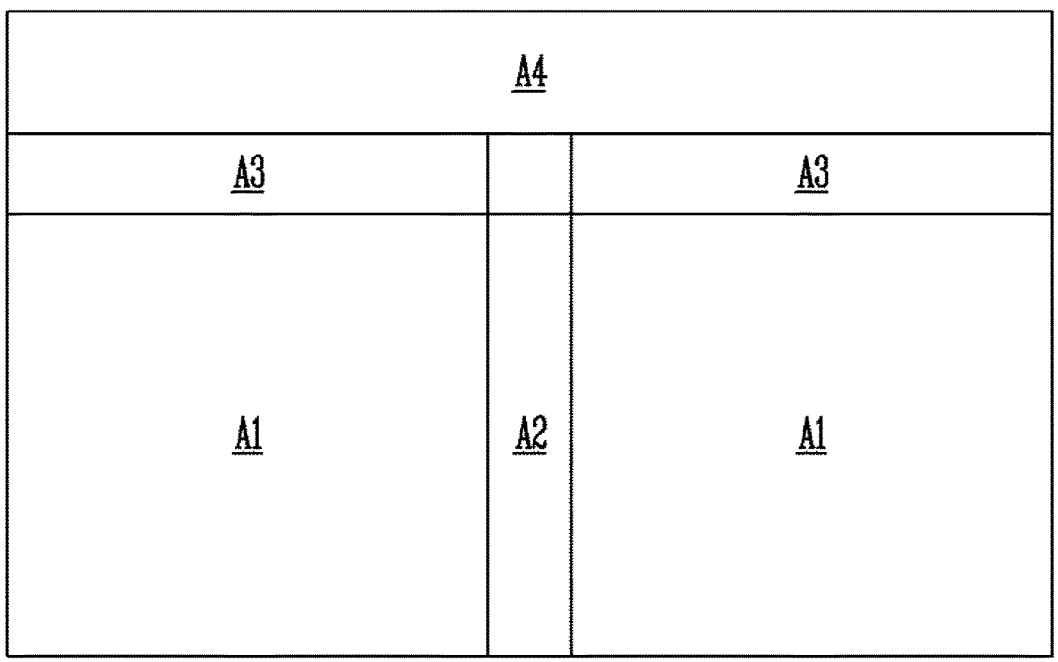
FIGS. 1A to 1D are plane views illustrating an arrangement of a cell region and a peripheral region of a semiconductor device according to embodiments of the disclosure.

Various embodiments relate to a semiconductor device and a manufacturing method of the same which can enhance structural stability of a plug structure coupled to a driving transistor of a three-dimensional memory device.

According to an aspect of the disclosure, there is provided a semiconductor device, comprising: a substrate including a cell region and a peripheral region; a cell stacked structure stacked on the substrate in the cell region; a channel layer in one structure penetrating the cell stacked structure; a driving transistor formed in the peripheral region; and a plug structure coupled to the driving transistor and including a stacking structure of at least two contact plugs shorter than the channel layer, wherein each of the contact plugs is arranged at a same height as a part of the cell stacked structure.

According to an aspect of the disclosure, there is provided a method of manufacturing a semiconductor device, the method comprising alternately stacking first and second material layers on a substrate in which a driving transistor is arranged; forming first and second lower buried layers penetrating the first and second material layers and spaced apart from each other; alternately stacking third and fourth material layers on the first and second material layers penetrated by the first and second lower buried layers; forming a first upper through hole and a second upper through hole penetrating the third and fourth material layers and exposing the first and second lower buried layers, respectively; and forming an upper buried layer in the first upper through hole to expose the second lower buried layer through the second upper through hole.

Hereinafter, embodiments of the disclosure will be described with reference to the accompanying figures in detail. However, the disclosure is not limited to an embodiment disclosed below and may be implemented in various forms and a scope of the disclosure is not limited to the following embodiments. Rather, the embodiments are provided to more sincerely and fully disclose aspects of embodiments and to completely transfer the spirit of the disclosure to those skilled in the art to which the disclosure pertains, and the scope of the disclosure should be understood by the present claims.

FIGS. 1A to 1D are plane views illustrating an arrangement of a cell region and a peripheral region of a semiconductor device according to embodiments of the disclosure.

In FIGS. 1A to 1D, a semiconductor device according an embodiment of the disclosure may include a cell region A1 and peripheral regions A2, A3, and A4.

In the cell region A1, memory cells may be arranged in three-dimensions along first to third directions. Each of the memory cells may store one or more bits. The memory cells may be coupled to a memory string unit through a channel layer CH. The memory cells may be coupled to word lines WL stacked in the cell region A1. The channel layer CH may be coupled to bit lines and a common source line arranged in the cell region A1.

The peripheral region may include a row decoder region A2, a page buffer region A3, and a driving circuit region A4. The row decoder region A2 may include a circuit to access the word lines WL disposed in the cell region A1. The page buffer region A3 may include a circuit to access bit lines BL disposed in the cell region A1. The driving circuit region A4 may include a control circuit to control an operation of the memory cells, and voltage generation circuits to apply operation voltages to the memory cells. Driving transistors may be formed in each of the row decoder region A2, the page buffer region A3 and the driving circuit region A4.

As illustrated in FIG. 1A, the peripheral regions A2, A3 and A4 may be arranged so that the peripheral regions A2, A3 and A4 do not overlap with the cell region A1.

Figure 1B:
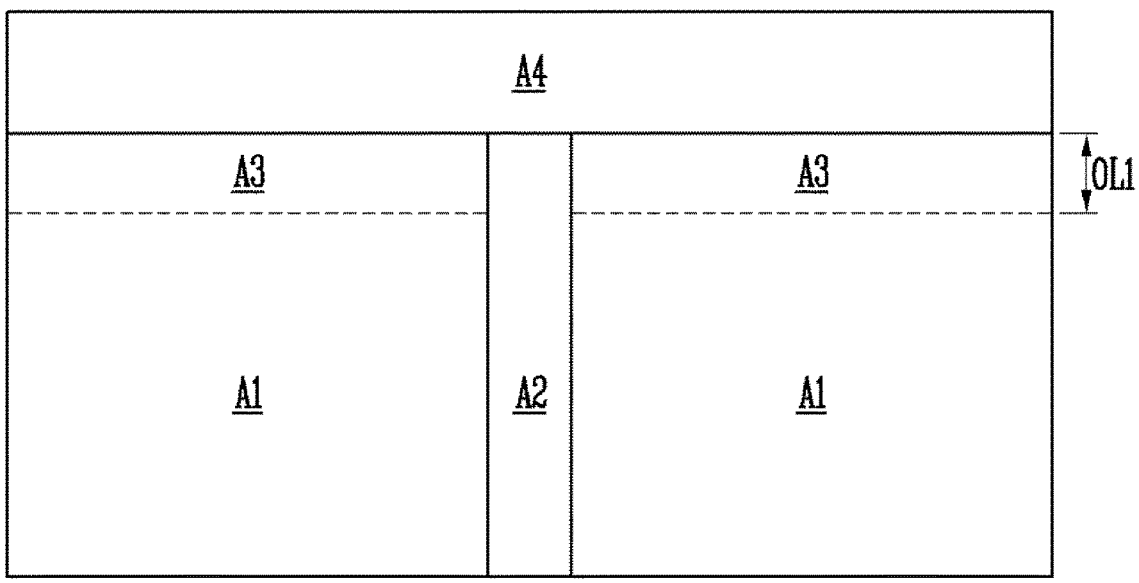
Figure 1C:
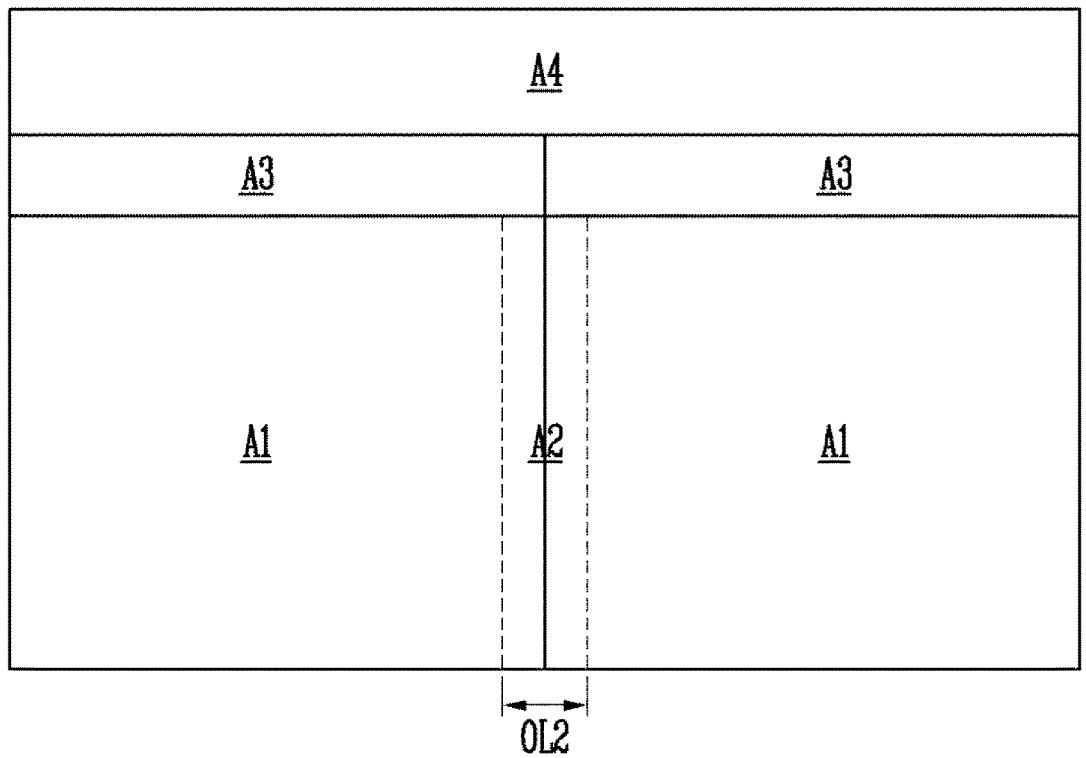
Figure 1D:
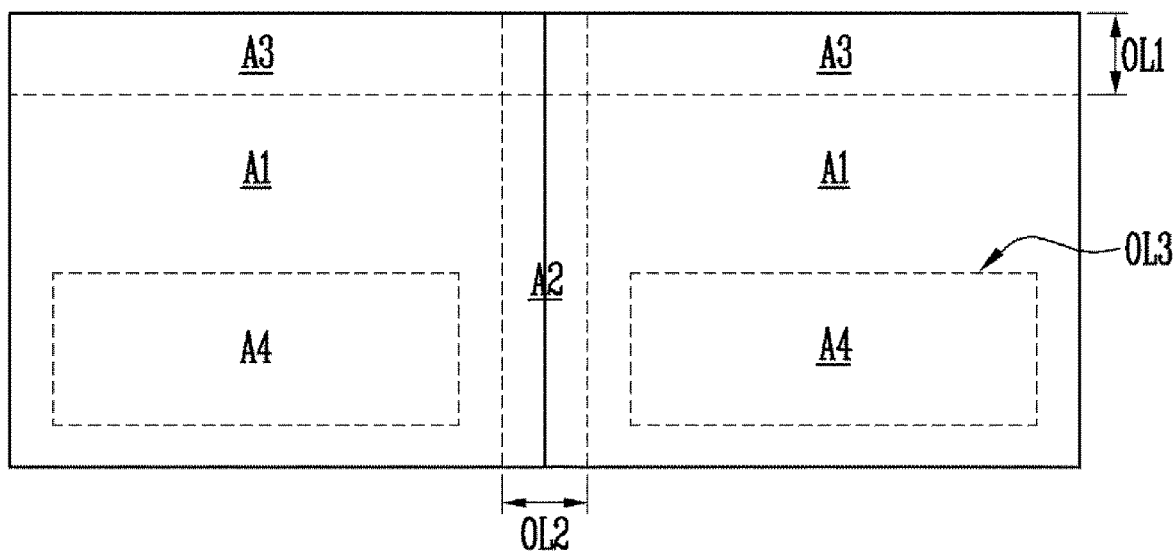

As illustrated in FIGS. 1B to 1D, at least portion of the peripheral regions A2, A3 and A4 may be arranged to overlap with the cell region A1.

For example, as illustrated in FIG. 1B, the page buffer region A3 may be arranged to overlap with a part of the cell region A1. In this instance, an area of a substrate of the semiconductor device may be reduced by a first overlapping region OL1 in which the page buffer region A3 overlaps with the cell region A1.

As illustrated in FIG. 1C, the row decoder region A2 may be arranged to overlap with a part of the cell region A1. In this instance, the area of the substrate of the semiconductor device may be reduced by a second overlapping region OL2 in which the row decoder region A2 overlaps with the cell region A1.

As illustrated in FIG. 1D, the row decoder region A2, the page buffer region A3, and the driving circuit region A4 may be arranged to overlap with part of the cell region A1. In this instance, the first overlap region OL1 in which the page buffer region A3 overlaps with the cell region A1, the second overlap region OL2 in which the row decoder region A2 overlaps with the cell region A1, and a third overlap region OL3 in which the driving circuit region A4 overlaps with the cell region A1 are arranged in the area allocated for the cell region A1.

Figure 2A:
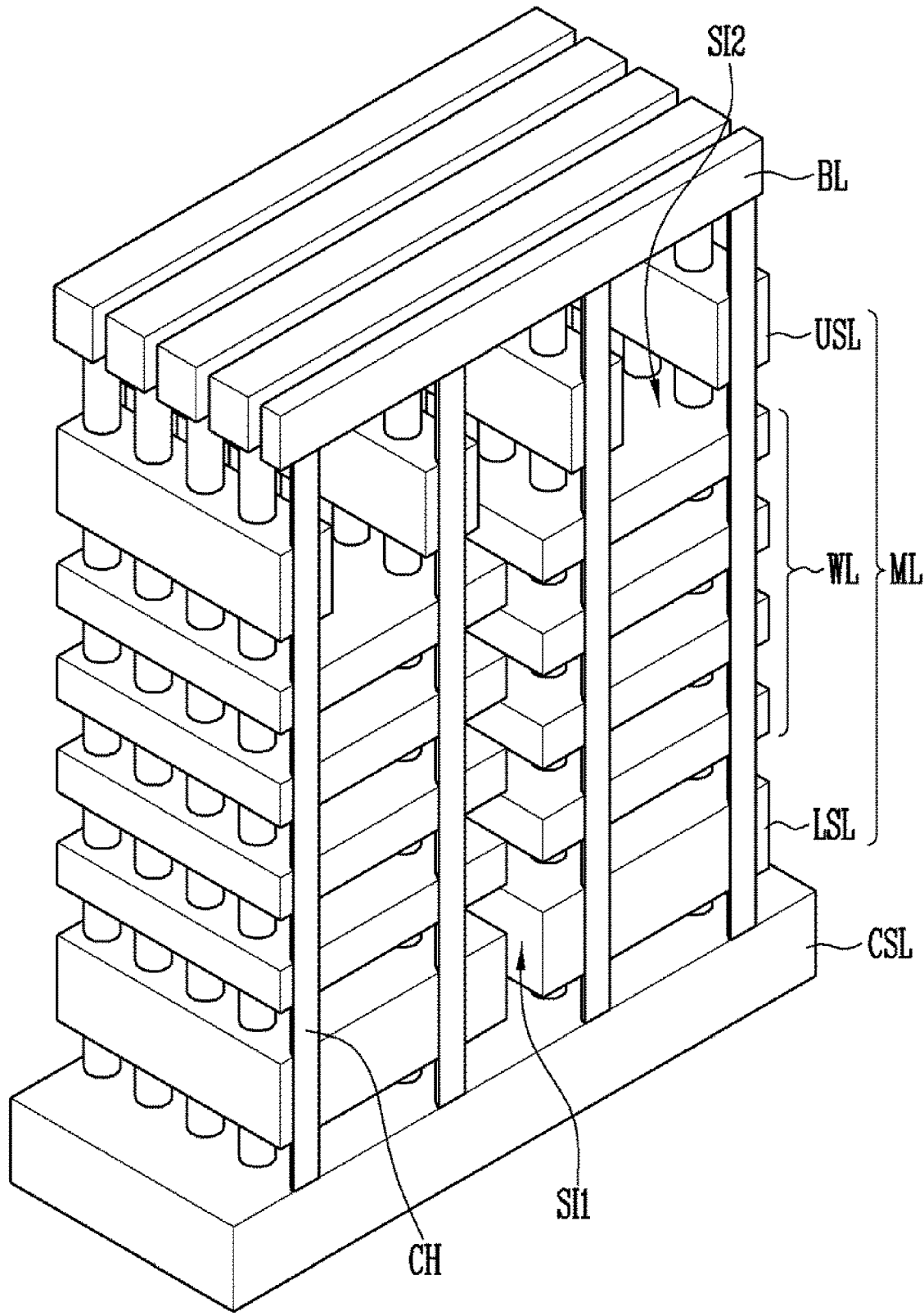
FIGS. 2A and 2B are perspective views illustrating a memory string structure of a semiconductor device according to embodiments of the disclosure.
Figure 2B:
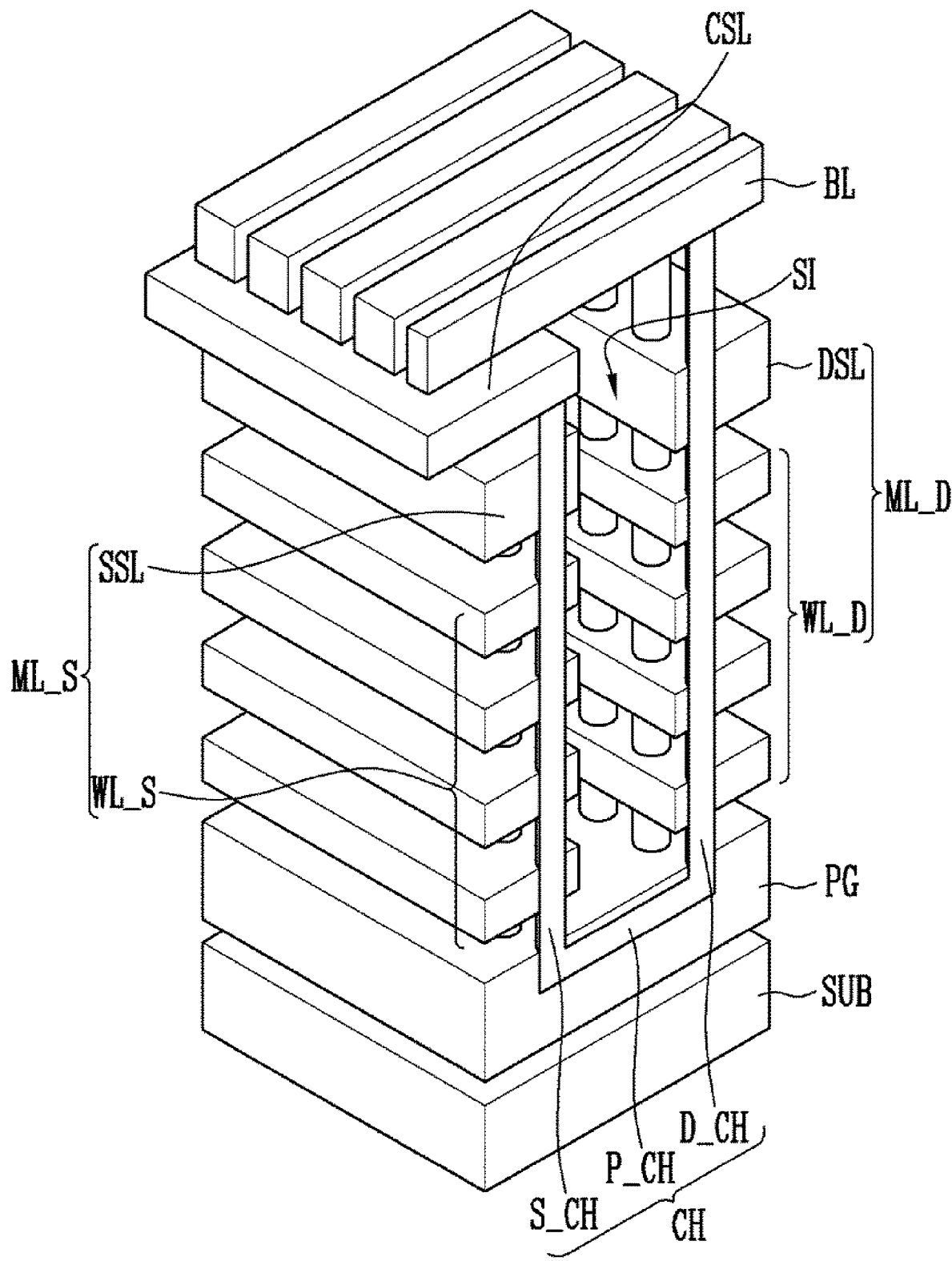

FIGS. 2A and 2B are perspective views illustrating a memory string structure of the semiconductor device according to an embodiment of the disclosure. More specifically, FIG. 2A is a perspective view illustrating the memory string structure in a straight shape, and FIG. 2B is a perspective view illustrating the memory string structure in a U shape. For convenience of illustration, an insulating layer and a memory layer are not illustrated in FIGS. 2A and 2B.

Referring to FIG. 2A, a memory string may be formed along the channel layer CH in the straight shape. The memory string in the straight shape may be electrically coupled between a semiconductor substrate including the common source line CSL and the bit line BL. A cell stacked structure ML including conductive patterns LSL, WL and USL spaced apart from each other and stacked between the common source line CSL and the bit line BL may be arranged. The cell stacked structure ML may be separated by a first slit SI1.

The common source line CSL may be directly coupled to a bottom of the channel layer CH. The common source line CSL may be formed by injecting impurities into the semiconductor substrate, or by depositing a doped silicon layer on the semiconductor substrate.

The conductive patterns LSL, WL and USL may surround the channel layer CH and include a lower select line LSL, the word lines WL and an upper select line USL stacked in sequence. The lower select line LSL may be arranged between the word lines WL and the common source line CSL. The number of a stacked layer of the lower select line LSL stacked between the word lines WL and the common source line CSL may be one, two or more. The upper select line USL may be arranged between the word lines WL and the bit line BL. The number of stacked layers of the lower select line LSL stacked between the word lines WL and the common source line CSL may be one, two or more. One of the lower select line LSL and the upper select line USL may be separated into a unit smaller than the word lines WL. For example, each of the word lines WL may be formed to surround two or more rows of the channel layer CH, and each upper select line USL may be formed to surround one channel layer CH row. In this instance, the upper select line USL may be separated into a smaller unit by a second slit SI2 than separated into by the first slit SI1.

The channel layer CH may penetrate the conductive patterns LSL, WL, and USL. The memory layer may be formed between the channel layer CH and the conductive patterns LSL, WL and USL. An upper part of the channel layer CH may be electrically coupled to the bit line BL.

According to the structure described above, memory cells may be formed at intersections between the channel layer CH and the word lines WL. A lower select transistor may be formed at the intersections between the channel layer CH and the lower select line LSL. Further, an upper select transistor may be formed at intersections between the channel layer CH and the upper select line USL. The lower select transistor, the memory cells, and the upper select transistor may be arranged in a column along the channel layer CH, and may be coupled one another in series through the channel layer CH and constitute the memory string.

Referring to FIG. 2B, the memory string may be arranged along the channel layer CH and the memory string may be coupled between the bit line BL and the common source line CSL. The channel layer CH illustrated in FIG. 2B, is in a U shape. The channel layer CH may be formed in various shapes such as a W shape. The bit line BL and the common source line CSL may be arranged in different layers, and spaced apart from each other. For example, the common source line CSL may be arranged under the bit line BL. The bit line BL and the common source line CSL may be formed of a conductive material.

A pipe gate PG may be arranged under the bit lines BL and the common source line CSL. The pipe gate PG may be formed of conductive material.

A drain-side cell stacked structure ML_D and a source-side cell stacked structure ML_S may be arranged on the pipe gate PG. The drain-side cell stacked structure ML_D and the source-side cell stacked structure ML_S may be arranged under the bit lines BL and the common source line CSL. The drain-side cell stacked structure ML_D and the source-side cell stacked structure ML_S may be electrically separated by the slit SI and opposite to each other across the slit SI.

The drain-side cell stacked structure ML_D may include drain-side conductive patterns WL_D and DSL spaced apart from each other and stacked. The source-side cell stacked structure ML_S may include source-side conductive patterns WL_S and SSL spaced apart from each other and stacked. The drain-side conductive patterns WL_D and DSL may be comprised of a drain-side word line WL_D and a drain select line DSL stacked in sequence. The drain-side word lines WL_D may be arranged between the bit line BL and the pipe gate PG. The drain select line DSL may be arranged between the bit line BL and the drain-side word lines WL_D. The number of stacked structures of the drain select line DSL stacked between the bit line BL and the drain-side word lines WL_D may be one, two or more. The source-side conductive patterns WL_S and SSL may include source-side word lines WL_S stacked in sequence and a source select line SSL. The source-side word lines WL_S may be arranged between the common source line CSL and the pipe gate PG. The source select line SSL may be formed between the common source line CSL and the source-side word lines WL_S. The number of stacked structures of the source select line SSL stacked between the common source line CSL and the source-side word lines WL_S may be one, two or more than two.

The channel layer CH may include a drain-side channel layer D_CH penetrating the drain-side cell stacked structure ML_D, a source-side channel layer S_CH penetrating the source-side cell stacked structure ML_S, and a pipe channel layer P_CH which connects the drain-side channel layer D_CH and the source-side channel layer S_CH penetrating the pipe gate PG. An outer wall of the channel layer CH may be surrounded by the memory layer (not illustrated). An upper part of the drain-side channel layer D_CH may be electrically coupled to the bit line BL. An upper part of the source-side channel layer S_CH may be electrically coupled to the common source line CSL.

According to the described structure, source side memory cells may be formed at intersections between the channel layer CH and the source-side the word lines WL, a source select transistor may be formed at intersections between the channel layer CH and the source select line SSL, drain-side memory cells may be formed at intersections between the channel layer CH and the drain-side word line WL_D, a drain select transistor may be formed at intersections between the channel layer CH and the drain select line DSL, and a pipe transistor may be formed at intersections between the channel layer CH and the pipe gate PG. The source select transistor, the source-side memory cells, the pipe transistor, the drain-side memory cells, and the drain select transistor may be coupled in series through the channel layer, and constitute the memory string.

As described above referring to FIGS. 2A and 2B, the memory string may include the memory cells stacked along the channel layer CH and may be formed as a three-dimensional structure. The number of the memory cells stacked along the channel layer CH may be increased to increase an intensity of the semiconductor device. In this instance, a length of the channel layer CH may be increased. The memory string illustrated in FIGS. 2A and 2B may be arranged in the cell region A1 of the semiconductor device described in FIGS. 1A to 1D.

Figure 3A:
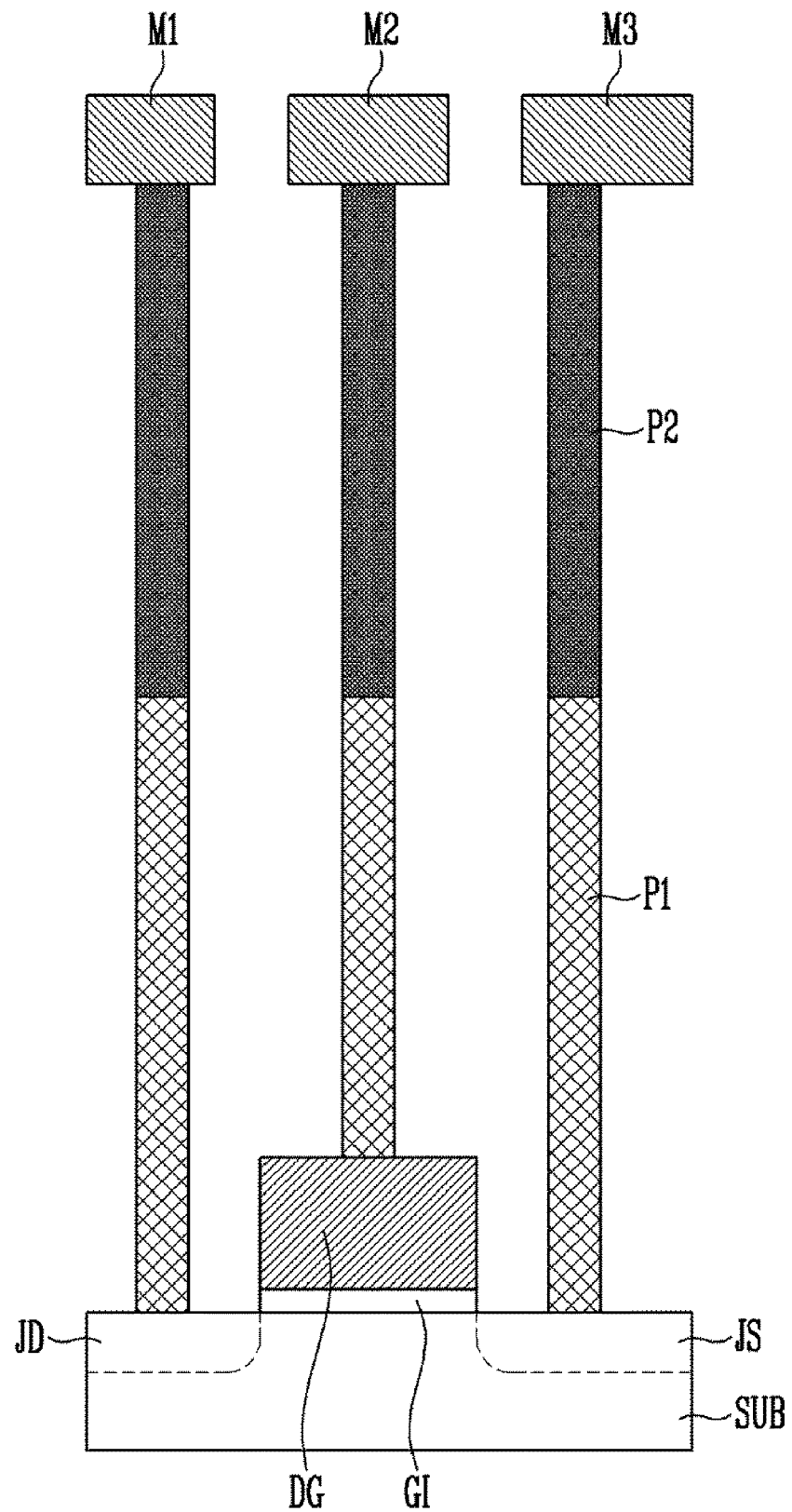
FIGS. 3A to 3C are cross-sectional views illustrating an association between a driving transistor and a plug structure of a semiconductor device according to embodiments of the disclosure.
Figure 3B:
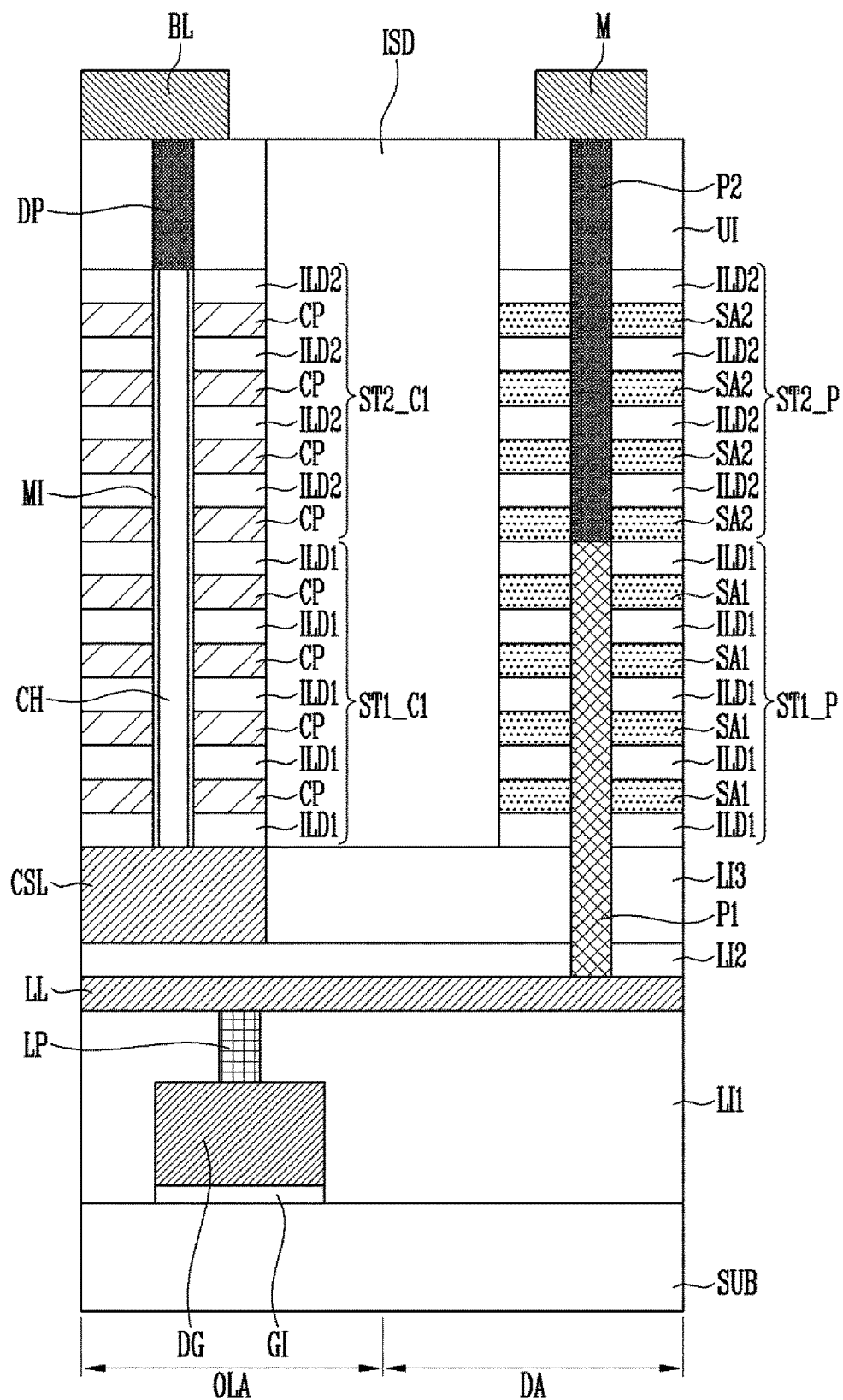
Figure 3C:
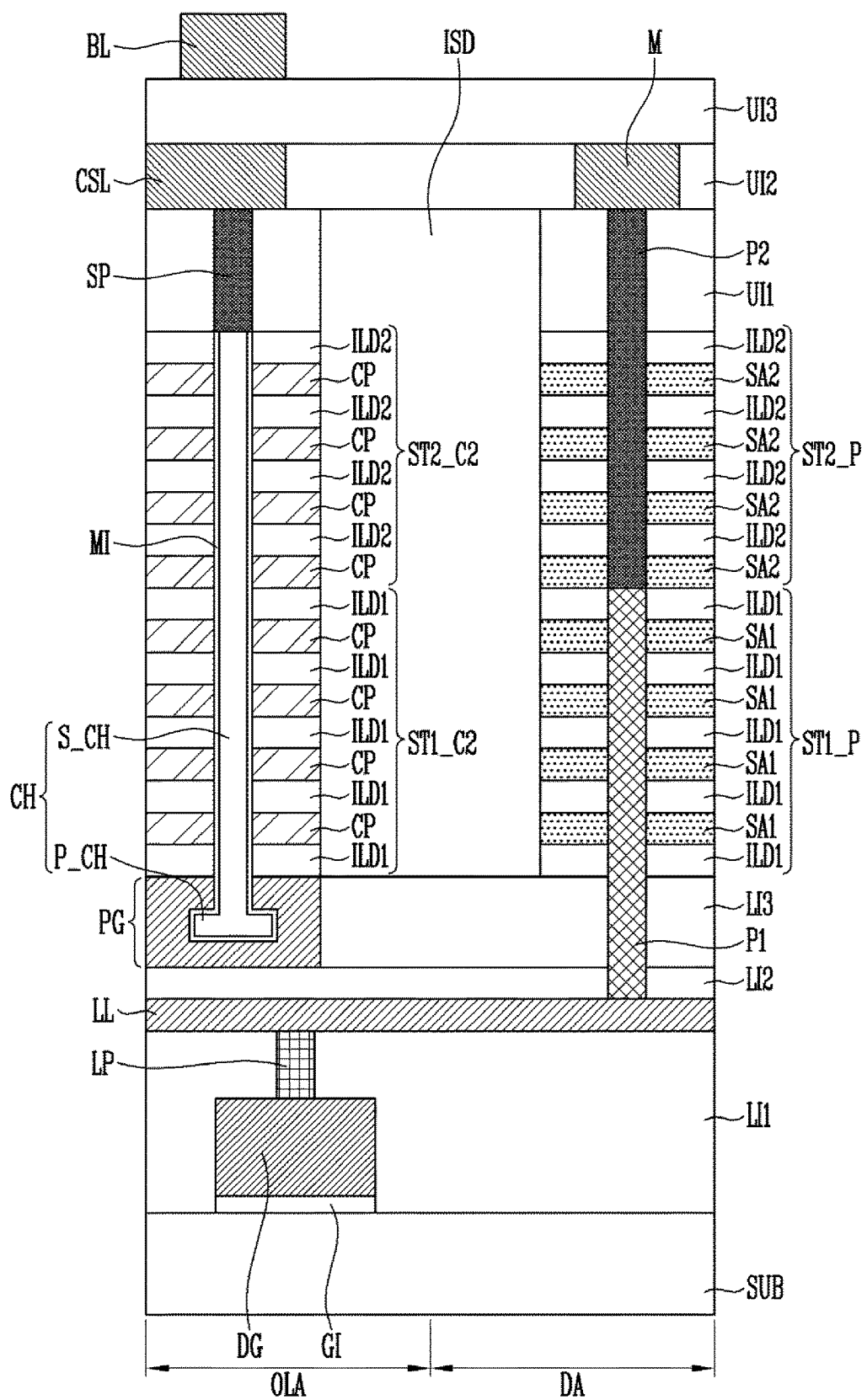

FIGS. 3A to 3C are cross-sectional views illustrating an association between the driving transistor and a plug structure of the semiconductor device according to embodiments of the disclosure. More specifically, FIG. 3A is a cross-sectional view illustrating an association between the driving transistor and the plug structure when the peripheral region and the cell region does not overlap as illustrated in FIG. 1A. FIGS. 3A and 3C are the cross-sectional views illustrating an association between the driving transistor and the plug structure when at least one portion of the peripheral region overlaps with the lower part of the cell region A1 as illustrated in FIGS. 3B and 3C.

Referring to FIG. 3A, the semiconductor substrate SUB may include the cell region and the peripheral region. FIG. 3A illustrates the peripheral region which does not overlap with the cell region. The driving transistor may include a driving gate DG formed on the peripheral region of the semiconductor substrate SUB and junction regions JD and JS formed in the semiconductor substrate SUB of both sides of the driving gate DG. The memory string illustrated in FIG. 2A or FIG. 2B may be formed on the cell region of the semiconductor substrate SUB. A gate insulating layer GI may be formed between the driving gate DG and the semiconductor substrate SUB. Junction regions JD and JS may include a drain junction region JD and a source junction region JS.

The driving transistor described above may be used to operate the memory string illustrated in FIG. 2A or FIG. 2B. The driving gate DG and the junction regions JD and JS of the driving transistor may be respectively coupled to first contact plugs P1. The first contact plugs P1 may be extended along a stacking direction of the memory cells, and may extend to directly contact the driving transistor when the peripheral region does not overlap with the cell region. Second contact plugs P2 may be coupled to upper parts of the first contact plugs P1. The second contact plugs P2 may extend along the stacking direction of the memory cells. An interface height between the first and second contact plugs P1 and P2 may be controlled at the same as a height of an interface height between the stacked structures of the memory string which are separated by a manufacturing process unit. A length of each of the first and second contact plugs P1 and P2 may be shorter than the length of the channel layer illustrated in FIG. 2A, or shorter than the length of the drain-side channel layer D_CH illustrated in FIG. 2B, or shorter than the length of the source-side channel layer S_CH illustrated in FIG. 2B. Each of the first and second contact plugs P1 and P2 may include one portion arranged at a same height as the portion of the cell stacked structure ML illustrated in FIG. 2A. Each of the first and second contact plugs P1 and P2 may include a portion arranged at the same height as the portions of the drain-side cell stacked structure ML_D and the source-side cell stacked structure ML_S illustrated in FIG. 2B.

The plug structure formed as a stacked structure of the first and second contact plugs P1 and P2 may be coupled to one of the metal wires M1 to ME corresponding thereof. For example, the first and second contact plugs P1 and P2 coupled to the drain junction region JD may be coupled to the first metal wire M1. The first and second contact plugs P1 and P2 coupled to the driving gate DG may be coupled to the second metal wire M2. The first and second contact plugs P1 and P2 coupled to the source junction region JS may be coupled to the third metal wire M3.

The peripheral metal wire M1, M2 and M3 may be arranged on the same layer as the bit lines illustrated in FIG. 2A, or on the same layer as the common source line CSL illustrated in FIG. 2B, or on the same layer as the bit lines BL illustrated in FIG. 2B.

Although not shown in FIG. 3A, a one or multi layered insulating layer may be formed between the peripheral metal wire M1, M2 and M3 and the semiconductor substrate SUB. The first and second contact plugs P1 and P2 may penetrate the one or multi layered insulating layer.

Referring to FIGS. 3B and 3C, the semiconductor substrate SUB may include an overlap region OLA in which the cell region overlaps with the peripheral region. The semiconductor substrate may also include a dummy region DA in which peripheral stacked structures ST1_P and ST2_P are arranged. The driving transistor may include the driving gate DG formed in the overlap region OLA of the semiconductor substrate SUB and the junction regions (not illustrated) formed in the semiconductor substrate SUB of both sides of the driving gate DG. The gate insulating layer GI may be formed between the driving gate DG and the semiconductor substrate SUB.

The driving transistor may be covered with a first lower insulating layer L11. The first lower insulating layer L11 may be penetrated by a lower plug structure LP. A connection wire LL may be formed on the lower plug structure LP and the first lower insulating layer LI1. The connection wire LL may extend over the dummy region DA from the overlap region OLA. The connection wire LL may be covered with a second lower insulating layer LI2 formed over the first lower insulating layer LI1.

The cell stacked structures may be formed (ST1_C1 and ST2_C2 of FIG. 3B or ST1_C2 and ST2_C2 of FIG. 3C) to actualize the memory string on the second lower insulating layer LI2.

Referring to FIG. 3B, first and second cell stacked structures ST1_C1 and ST2_C1 may be stacked over the second lower insulating layer LI2. The first cell stacked structure ST1_C1 may include first interlayer insulating layer ILD1 and conductive patterns CP alternately stacked, and the second cell stacked structure ST2_C1 may include second interlayer insulating layers ILD2 and the conductive patterns CP alternately stacked. The conductive patterns CP of the first and second cell stacked structures ST1_C1 and ST2_C1 may be used as the lower select line LSL, the word lines WL and the upper select line USL described in FIG. 2A.

The channel layer CH formed as one structure may penetrate the first and second cell stacked structures ST1_C1 and ST2_C1. The outer wall of the channel layer CH may be surrounded by the memory layer MI. The common source line CSL may be further formed between the channel layer CH and the second lower insulating layer LI2.

The common source line CSL may be coupled to a bottom surface of the channel layer CH. The common source line CSL may be formed in a third lower insulating layer LI3 formed on the second lower insulating layer LI2.

The upper part of the channel layer CH may be coupled to a channel contact plug DP. The channel contact plug DP may be formed penetrating an upper insulating layer UI formed on the second cell stacked structure ST2_C1. The bit line BL may be formed on the upper insulating layer UI and the bit line BL may be coupled to the channel contact plug DP.

The memory string in a straight shape described in FIG. 2A may be actualized by the first and second stacked structures ST1_C1 and ST2_C1 and the channel layer CH penetrating the first and second stacked structures ST1_C1 and ST2_C1. The first and second stacked structures ST1_C1 and ST2_C1 may be stacked between the common source line CSL and the bit line BL described FIG. 3B.

Referring to FIG. 3C, the first and second stacked structures ST1_C2 and ST2_C2 may be stacked over the second lower insulating layer LI2. The first cell stacked structure ST1_C2 may include the first interlayer insulating layer ILD1 and the conductive patterns CP alternately stacked. The second stacked structures ST2_C2 may include the second interlayer insulating layers ILD2 and the conductive patterns CP alternately stacked. The first and second cell stacked structures ST1_C2 and ST2_C2 may be used as the drain-side cell stacked structure ML_D and the source-side cell stacked structure ML_S described in FIG. 2B. For convenience of illustration, FIG. 3C illustrates an example in which the first and second stacked structures ST1_C2 and ST2_C2 are used as the source-side cell stacked structure ML_S.

The first and second stacked structures ST1_C2 and ST2_C2 may be penetrated by the channel layer CH in one structure. The outer wall of the channel layer CH may be surrounded by the memory layer MI. The channel layer CH and the memory layer MI may protrude toward the second lower insulating layer LI2 rather than the first cell stacked structure ST1_C2. The portion of the channel layer CH protruding toward the second lower insulating layer LI2 rather than the first cell stacked structure ST1_C2 may be defined as a pipe channel layer P_CH. The pipe channel layer P_CH may be surrounded by the pipe gate PG. The portion of the channel layer CH penetrating the first and second cell stacked structures ST1_C2 and ST2_C2 on the upper part of the pipe channel layer P_CH may be used as the drain-side channel layer D_CH and the source-side channel layer S_CH. For example, when the first and second stacked structures ST1_C2 and ST2_C2 illustrated in FIG. 3C are used as the drain-side cell stacked structure ML_D, the portion of the channel layer CH penetrating the first and second stacked structures ST1_C2 and ST2_C2 may be used as the drain-side channel layer D_CH. When the first and second stacked structures ST1_C2 and ST2_C2 illustrated in FIG. 3C are used as the source-side cell stacked structure ML_S, the portion of the channel layer CH penetrating the first and second stacked structures ST1_C2 and ST2_C2 may be used the source-side channel layer S_CH.

The pipe gate PG may be formed in a third lower insulating layer LI3 arranged between the first cell stacked structure ST1_C2 and the second lower insulating layer LI2.

The upper surface of the source-side channel layer S_CH may be coupled to a channel contact plug SP. The channel contact plug SP may be formed by penetrating a first upper insulating layer UI1 formed on the second cell stacked structure ST2_C2. The common source line CSL may be formed such that the common source line CSL is coupled to the channel contact plug SP on the first upper insulating layer UI1. The common source line CSL may be formed by penetrating a second upper insulating layer UI2 formed on the first upper insulating layer UI1. A third upper insulating layer UI3 may be formed on the second upper insulting layer UI2. The bit line BL may be arranged on the third upper insulating layer UI3. Although not shown in the figure, the bit line BL may be coupled to the upper surface of the drain-side channel layer (D_CH illustrated of FIG. 2B) through a channel plug penetrating the first to third upper insulating layers (UI1 to UI3).

As described in FIGS. 3B and 3C, the memory strings in various structures (for example, the memory string illustrated in FIG. 2A or 2B) are arranged on the upper part of the overlap region OLA.

Referring to FIGS. 3B and 3C, the peripheral stacked structures ST1_P and ST2_P may be formed at the same height as the cell stacked structures (ST1_C1 and ST2_C1 of FIG. 3B or ST1_C2 and ST2_C2 of FIG. 3C) in the dummy region DA. The peripheral stacked structures ST1_P and ST2_P may include first and second peripheral stacked structures ST1_P and ST2_P stacked on the third lower insulating layer LI3. The first peripheral stacked structure ST1_P may be formed at the same height as the first cell stacked structure ST1_C1 or ST1_C2, and the first peripheral stacked structure ST1_P may include the alternately stacked first interlayer insulating layer ILD1 and first sacrificial patterns SA1. The second peripheral stacked structure ST2_P may be formed at the same height as the second cell stacked structure ST2_C1 or ST2_C2, and second peripheral stacked structure ST2_P may include the alternately stacked second interlayer insulating layer ILD2 and second sacrificial patterns SA2. The first and second interlayer insulating layers ILD1 and ILD2 may be an oxide layer, and the first and second sacrificial patterns SA1 and SA2 may be a nitride layer.

The first peripheral stacked structure ST1_P may be penetrated by the first contact plug P1. The second peripheral stacked structure ST2_P may be penetrated by the second contact plug P2. The second contact plug P2 may be arranged on the first contact plug P1 and directly coupled to the first contact plug P1. The first contact plug P1 may extend further penetrate the second and third insulating layers LI2 and LI3. The second contact plug P2 may extend to a same height as the upper part of the channel plug DP or SP by penetrating further into the upper insulating layer UI or UI1.

The length of each of the first and second contact plugs P1 and P2 may be shorter than the length of the channel layer CH. Each of the first and second contact plugs P1 and P2 may include the portion arranged at the same height as at least one portion of the cell stacked structures (ST1_C1 and ST2_C1 of FIG. 3B or ST1_C2 and ST2_C2 of FIG. 3C).

The plug structure including the first and second contact plugs P1 and P2 may electrically connect the peripheral metal wire M with the driving transistor. Since the driving transistor illustrated in FIGS. 3B and 3C may be arranged under the cell stacked structures (ST1_C1 and ST2_C1 of FIG. 3B or ST1_C2 and ST2_C2 of FIG. 3C) when the peripheral region overlaps with the cell region [claim 14], the first contact plug P1 in the lowermost plug structure may not be directly coupled to the driving transistor, but coupled to the driving transistor via the connection wire LL and the lower plug structure LP arranged between the plug structure and the driving transistor. The connection wire LL may extend towards the driving transistor to overlap with the cell stacked structures (ST1_C1 and ST2_C1 of FIG. 3B or ST1_C2 and ST2_C2 of FIG. 3C) from one side coupled to the first contact plug P1. The lower plug structure LP may be coupled between the connection wire LL and the driving transistor.

An inter-stacked structure insulating layer ISD may be arranged between the cell stacked structures (ST1_C1 and ST2_C1 of FIG. 3B or ST1_C2 and ST2_C2 of FIG. 3C) and the peripheral stacked structures ST1_P and ST2_P.

The peripheral metal wire M may be arranged on the same layer as the bit line BL illustrated in FIG. 3B, or on the same layer as the common source line CSL illustrated in FIG. 3C.

FIGS. 3A to 3C discloses an example in which the plug structure coupled between the peripheral wires M1, M2, M3 and M and the driving transistor is formed as the stacked structure of the first and second contact plugs P1 and P2. The plug structure according to the embodiment of the present disclosure is not limited to the structure in which two contact plugs are stacked, but may also be formed as the structure in which at least two contact plugs are stacked.

A distance between the peripheral metal wires M1, M2, M3 and M and the driving transistor may be increased as the number of stacked structures comprising the memory cells included in the memory string increases. The embodiments of the present disclosure may possibly not form a single contact plug for the plug structure which connects the peripheral metal wires M1, M2, M3 and M with the driving transistor, but may form the stacked structure (for example, the first and second contact plugs P1 and P2) of at least two contact plugs shorter than the channel layer (CH of FIG. 2A, S_CH or D_CH of FIG. 2B). Accordingly, embodiments of the present disclosure prevent a length of each contact plug from being exceedingly increased even though the distance between the peripheral metal wires M1, M2, M3 and M and the driving transistor increases. Hereby, the present disclosure may increase the structural stability of the plug structure. It becomes easier to secure alignment margin and size of each contact plug when the length of each contact plug is reduced.

The uppermost part of each contact plug may be formed wide as the length of each contact plug increases to secure the margin. Since the length of each contact plug is formed to be short in the present disclosure, the width of the uppermost part of each contact plug may be formed narrowly. As a result, the present disclosure may reduce the areas in which each contact plug has a size of a chip and a size of the semiconductor device.

FIGS. 4A to 4E are cross-sectional views illustrating a manufacturing method between the driving transistor of the semiconductor device and the plug structure according to an embodiment of the disclosure. For convenience of illustration, hereinafter, an example is described in which the plug structure, which connects one of the peripheral metal wires and the driving transistor, is formed from the stacked structure including at least two of the contact plugs. However, the present invention is not limited thereto. FIGS. 4A to 4E illustrate the instance in which the cell region and the peripheral region do not overlap.

Figure 4A:
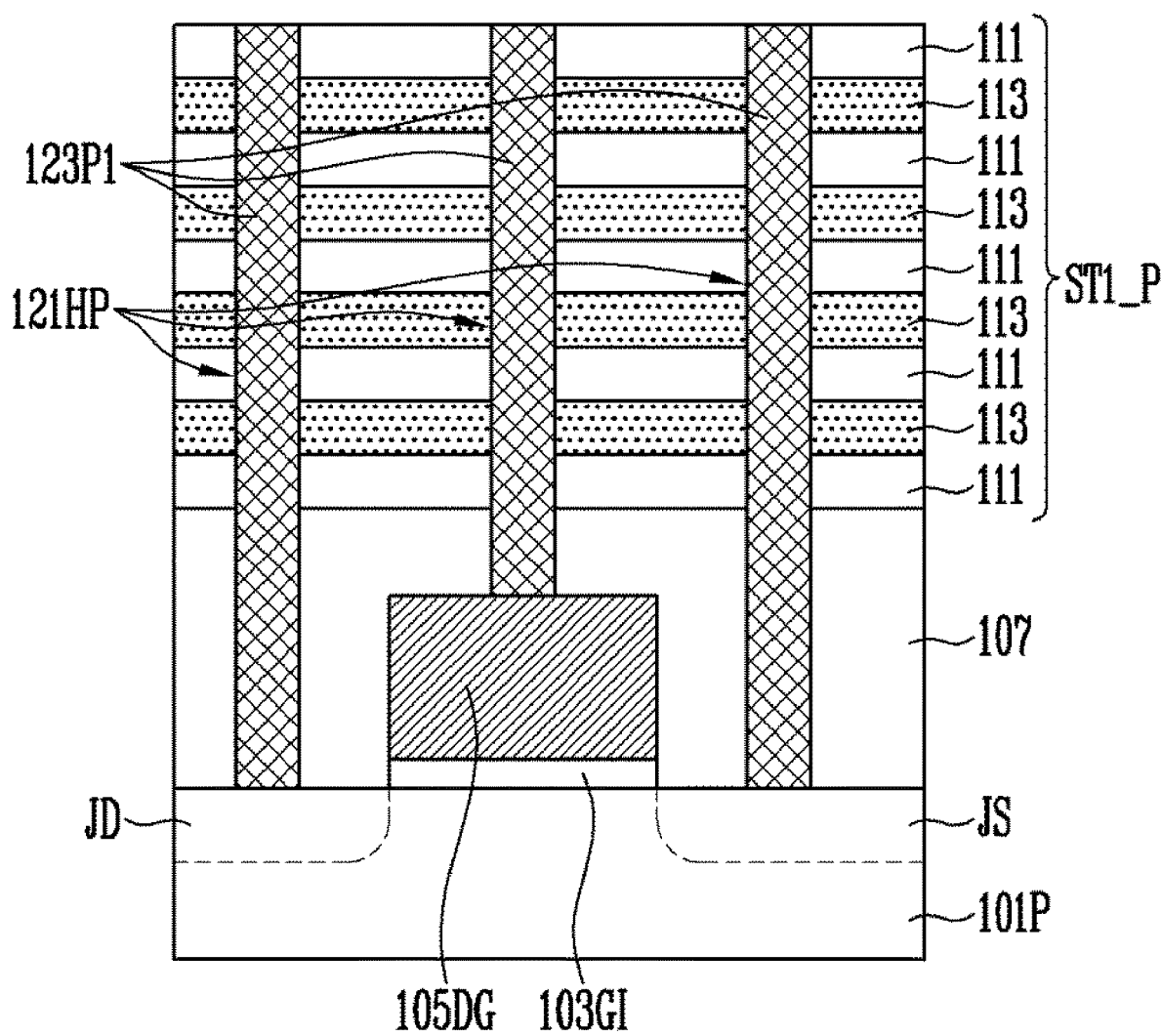
FIGS. 4A to 4E are cross-sectional views illustrating a manufacturing method of the driving transistor and the plug structure of a semiconductor device according to an embodiment of the disclosure.

Referring to FIG. 4A, the substrate including the cell region and the peripheral regions may be provided. The cell region and the peripheral regions may not overlap with each other. Subsequently, a driving transistor including the driving gate 105DG, the source junction region JS, and the drain junction region JD may be formed in the peripheral region 101P of the substrate. The driving transistor may form a circuit to drive a memory string to be formed in the cell region. An example of a process for forming a driving transistor will be described in detail as follows.

First, the insulating layer and at least one of a gate conductive layer may be stacked on the substrate including the cell region and the peripheral region 101P. Hereinafter, the driving gate 105DG may be formed by patterning the gate conductive layer. While the driving gate 105DG is patterned, the insulating layer may be patterned, and a gate insulating layer 103G1 having a same pattern as the driving gate 105DG may be formed under the driving gate 105DG. Subsequently, the source junction region JS and the drain junction region JD may be formed by injecting impurities into the peripheral region 101P at both sides of substrate of the driving gate 105DG. While the driving gate 105DG is formed, the pipe gate PG may be formed on the cell region of the substrate. A specific example will be described referring to FIG. 6A. Before forming the driving transistor, the common source line CSL may be formed by injecting impurities into the cell region of the substrate. A doped polysilicon layer which is to be used as the common source line CSL may be formed on the cell region of the substrate.

After forming the driving transistor, a planarization insulating layer 107 covering the driving transistor may be formed. Subsequently, first material layers 111 and second material layers 113 may be alternately stacked on the planarization insulating layer 107 and the first peripheral stacked structure ST1_P may be formed.

The first material layers 111 and the second material layers 113 may be formed from different materials. More specifically, the first material layers 111 and the second material layers 113 may be formed from different insulating materials which have an etch selectivity against each other. For example, the first material layers 111 may be formed of an oxide layer, and the second material layers 113 may be formed of a nitride layer.

Subsequently, a first lower buried layer 123P1 may be formed wherein the first lower buried layer 123P1 may be coupled to the driving transistor penetrating the first peripheral stacked structure ST1_P. The first lower buried layer 123P1 may be used as the first contact plug P1 which is the portion of the contact plug structure coupled to the driving transistor. A specific description for the process of forming the lower buried layer 123P1 is as follows.

First, a first lower through hole 121HP is formed, where the first lower through hole 121HP penetrates the first peripheral stacked structure ST1_P and exposes at least one of the driving gate 105DG, the source junction region JS and the drain junction region JD of the driving transistor. The first lower through hole 121HP may further penetrate the planarization insulating layer 107. Subsequently, after forming the conductive material to fill the first lower through hole 121HP, the conductive material is planarized to expose an upper surface of the first peripheral stacked structure ST1_P. Hereby, the lower buried layer 123P1 is formed from the conductive material. The conductive material to form the lower buried layer 123P1 may be formed from a material that is difficult to etch in a subsequent etching process. The subsequent etching process may form a first upper through hole 135HP to reduce damage of the lower buried layer 123P1. The conductive material to form the lower buried layer 123P1 may be formed of a material easy to fill the first lower through hole 121HP. Since the conductive material to form the first the lower buried layer 123P1 may be arranged in the cell region and used as a sacrificial material, the conductive material may be formed of a material that is removed easily. For example, the lower buried layer 123P1 may be formed of a material which has the etch selectivity against the first and second material layers 111 and 113 and the third and fourth material layers to be formed in a subsequent process. More specifically, the lower buried layer 123P1 may be formed of a conductive material which includes at least one of Silicon Germanium (SiGe) and Carbon (C).

Figure 4B:
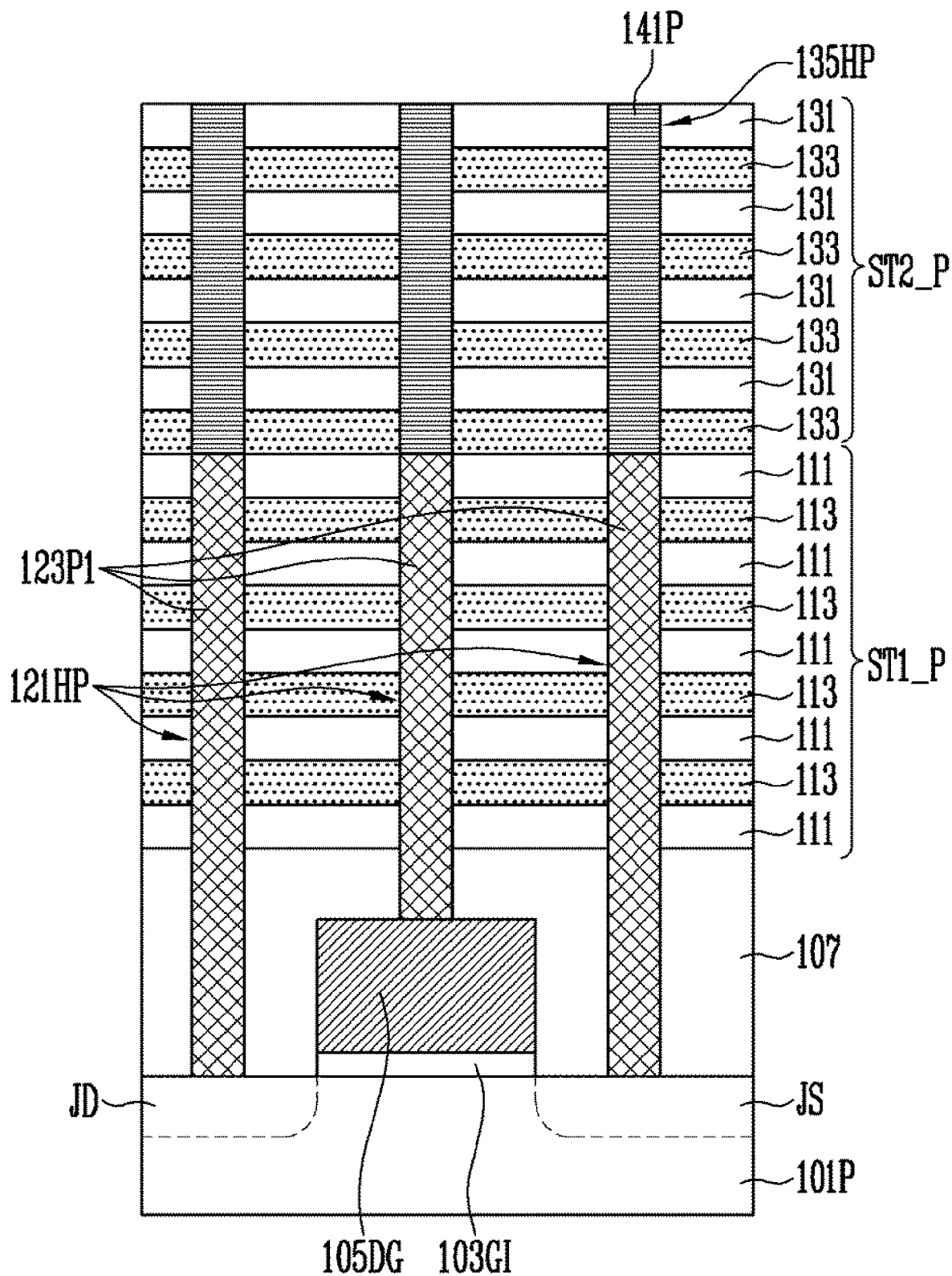

Referring to FIG. 4B, the second peripheral stacked structure ST2_P may be formed by alternately stacking the third material layers 131 and the fourth material layers 133 on the first peripheral stacked structure ST1_P including the lower buried layer 123P1. The third material layers 131 may be formed of the same insulating material as the first material layers 111, and the fourth material layers 133 may be formed of the same material as the second material layers 113.

The third material layers 131 and the fourth material layers 133 may be formed of a material that is different from each other. More specifically, the third material layers 131 and the fourth material layers 133 may be formed of different insulating materials which have an etch selectivity against each other. The third material layers 131 may be formed of the oxide layer, and the fourth material layers 133 may be formed of the nitride layer.

Subsequently, the first upper through hole 135HP may be formed. The first upper through hole 135HP may penetrate the second peripheral layer ST2_P and expose the lower buried layer 123P1. The first upper through hole 135HP may be arranged to overlap with the first lower through hole 121HP. Subsequently, an upper buried layer 141P which fills the first upper through hole 135HP may be formed. The upper buried layer 141P may not be formed on the cell region of the substrate, but only in the peripheral region 101P. The upper buried layer 141P may formed from a material layer which has an etch selectivity against the first to fourth material layers 111, 113, 131 and 133 and the first lower buried layer 123P1.

Figure 4C:
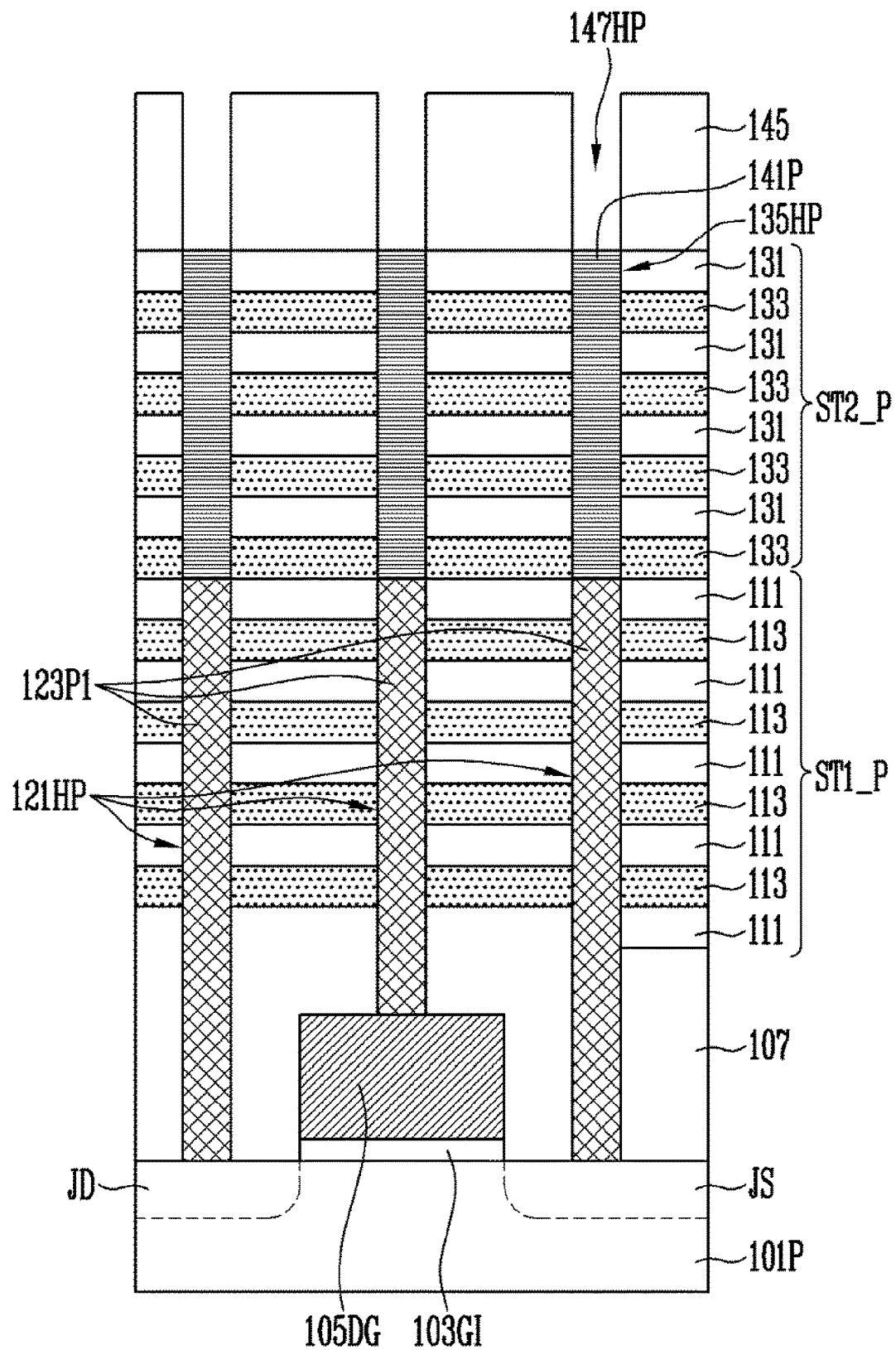

Referring to FIG. 4C, after forming the structure for forming the memory string on the cell region of the substrate, a first upper insulating layer 145 may be formed on the substrate including the cell region and the peripheral region 101P. Subsequently, a first contact hole 147HP may be formed where the first contact hole 147HP penetrates the first upper insulating layer 145 and exposes the upper buried layer 141P.

Figure 4D:
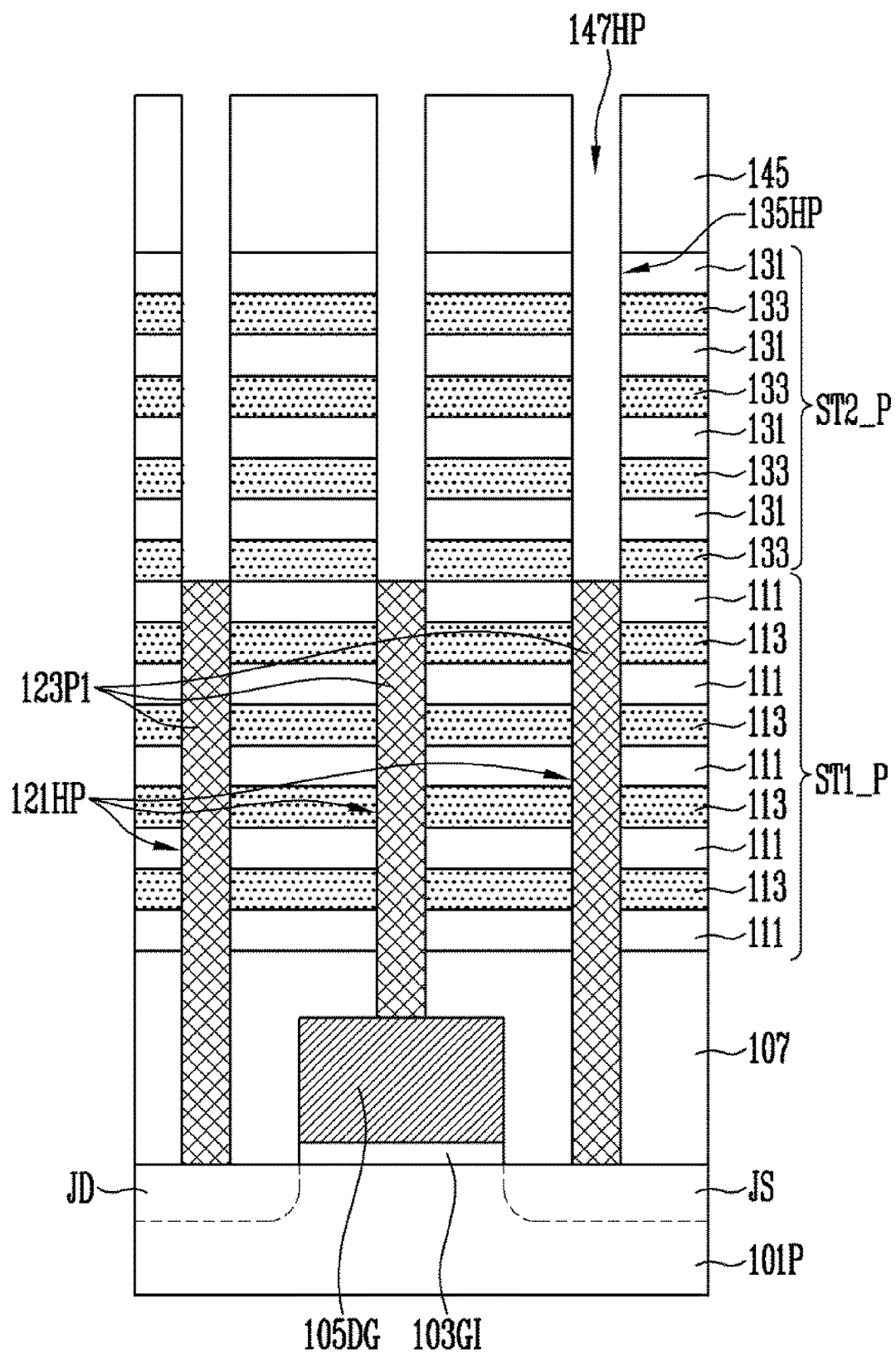

Referring to FIG. 4D, the first upper through hole 135HP may be opened by removing the upper buried layer (141P of FIG. 4C) through the first contact hole 147HP by an etching process. The lower buried layer 123P1 may be exposed.

Figure 4E:
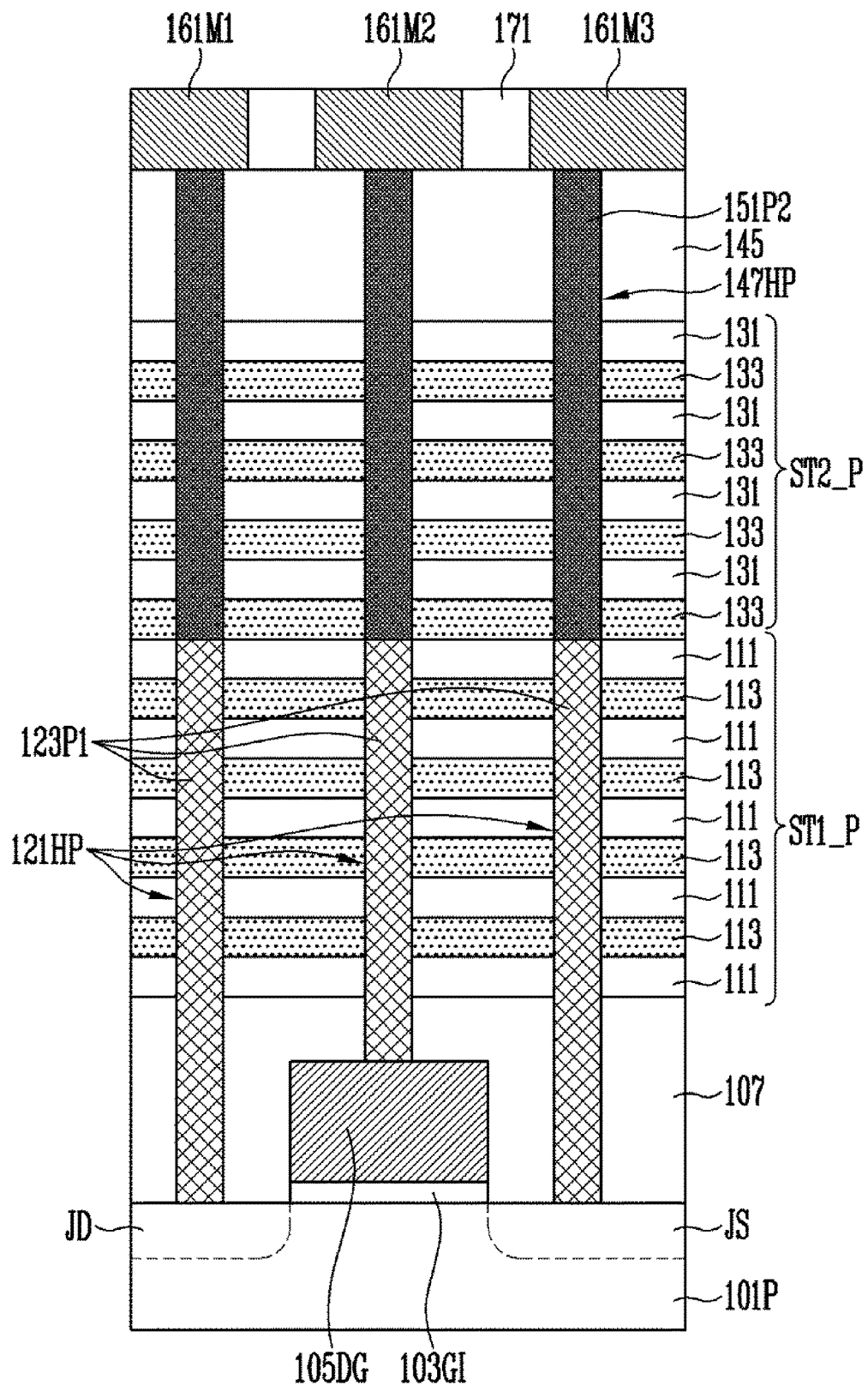

Referring to FIG. 4E, after filling the first upper through hole 135HP and the first contact hole 147HP with the conductive material, a surface of the conductive material may be planarized to expose the upper surface of the first upper insulating layer 145. Hereby, a second contact plug 151P2 may be formed, where the second contact plug 151P2 may be coupled to the first lower buried layer 123P1 and fills the first upper through hole 135HP and the first contact hole 147HP. The second contact plug 151P2 may be formed of a different conductive material from the first lower buried layer 123P1 used as the first contact plug 123P1.

Subsequently, peripheral metal wires 161M1, 161M2, and 161M3 may be formed on the first upper insulating layer 145 including the second contact plug 151P2. Although not shown in the figure, the peripheral metal wires 161M1, 161M2, and 161M3 may be extended in a direction of other driving transistors which constitute a peripheral circuit, or extended in a direction of the word line WL or the select line SL of the cell region. Each of the peripheral metal wires 161M1, 161M2, and 161M3 may be electrically coupled to the corresponding second contact plug 151P2. Referring below, an example of a forming process of the peripheral metal wires 161M1, 161M2, and 161M3 is described in detail.

First, a second upper insulating layer 171 may be formed on the first upper insulating layer 145. Hereafter, trenches penetrating the second upper insulating layer 171 may be formed, and the conductive material may be filled in the trenches. Hereby, the peripheral metal wires 161M1, 161M2 and 161M3 penetrating the second upper insulating layer 171 may be formed.

According to the process described above, the first peripheral stacked structure ST1_P and the second peripheral stacked structure ST2_P in which the oxide layers and the nitride layers are alternately stacked on the peripheral region 101P of the substrate may be formed. The number of the stacked structure of the peripheral stacked structures may not be limited to the embodiment described above, and may be two or more.

A vertical plug structure to electrically connect at least one of the peripheral metal wires 161M1, 161M2 and 161M3 with the driving transistor may include the contact plugs stacked on one another's layers. The example disclosed that the contact plugs constituting the plug structure include the first lower buried layer 123P1 and second contact plug 151P2. However, the plug structure may be formed from the stacked structure of at least two of the contact plugs. The plug structure may be formed by penetrating the peripheral stacked structures. The uppermost contact plug (for example, the second contact plug 151P2), among the contact plugs constituting the plug structure, may be extended to be higher than the upper peripheral stacked structure, among the peripheral stacked structures towards one of the peripheral metal wires 161M1, 161M2 and 161M3. Further, the lower contact plugs arranged under the uppermost contact plug (for example, the first lower buried layer 123P1) may be formed of different conductive material from the uppermost contact plug. Further, the lower contact plugs (for example, the first lower buried layer 123P1) arranged under the uppermost contact plug may be formed from the conductive material which has an etch selectivity against the oxide layers and the nitride layers constituting the peripheral stacked structures. More specifically, the lower contact plugs (for example, the first lower buried layer 123P1) may be formed of at least one of Silicon Germanium (SiGe) and Carbon (C).

FIGS. 5A to 5F are cross-sectional views illustrating a manufacturing method of the memory string structure of the semiconductor device according to an embodiment of the disclosure. The structure formed in the cell region may be formed using the process described in FIGS. 4A to 4E. FIGS. 5A to 5F may illustrate an example in which the memory string structure in a straight shape described in FIG. 2A may be formed in the cell region.

Figure 5A:
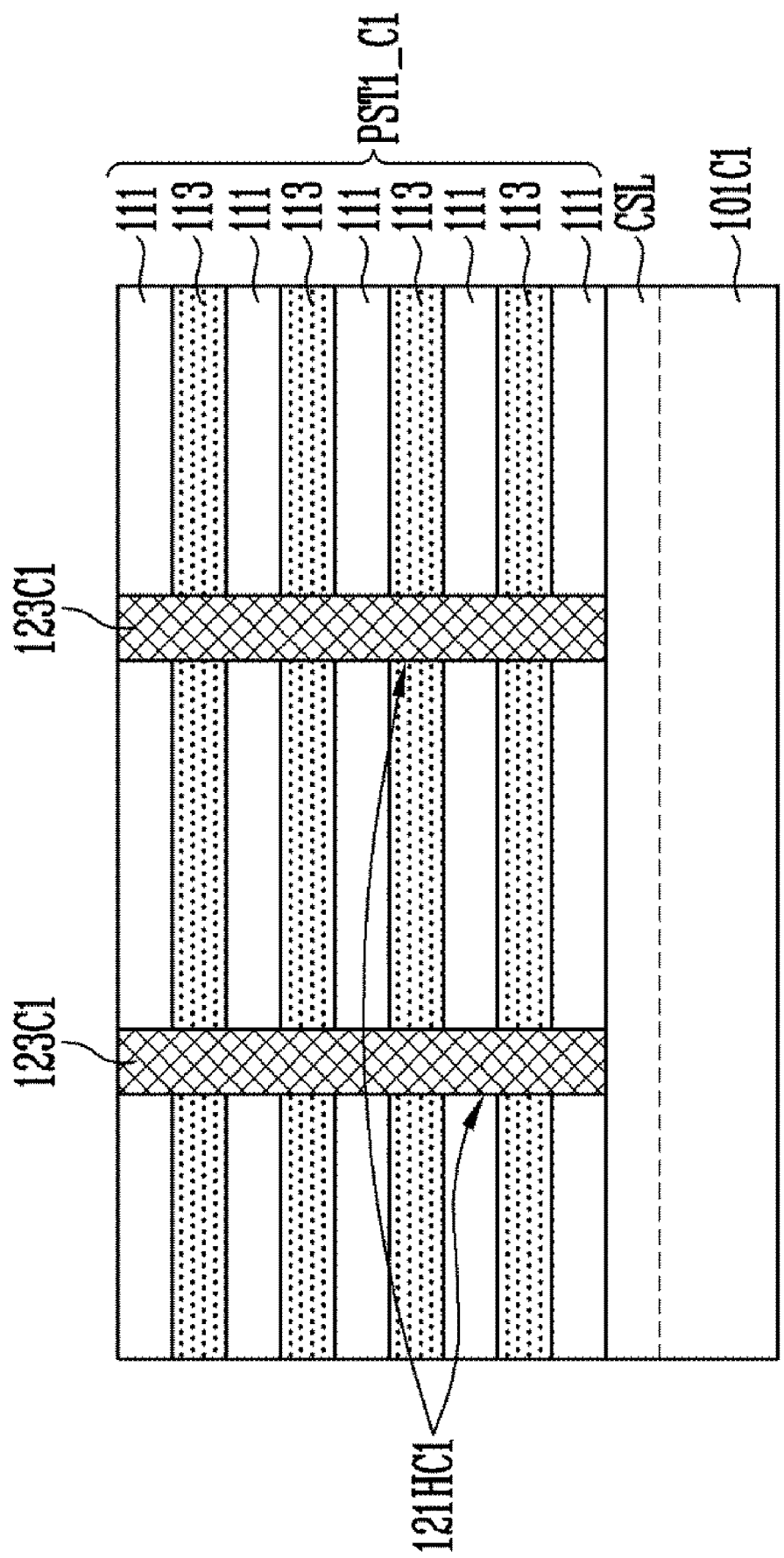
FIGS. 5A to 5F are cross-sectional views illustrating a manufacturing method of the memory string structure of a semiconductor device according to an embodiment of the disclosure.

Referring to FIG. 5A, before forming the driving transistor described in FIG. 4A, the common source line CSL may be formed in the cell region 101C1 of the substrate. The cell region 101C1 of the substrate may extend from the peripheral region 101P of the substrate illustrated in FIG. 4A. The common source line CSL may be formed by injecting impurities in the cell region 101C1 of the substrate, or by depositing a doped polysilicon layer on the cell region 101C1 of the substrate.

Subsequently, the first material layers 111 and the second material layers 113 described in FIG. 4A may be formed in the cell region 101C1 of the substrate including the common source line CSL. Hereinafter, the first material layers 111 and the second material layers 113 alternately stacked on the cell region 101C1 of the substrate may be defined as a first pre-cell stacked structure PST1_C1. The first pre-cell stacked structure PST1_C1 may be extended from the first peripheral stacked structure ST1_P described in FIG. 4A. The first material layers 111 of the pre-cell stacked structure PST1_C1 may be used as the interlayer insulating layer, the second material layers 113 of the pre-cell stacked structure PST1_C1 may be used as a sacrificial layer. The pre-cell stacked structure PST1_C1 and the first peripheral stacked structure ST1_P described in FIG. 4A may be formed at the same time.

Subsequently, a second lower penetrating hole 121HC1 penetrating the first pre-cell stacked structure PST1_C1 may be formed. The second lower through hole 121HC1 and the first lower through hole 121HP described in FIG. 4A may be formed at the same time. In other words, the first lower through hole 121HP and the second lower through hole 121HC1 may be formed using one mask process.

Hereafter, after forming the conductive material to fill the second lower through hole 121HC1, the conductive material may be planarized to expose the upper surface of the first pre-cell stacked structure PST1_CI. Hereby, the second lower buried layer 123C1 may be formed, where the second lower buried layer 123C1 may fill the second lower through hole 121HC1 and may be formed of the conductive material. The second lower buried layer 123C1 and the first lower buried layer 123P1 described in FIG. 4A may be formed at the same time. The second lower buried layer 123C1 may be removed in a subsequent process, and formed of the same material as the first lower buried layer 123P1 at the same time. For example, the second lower buried layer 123C1 may be formed of the conductive material including at least one of Silicon Germanium (SiGe) and Carbon (C). The second lower buried layer 123C1 may be spaced apart from the first lower buried layer 123P1.

Figure 5B:
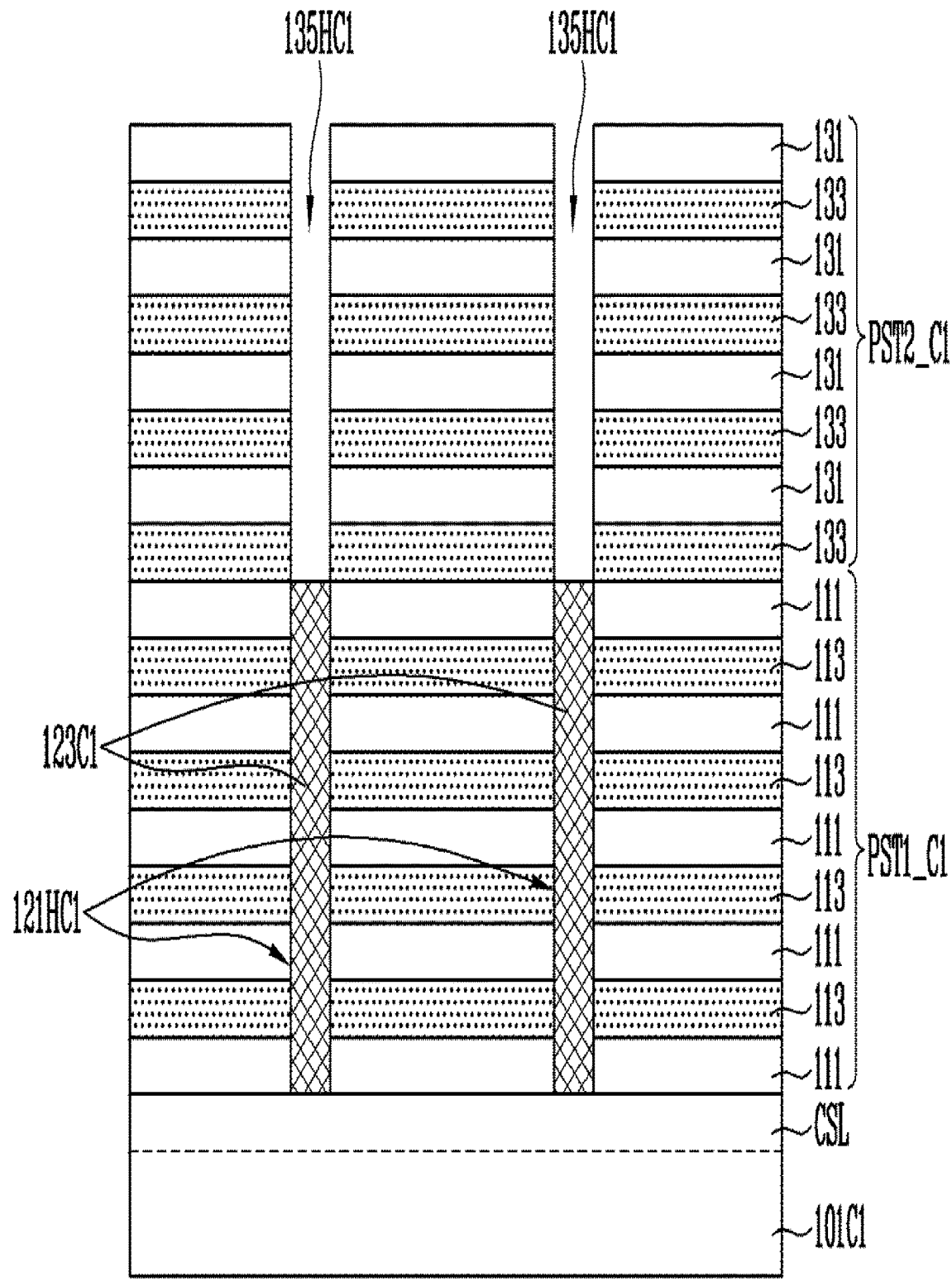

Referring to FIG. 5B, the third material layers 131 and the fourth material layers 133 described in FIG. 4B may be formed on the first pre-cell stacked structure PST1_C1 including the second lower buried layer 123C1. Hereinafter, the third material layers 131 and the fourth material layers 133 alternately stacked on the cell region 101C1 of the substrate may be defined as a second pre-cell stacked structure PST2_C1. The second pre-cell stacked structure PST2_C1 may be extended from the second peripheral stacked structure ST2_P described in FIG. 4B. The third material layers 131 of the second pre-cell stacked structure PST2_C1 may be used as the interlayer insulating layer, and the fourth material layers 133 may be used as the sacrificial layer. The second pre-cell stacked structure PST2_C1 and the second peripheral stacked structure ST2_P in FIG. 4B may be formed at the same time.

Subsequently, a second upper through hole 135HC1 which penetrates the second pre-cell stacked structure PST2_C1 may be formed. The second upper through hole 135HC1 and the first upper through hole 135HP described in FIG. 4B may be formed at the same time. In other words, the first upper through hole 135HP and the second upper through hole 135HC1 may be formed using the one mask process. The second upper through hole 135HC1 may be formed overlapping the second lower through hole 121HC1.

Hereafter, during the forming process for the upper buried layer 141P described in FIG. 4B, the process is controlled so that the second upper through hole 135HC1 is not filled with material for the upper buried material 141P, further the second upper through hole 135HC1 may remain open. When material for the upper buried layer 141P is filled in the second upper through hole 135HC1, the etching process to remove the material for the upper buried layer 141P filled in the second upper through hole 135HC1 may be further performed. Consequently, the second lower buried layer 123C1 may be exposed through the second upper through hole 135HC1.

Figure 5C:
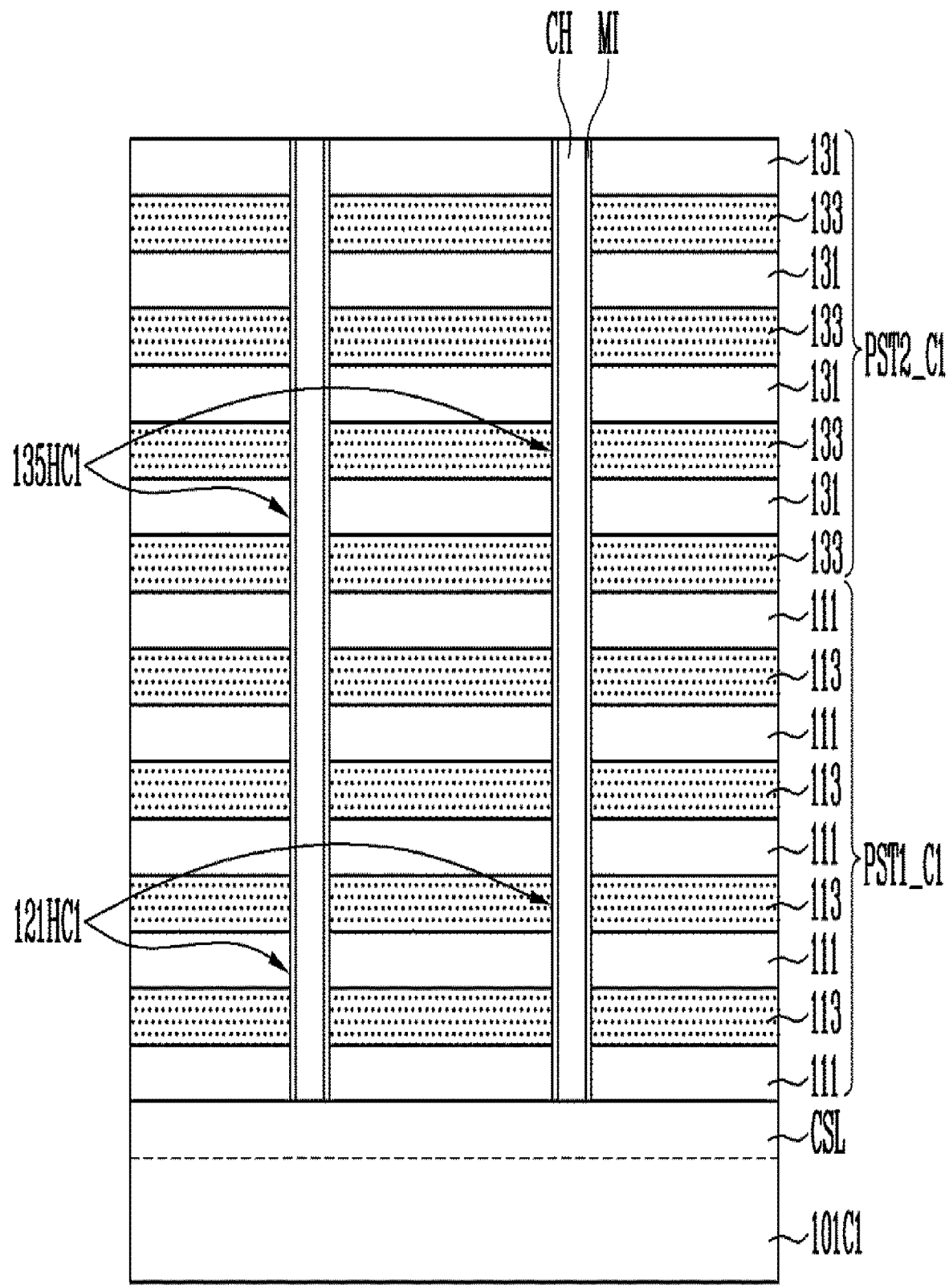

Referring to FIG. 5C, before forming the first upper insulating layer described in FIG. 4C, the second lower buried layer 123C1 in FIG. 5B exposed through the second upper through hole 135HC1 may be removed by the etching process. Hereby, the second lower through hole 121HC1 may be opened.

Subsequently, the channel layer CH may be formed in the second upper through hole 135HC1 and the second lower through hole 121HC1. Because the channel layer CH may be formed after the second upper through hole 135HC1 and the second lower through hole 121HC1 are opened, the channel layer CH may be formed in one pattern without boundaries in the second upper through hole 135HC1 and the second lower through hole 121HC1.

The channel layer CH may be formed from the semiconductor layer such as polysilicon. The channel layer CH may be formed in a tube shape according to an outer wall contour of the second upper through hole 135HC1 and the second lower through hole 121HC1. In this instance, central region of the channel layer CH having a tube shape may be filled with the insulating material. Or, the channel layer CH may be formed as a buried shape which completely fills the second upper through hole 135HC1 and the second lower through hole 121HC1.

Before forming the channel layer CH, the memory layer MI may be further formed according to sidewall contour of the second upper through hole 135HC1 and the second lower through hole 121HC1. The memory layer MI may include at least one of a tunnel insulating layer, a data storage layer, and a blocking insulating layer. The tunnel insulating layer may be in contact with the channel layer CH, the data storage layer may be in contact with the tunnel insulating layer, and the blocking insulating layer may be in contact with the data storage layer. The tunnel insulating layer may be formed of a silicon oxide layer and the data storage layer may be formed of the material layer in which it is possible to form a charge trap. For example, the data storage layer may be formed of a silicon nitride layer. The blocking insulating layer may include at least one of the silicon oxide layer and a high dielectric film which has a higher permittivity than the silicon oxide layer.

Figure 5D:
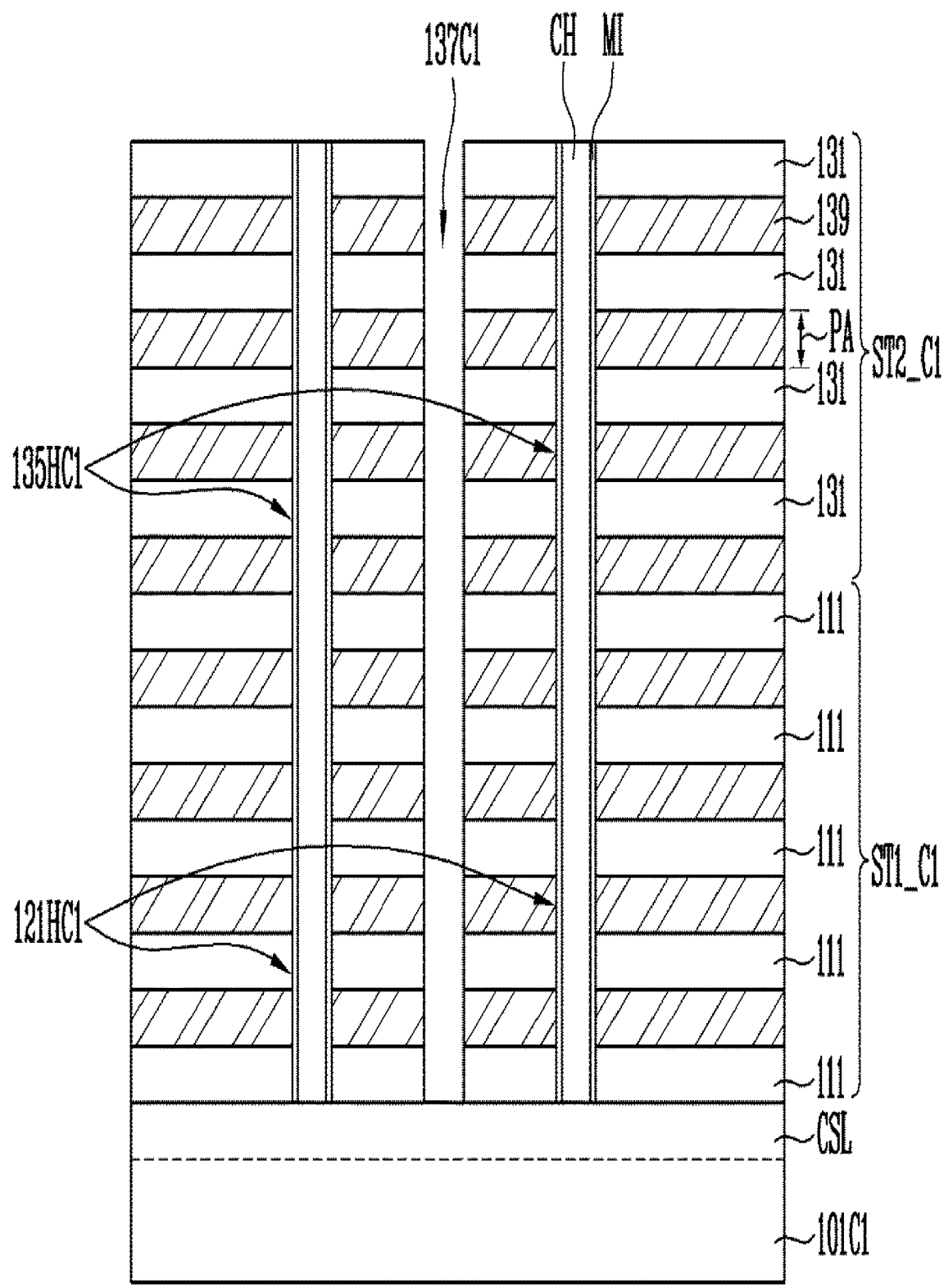

Referring to FIG. 5D, the slit 137C1 penetrating the first and second pre-cell stacked structures (PST1_C1 and PST2_C1 of FIG. 4C) may be formed. Through the slit 137C1, sidewalls of the first material layer to the fourth material layers (111, 113, 131, and 133 of FIG. 4C) formed on the cell region 101C1 of the substrate may be exposed.

Hereafter, openings PA may be formed by selectively removing the second and the fourth material layers (113 and 133 of FIG. 4C) exposed through the slit 137C1. Hereafter, the openings PA may be filled with fifth material patterns 139. The fifth material patterns 139 may be formed with the conductive material for the conductive pattern. The fifth material patterns 139 may include at least one of Polysilicon, metal Silicide and metal, or may be formed from a combination thereof. Before forming the fifth material pattern 139, the blocking insulating layer may be further formed according to a surface of the openings PA. Each of the fifth material patterns 139 may further include a barrier metal layer formed along surface contours of the openings PA. The fifth material patterns 139 may be separated by the slit 137C1.

According to the process described above, the memory string may include the stacked structure of the first cell stacked structure ST1_C1 and the second cell stacked structure ST2_C1. The first cell stacked structure ST1_C1 may be formed from the structure in which the interlayer insulating layers formed of the first material layers 111 and the conductive patterns formed of the fifth material patterns 139 are alternately stacked. The second cell stacked structure ST2_C1 may be formed from the structure in which the interlayer insulating layers formed of the third material layers 131 and the conductive patterns formed of the fifth material patterns 139 are alternately stacked. The fifth material patterns 139 may be used as one of the lower select line LSL, the word line WL and the upper select line USL described in FIG. 2A.

Figure 5E:
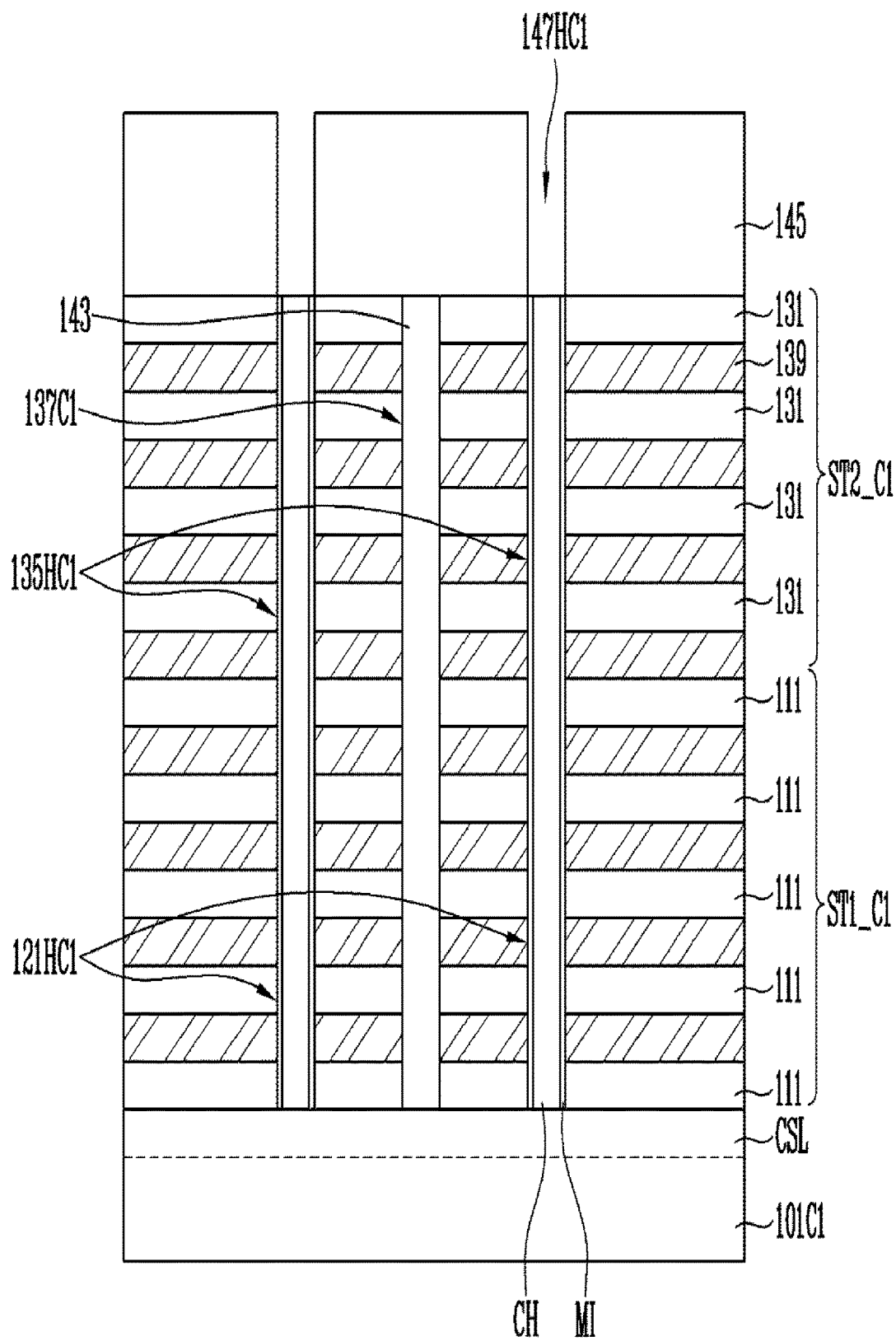

Referring to FIG. 5E, the first upper insulating layer 145 described in FIG. 4C may be formed on the second cell stacked structure ST2_C1. Before forming the first upper insulating layer 145, the process for filling the slit 137C1 with a slit insulating layer 143 may be further performed. The slit insulating layer 143 may be comprised of the portion of the first upper insulating layer 145 filling the slit 137C1 in the process of forming the first upper insulating layer 145.

Subsequently, the second contact hole 147HC1 penetrating the first upper insulating layer 145 and exposing the channel layer CH may be formed. The second contact hole 147HC1 and the first contact hole 147HP described in FIG. 4C may be formed at the same time. In other words, the first contact hole 147HP and the second contact hole 147HC1 may be formed using the one mask process.

Figure 5F:
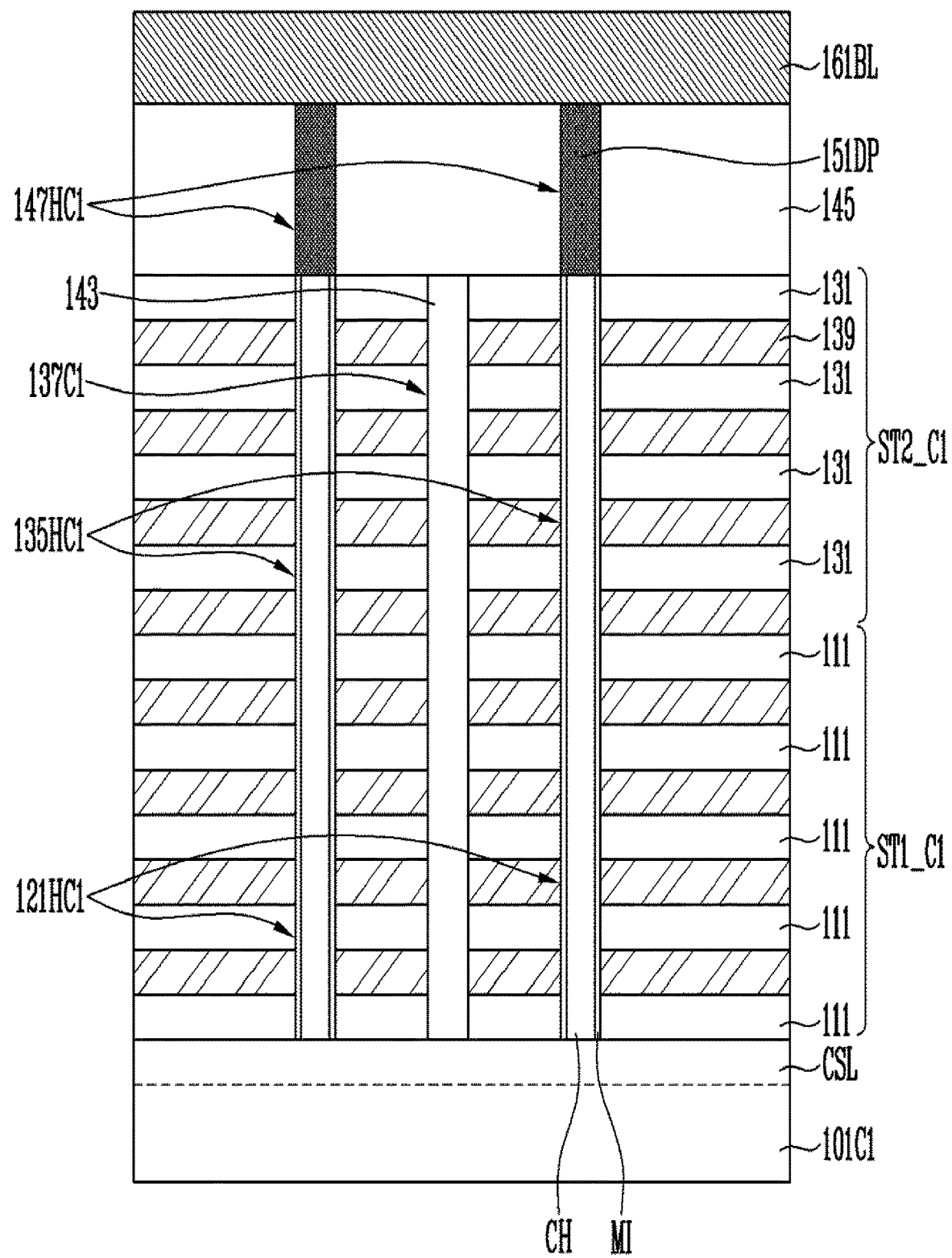

Referring to FIG. 5F, a channel contact plug 151DP may be formed in the second contact hole 147HC1. The channel contact plug 151DP may be formed in the second contact hole 147H. The channel contact plug 151DP may be formed after an elimination process of the upper buried layer 141P described in FIG. 4D. The channel contact plug 151DP and the second contact plug 151P2 described in FIG. 4E may be formed at the same time.

Subsequently, a cell metal wire 161BL coupled to the channel contact plug 151DP on the first upper insulating layer 145 may be formed. The cell metal wire 161BL and the peripheral metal wires 161M1, 161M2 and 161M3 described in FIG. 4E may be formed at the same time. In other words, the cell metal wire 161BL and the peripheral metal wires 161M1, 161M2 and 161M3 may be formed by the one mask process.

According to the embodiment of the present disclosure described above, the uppermost contact plug (for example, 151P2), among the contact plugs which constitute the plug structure, arranged on the peripheral region 101P of the substrate illustrated in FIG. 4E, may have an upper part extended to a height of the channel contact plug 151DP. Further, the peripheral stacked structures may be formed to the same height as the cell stacked structures. Still further, the interface between the contact plugs constituting the plug structure (for example, interface between the first contact plug 123P1 and the second contact plug 151P2) may be arranged at a height of the interface between the cell stacked structures (for example, the first and second cell stacked structures ST1_C1, ST2_C2).

According to the embodiment of the present disclosure described above, each of the contact plugs constituting the plug structure in the peripheral region may have a smaller length than the channel layer CH. A lower contact plug (for example, the first contact plug 123P1), among the contact plugs in the peripheral region having a smaller length, may be formed at the same time as the second buried layer 123C1 is formed, the second buried layer 123C1 may be used as the sacrificial material in the cell region. Accordingly, in the present disclosure, the structurally stable plug structure may be formed with a simplified process.

FIGS. 6A to 6H are cross-sectional views illustrating a method of manufacturing the memory string structure of the semiconductor device according to an embodiment of the disclosure. The structure formed in the cell region may be formed using the process described in relation to FIGS. 4A to 4E. FIGS. 6A to 6H illustrate an example of forming the memory string structure in the U shape described in FIG. 2B which may be formed in the cell region.

Figure 6A:
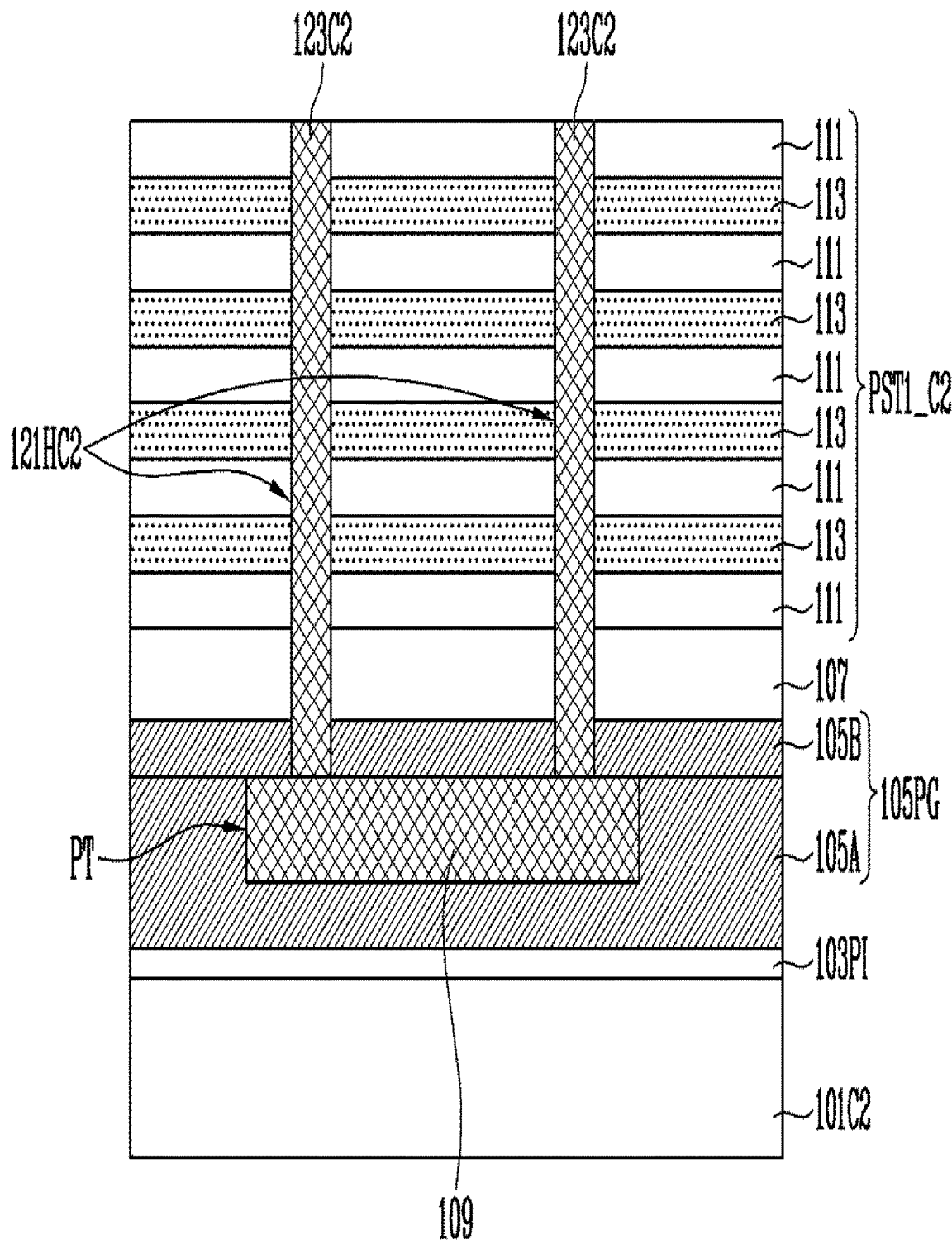
FIGS. 6A to 6H are cross-sectional views illustrating a manufacturing method of the memory string structure of a semiconductor device according to an embodiment of the disclosure.

Referring to FIG. 6A, the insulating layer and the gate conductive layer may be formed on the cell region 101C2 of the substrate. The cell region 101C2 of the substrate may be extended from the peripheral region 101P of the substrate illustrated in FIG. 4A. Hereafter, a pipe insulating layer 103PI and a pipe gate 105PG may be formed on the cell region 101C2 of the substrate using the gate conductive layer patterning process described in FIG. 4A.

The pipe gate 105PG may include a pipe trench PT filled with a pipe buried layer (not illustrated). The gate conductive layer may be formed of the stacked structure including a first conductive layer 105A and a second conductive layer 105B to form the pipe gate 105PG. Before stacking the second conductive layer 105B, the pipe trench PT may be formed by etching a portion of the first conductive layer 105A. After filling the pipe trench PT with a pipe buried layer 109, the second conductive layer 105B may be deposited. Subsequently, the pipe gate 105PG and the driving gate 105DG in FIG. 4A are separated from each other by patterning the first and second conductive layers 105A and 105B.

The pipe buried layer 109 may be formed of a material which has an etch selectivity against the pipe gate 105PG, the first and second material layers 111 and 113, and the third and fourth material layers formed in a subsequent process, as the sacrificial material.

Subsequently, the planarization insulating layer 107 described in FIG. 4A may be formed on the cell region 101C2 of the substrate.

Hereafter, since the first and second material layers 111 and 113 may be formed on the pipe gate 105PG described in FIG. 4A, the first pre-cell stacked structure PST1_C2 may be defined. The first pre-cell stacked structure PST1_C2 may extend from the first peripheral stacked structure ST1_P described in FIG. 4A. The first material layer 111 of the first pre-cell stacked structure PST1_C2 may be used as the interlayer insulating layers, and the second material layer 113 may be used as the sacrificial layer. The first pre-cell stacked structure PST1_C2 and the first peripheral stacked structure ST1_P may be formed at the same time.

Subsequently, the second lower through hole 121HC2 which penetrates the first pre-cell stacked structure PST1_C2 may be formed. The second lower through hole 121HC2 and the first lower through hole 121HP described in FIG. 4A may be formed at the same time. The second lower through holes 121HC2 may further penetrate the planarization insulating layer 107 and the second conductive layer 105B and may be coupled to both sides of the pipe trench PT.

Hereafter, the second lower buried layers 123C2 may fill in the second lower through holes 121HC2. The second lower buried layers 123C2 and the first lower buried layer 123P1 described in FIG. 4A may be formed at the same time.

Figure 6B:
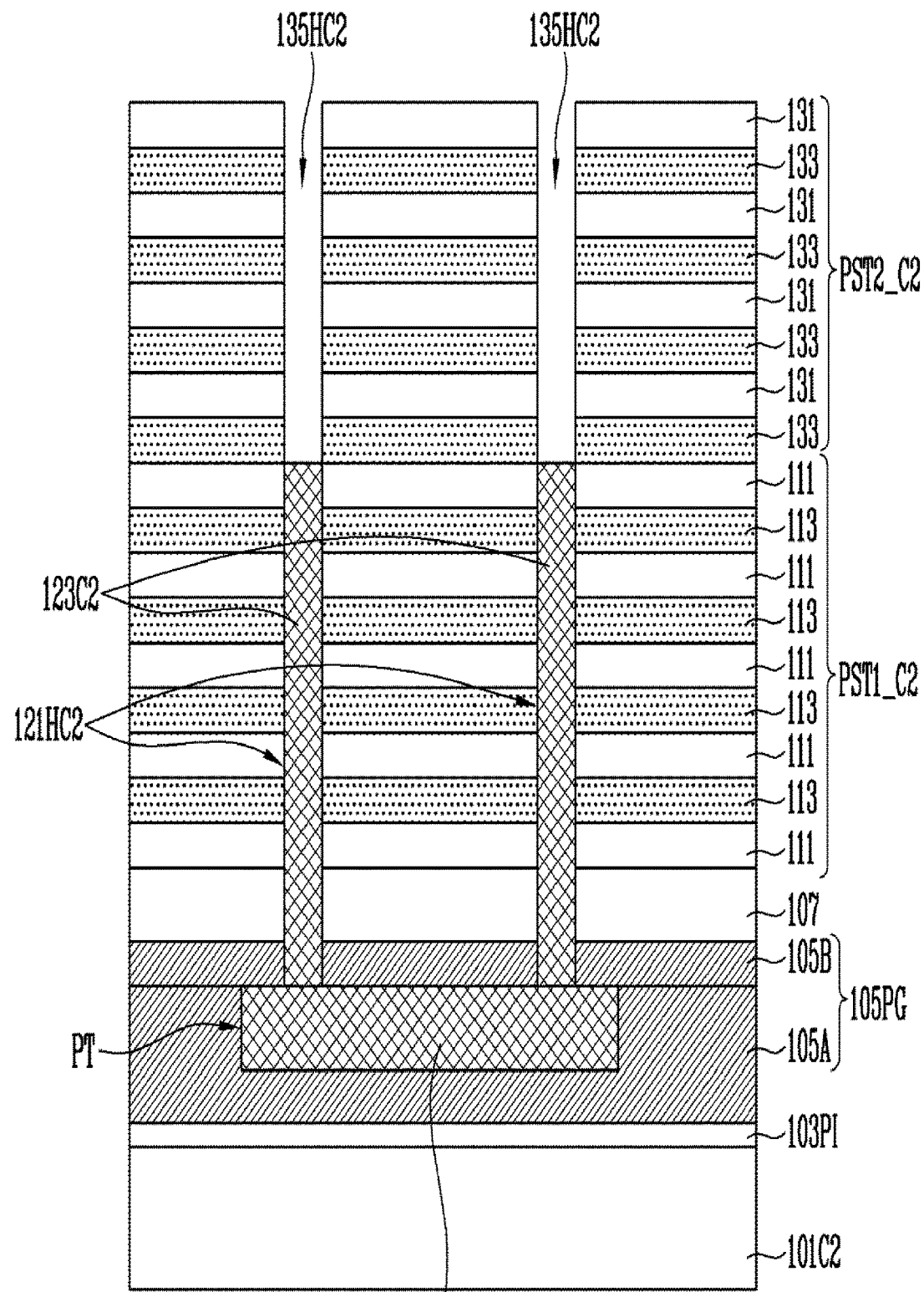

Referring to FIG. 6B, the third material layers 131 and the fourth material layers 133 described in FIG. 4B may be formed on the first pre-cell stacked structure PST1_C2 and the second pre-cell stacked structure PST2_C2 may be defined. The second lower buried layers 123C2 may penetrate the first pre-cell stacked structure PST1_C2. The second pre-cell stacked structure PST2_C2 may be extended from the second peripheral stacked structure ST2_P described in FIG. 4B. The third material layers 131 of the second pre-cell stacked structure PST2_C2 may be used as the interlayer insulating layers, the fourth material layers 133 may be used as the sacrificial layer. The second pre-cell stacked structure PST2_C2 and the second peripheral stacked structure ST1_P described in FIG. 4B may be formed at the same time.

Subsequently, the second upper through holes 135HC2 may be formed. The second upper through holes 135HC2 may penetrate the second pre-cell stacked structure PST2_C2 and overlap the second lower through holes 123HC2. The second upper through holes 135HC2 and the first upper through hole 135HP described in FIG. 4B may be formed at the same time.

Hereafter, during the process of forming the upper buried layer 141P described in FIG. 4B, the process is controlled so as not to fill the second upper through holes 135HC with the material for the upper buried layer 141P. When the second upper through holes 135HC are filled with the material for the upper buried layer 141P, the etching process to remove the material for the upper buried layer 141P filled in the second upper through holes 135HC2 may be performed. Hereby, the second upper buried layers 123C2 may be exposed through the second upper through holes 135HC2.

Figure 6C:
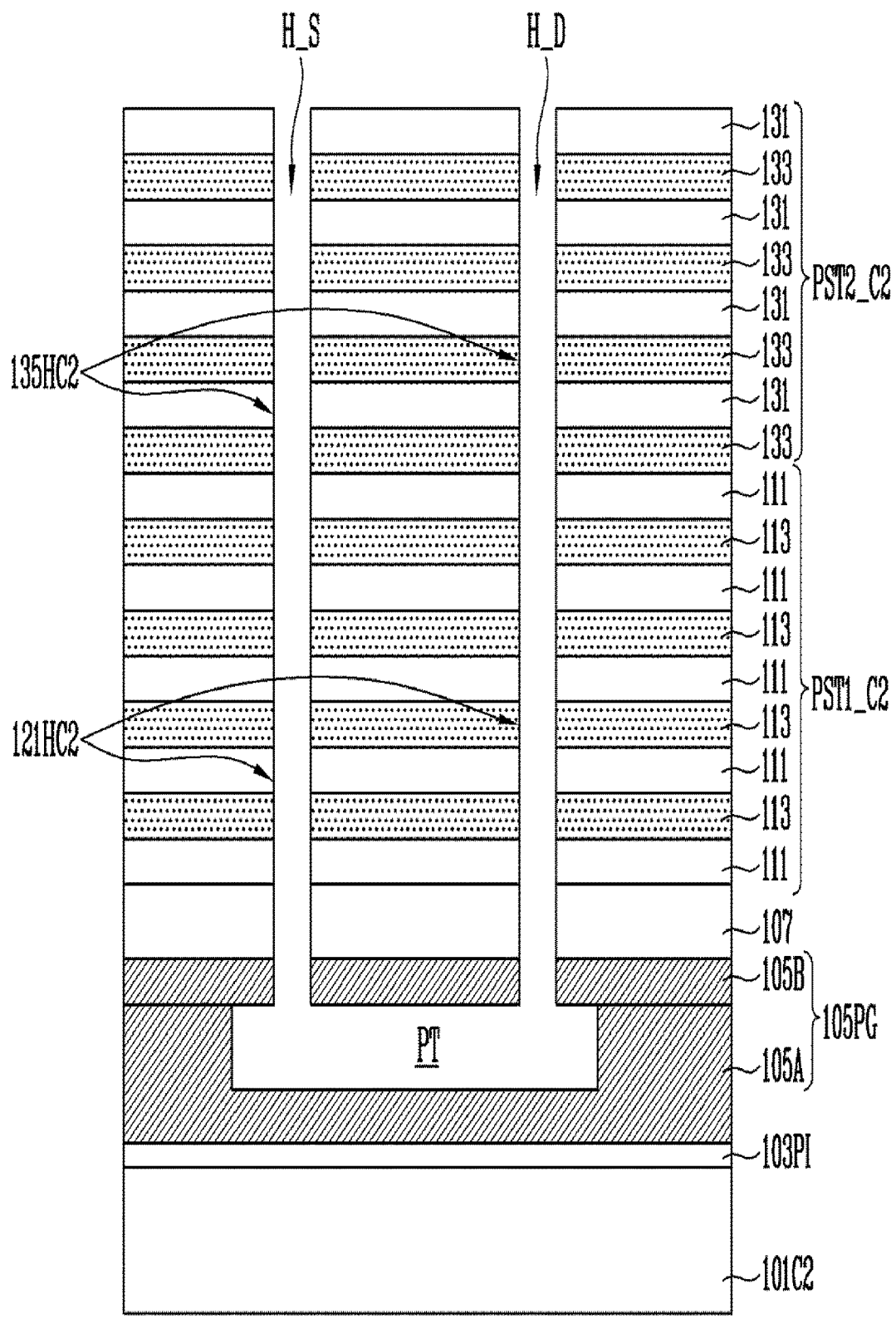

Referring to FIG. 6C, before forming the first upper insulating layer described in FIG. 4C, the second lower buried layers (123C2 of FIG. 6B) exposed through the second upper through holes 135HC2 may be eliminated by the etching process. Hereby, the second lower through holes 121HC2 may be opened. Hereafter, the pipe buried layer (109 of FIG. 6B) exposed through the second lower through holes 121HC2 may be eliminated by the etching process. Hereby, the pipe trench PT may be opened.

The second lower through hole 121HC2 and the second upper through hole 135HC2 coupled at one end of the pipe trench PT may be defined as a source-side hole H_S, the second lower through hole 121HC2 and the second upper through hole 135HC2 coupled at the other end of the pipe trench PT may be defined as a drain-side hole H_D.

Figure 6D:
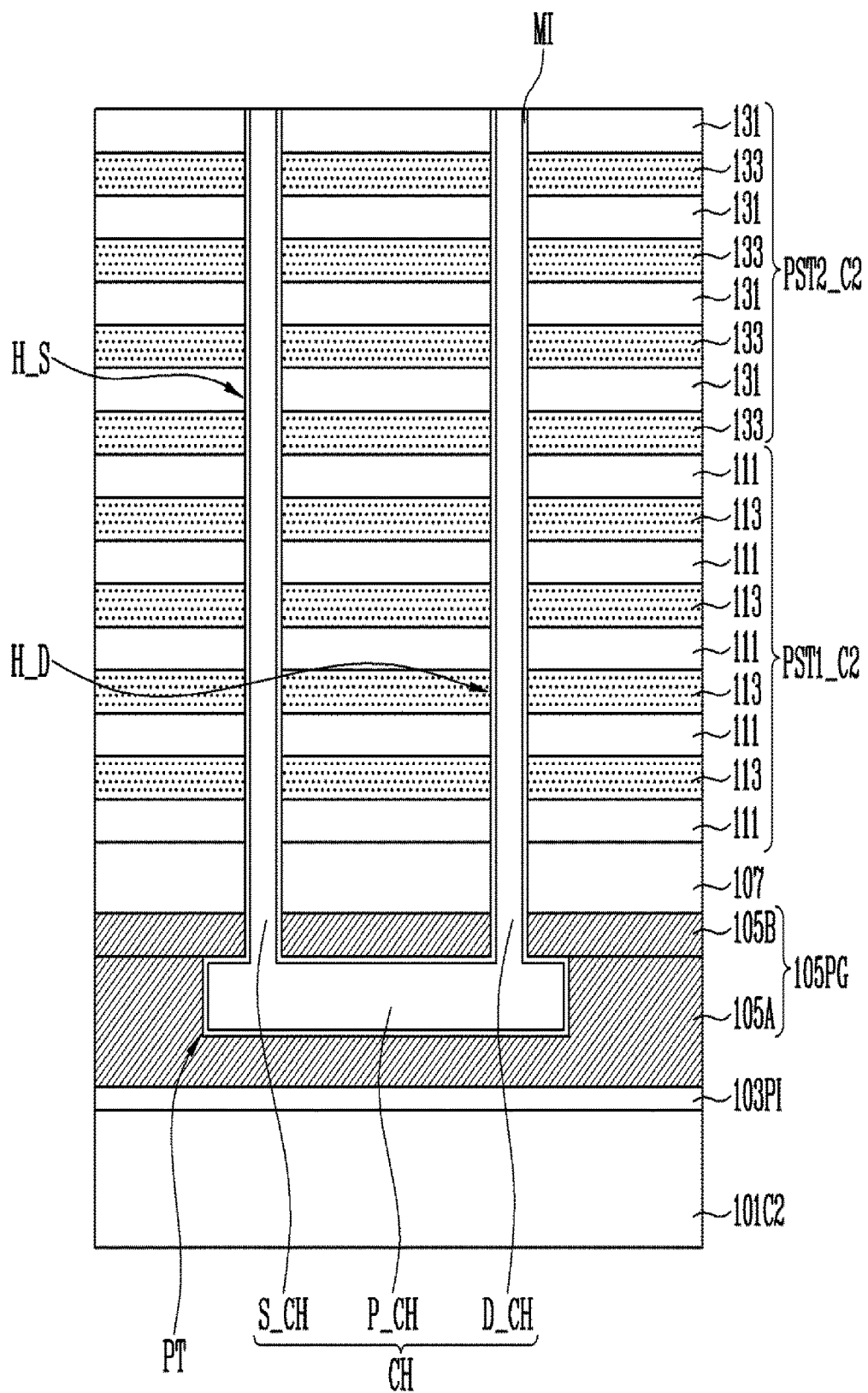

Referring to FIG. 6D, the memory layer MI and the channel layer CH may be formed using the same process described in relation to FIG. 5C. The channel layer CH may be formed as the pattern in one structure without boundaries in the source-side hole H_S, the drain-side hole H_D and the pipe trench PT. The channel layer CH may include the source-side channel layer S_CH filling the source-side hole H_S, the pipe channel layer P_CH filling the pipe trench PT and the drain-side channel layer D_CH filling the drain-side hole H_D. The memory layer MI may be formed to surround the channel layer along the surface contour of the source-side hole H_S, the drain-side hole H_D and the pipe trench PT.

Figure 6E:
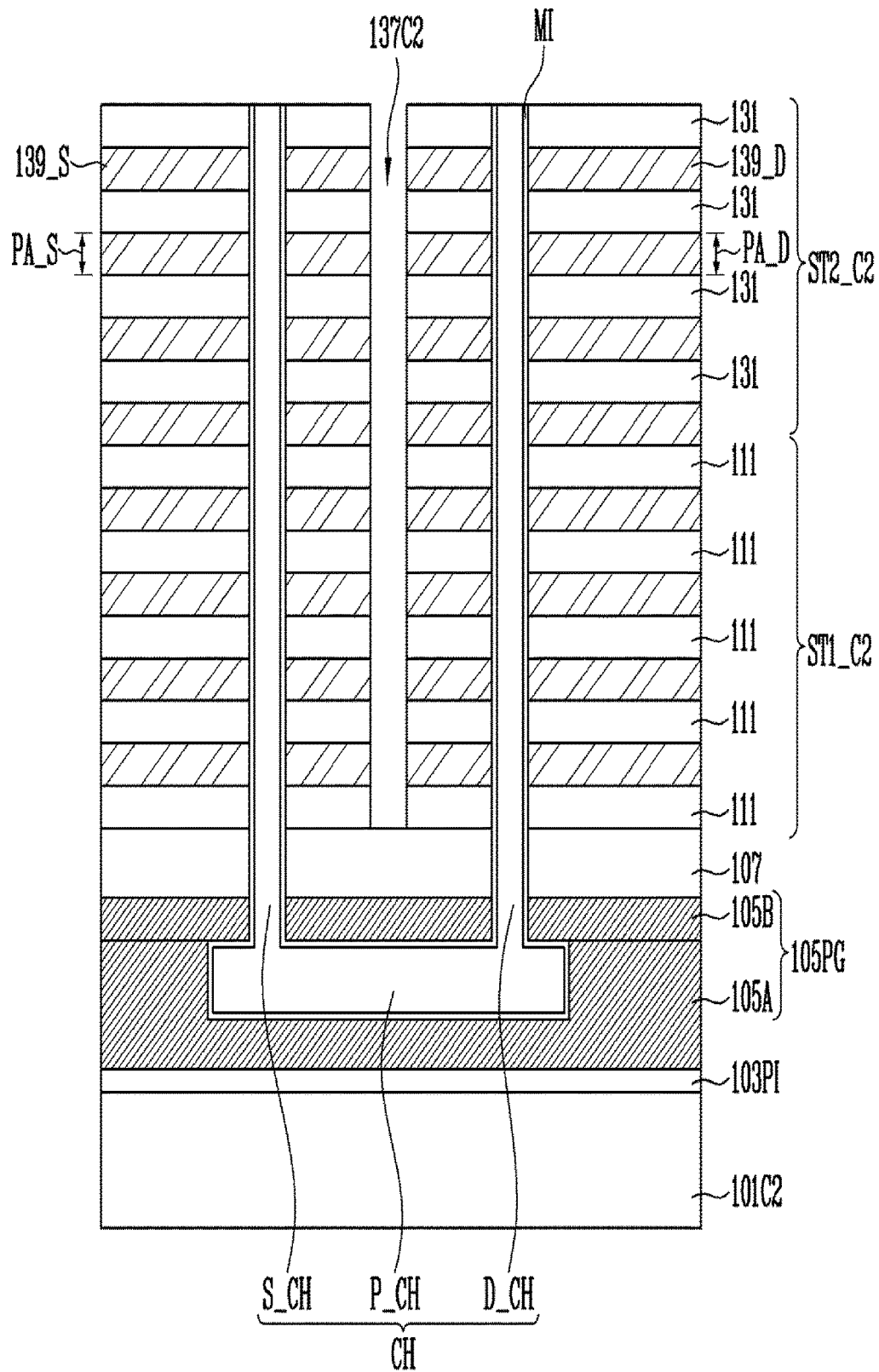

Referring to FIG. 6E, the slit 137C2 penetrating the first and second pre-cell stacked structures (PST1_C2 and PST2_C2 of FIG. 6D) may be formed. The slit 137C2 may be arranged between the source-side channel layer S_CH and the drain-side channel layer D_CH. The sidewall of the first to fourth material layers (111, 113, 131 and 133 of FIG. 6D) formed in cell region 101C2 of the substrate through the slit 137C2 may be exposed.

Hereafter, the openings PA_S and PA_D may be formed by selectively eliminating the second and fourth material layers (113 and 133 of FIG. 6D) exposed through the slit 137C2. The openings PA_S and PA_D may be separated as the source-side openings PA_S around the source-side channel layer S_CH and the drain-side openings PA_D around the drain-side channel layer D_CH.

Subsequently, each of the openings PA_S and PA_D may be filled with the fifth material patterns. The fifth material patterns may be formed with the conductive material for the conductive patterns. Hereby, source-side conductive patterns 139_S filling the source-side openings PA_S and surrounding the source-side channel layer S_CH may be formed. Drain-side conductive patterns 139_D filling the drain-side openings PA_D and surrounding the drain-side channel layer D_CH may be formed. The source-side conductive patterns 139_S and the drain-side conductive patterns 139_D may be separated by the slit 137C2. The source-side conductive patterns 139_S may be used by the source-side word line WL_S or the source select line SSL described in FIG. 2B. The drain-side conductive patterns 139_D may be used by the drain-side word line WL_D or the drain select line DSL described in FIG. 2B.

In the above, each of the fifth material patterns may include one of polysilicon, metal silicide and metal, or may be formed of a combination thereof. Before forming the fifth material patterns, the blocking insulating layer may be further formed along the surface contour of the openings PA_S and PA_D. Each of the fifth material patterns may further include a barrier metal layer formed along the surface of each of the openings PA_S and PA_D.

According to the process described above, each of the source-side cell stacked structure and the drain-side cell stacked structure may be formed as the stacked structure of the first cell stacked structure ST1_C2 and the second cell stacked structure ST2_C2. The first cell stacked structure ST1_C1 may be formed as the structure in which the interlayer insulating layer including the first material layers 111 and the conductive patterns including the fifth material patterns are alternately stacked. The second cell stacked structure ST2_C1 may be formed as the structure in which the interlayer insulating layer including the third material layers 131 and the conductive patterns including the fifth material patterns are alternately stacked.

Figure 6F:
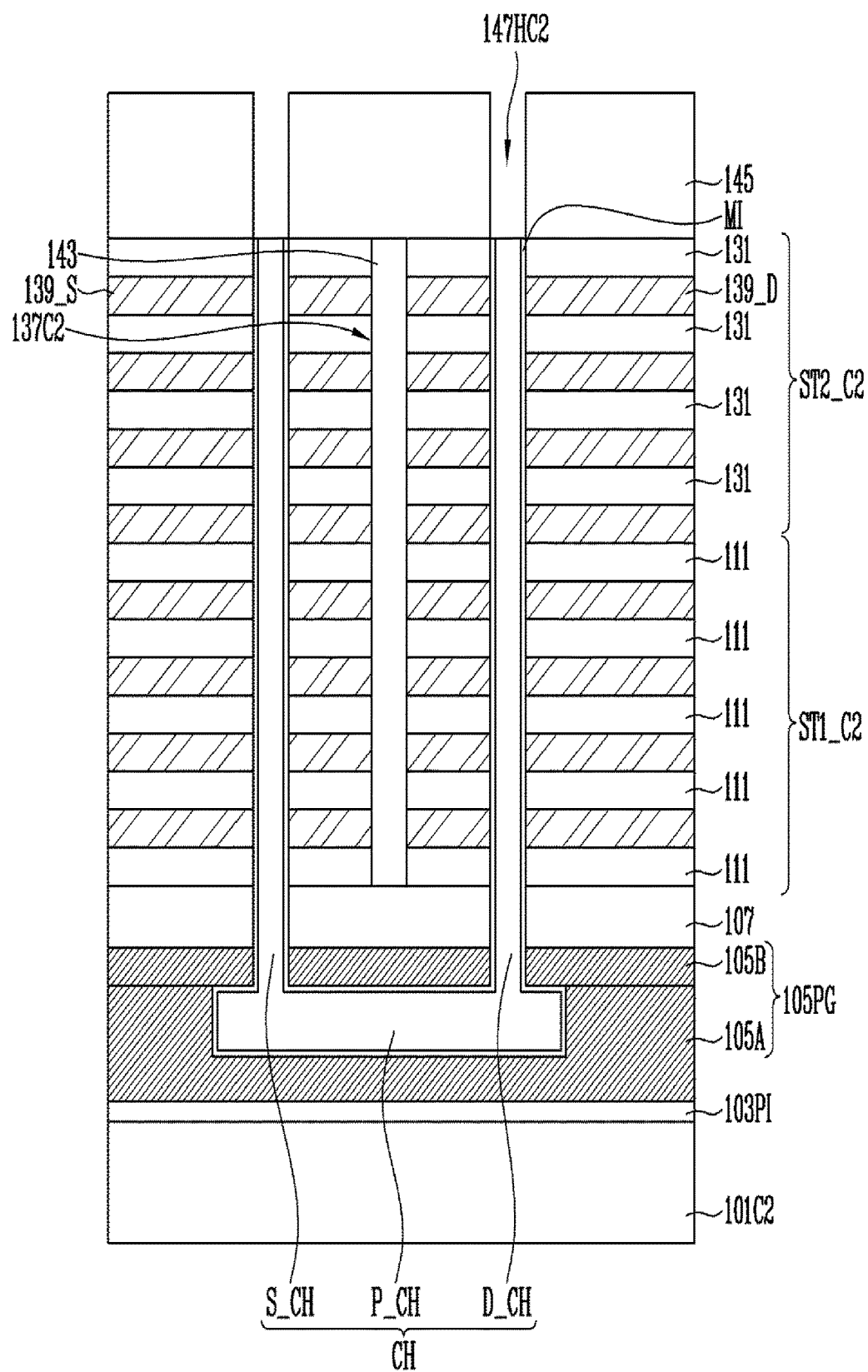

Referring to FIG. 6F, the first upper insulating layer 145 described in FIG. 4C may be formed on the second cell stacked structure ST2_C2. Before forming the first upper insulating layer 145, a process for filling the slit 137C2 with the slit insulating layer 143 may be further performed. Or, the slit insulating layer 143 may be the portion of the first upper insulating layer 145 filling the slit 137C2 while forming the first upper insulating layer 145.

Subsequently, the second contact holes 147HC2 which penetrate the first upper insulating layer 145 and expose the source-side channel layer S_CH and the drain-side channel layer D_CH may be formed.

Figure 6G:
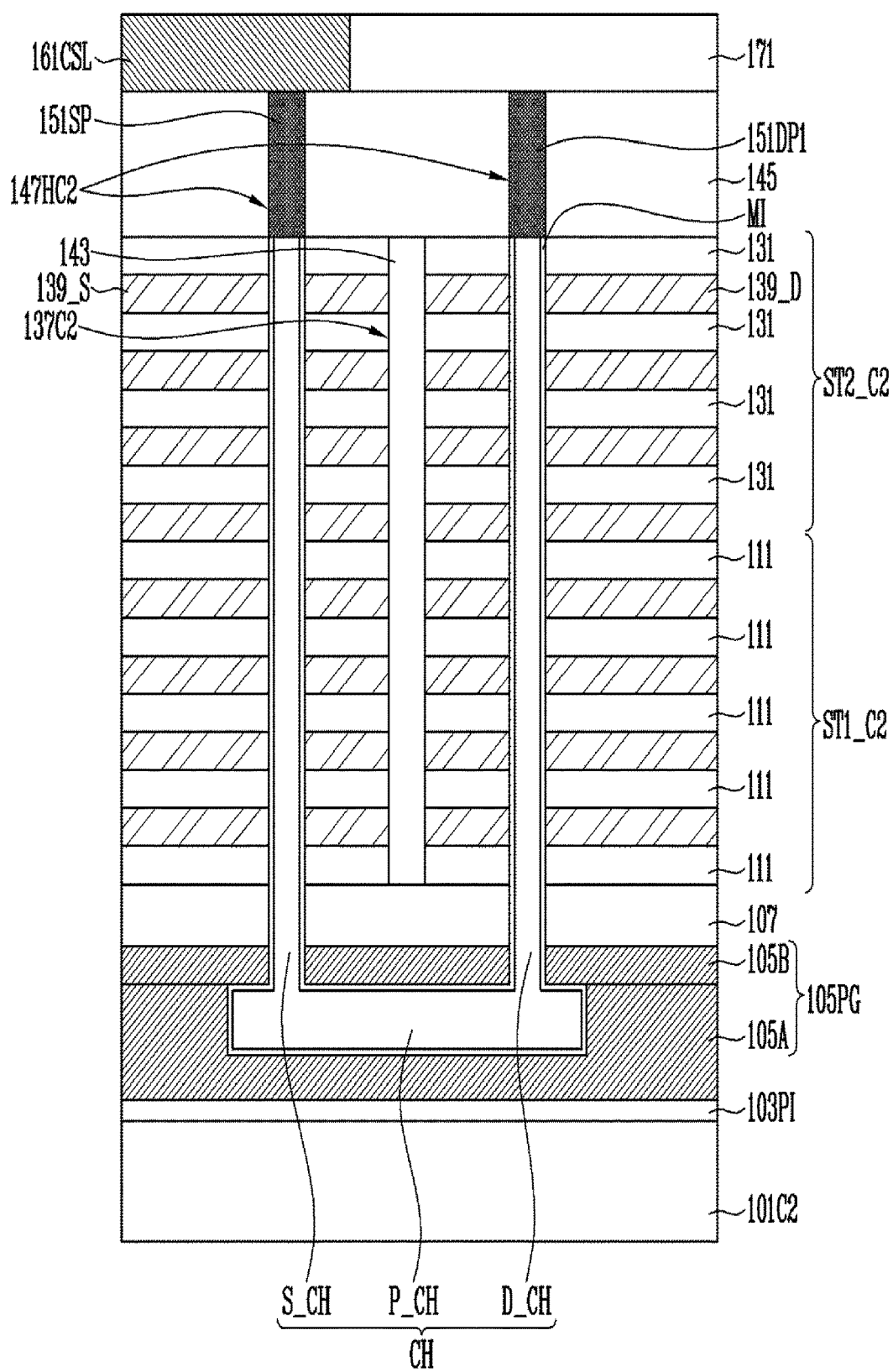

Referring to FIG. 6G, the channel contact plugs 151DP1 and 151SP may be formed in the second contact holes 147HC2. The channel contact plugs 151DP1 and 151SP may be formed after the elimination process of the upper buried layer 141P described in FIG. 4D. The channel contact plugs 151DP1 and 151SP and the second contact plug 151P2 described in FIG. 4E may be formed at the same. The channel contact plugs 151DP1 and 151SP may include the source contact plug 151SP coupled to the source-side channel layer S_CH and the lower drain contact plug 151DP1 coupled to the drain-side channel layer D_CH.

Figure 6H:
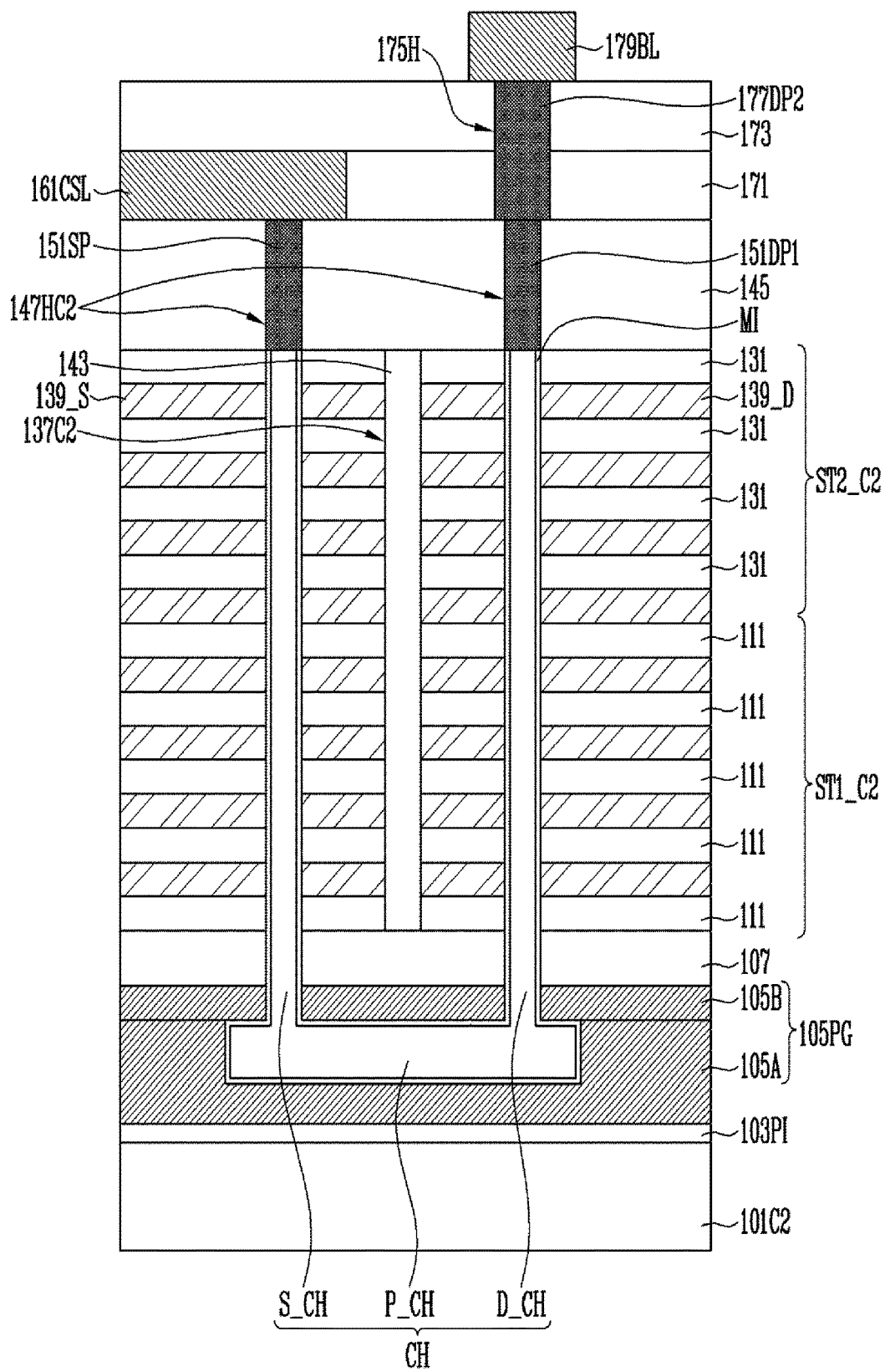

Referring FIG. 6H, a first cell metal wire 161CSL coupled to the source contact plug 151SP on the first upper insulating layer 145 may be formed. The first cell metal wire 161CSL may be the common source line CSL described in FIG. 2B. The first cell metal wire 161CSL and the peripheral metal wires 161M1, 161M2 and 161M3 described in FIG. 4E may be formed at the same time. The cell metal wire 161CSL may be formed by penetrating the second upper insulating layer 171 formed on the first upper insulating layer 145.

Subsequently, the third upper insulating layer 173 may be formed on the second upper insulating 171 and the first cell metal wire 161CSL. Hereafter, the third contact hole 175H opening the lower drain contact plug 151DP1 by penetrating the third upper insulating layer 173 and the second upper insulating layer 171 may be formed. Subsequently, an upper drain contact plug 177DP2 coupled to the lower drain contact plug 151DP1 by filling the third contact hole 175 with the conductive material may be formed. Hereafter, the second cell metal wire 179BL coupled to the upper drain contact plug 177DP2 may be formed on the upper drain contact plug 177DP2. The second cell metal wire 179BL may be the bit line BL described in FIG. 2B.

According to the embodiment of the present disclosure described above, the uppermost contact plug (for example, 151P2), among the contact plugs which are arranged on the peripheral region 101P of the substrate illustrated in FIG. 4E and constitute the contact plug structure, may have an upper surface extended to the height of the channel contact plug 151DP or 151SP. Further, the peripheral stacked structures may be formed at the same height same as the cell stacked structures. Further, the interface between the contact plugs constituting the plug structure (for example, interface between the first contact plug 123P1 and the second contact plug 151P2) may be arranged at the same height as the interface between the cell stacked structures (for example, the first and second cell stacked structures ST1_C1 and ST2_C2).

According to the embodiment of the present disclosure described above, each of the contact plugs constituting the plug structure in the peripheral region may be formed shorter than the length of the source-side channel layers S_CH or the drain-side channel layer D_CH. The lower contact plug (for example, the first contact plug 123P1), among the contact plugs in the peripheral region with the short length, and the second buried layer 123C2 used as the sacrificial material in the cell region may be formed at the same time. Accordingly, the present disclosure may enable the structurally stable plug structure to be formed by the simplified process FIGS. 7A to 7G are cross-sectional views illustrating a manufacturing method of the driving transistor, the plug structure and the memory string structure of the semiconductor device according to an embodiment of the disclosure. FIGS. 7A to 7G illustrate the example in which the cell region overlaps with the peripheral region, and the memory string structure described in FIG. 2A may be formed in the cell region.

Figure 7A:
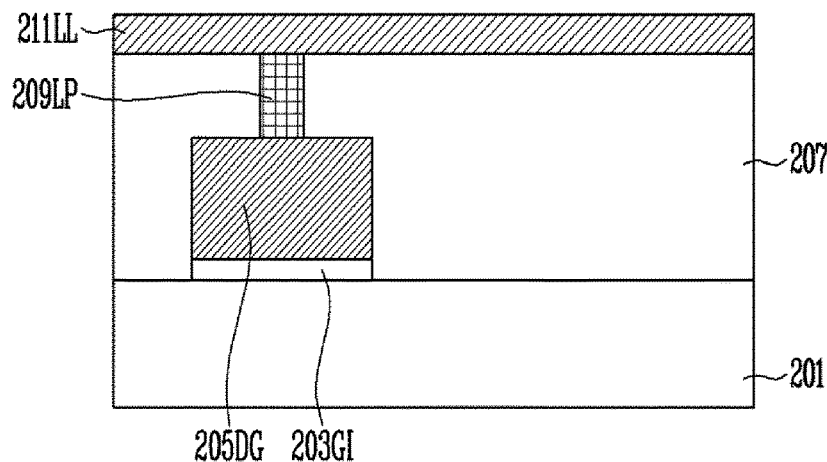
FIGS. 7A to 7G are cross-sectional views illustrating a manufacturing method of the driving transistor, the plug structure and the memory string structure of a semiconductor device according to an embodiment of the disclosure.

Referring to FIG. 7A, the driving transistor may be formed on the substrate 201. An example of a forming process of the driving transistor may be described in detail as follows.

First, the insulating layer and at least one layer of the gate conductive layer may be stacked on the substrate 201. Subsequently, a driving gate 205DG is formed by patterning the gate conductive layer. A gate insulating layer 203GI having the same pattern as the driving gate 205DG may remain under the driving gate 205DG by patterning the insulating layer when the driving gate 205DG is patterned. Subsequently, the junction regions (not illustrated) may be formed by injecting impurities on the substrate 201 as described in FIG. 4A.

After forming the driving transistor, a first lower insulating layer 207 covering the driving transistor on the substrate 201 may be formed. Hereafter, a lower plug structure 209LP electrically coupled to the driving transistor by penetrating the first lower insulating layer 207 may be formed. The lower plug structure 209LP may be coupled to the driving gate 205DG of the driving transistor.

Subsequently, the connection wire 211LL coupled to the lower plug structure 209LP may be formed on the first lower insulating layer 207. The forming process of the connection wire 211LL may include forming an insulating layer (not illustrated) on the first lower insulating layer 207, forming a trench in the insulating layer, and filling the trench with the conductive material.

Figure 7B:
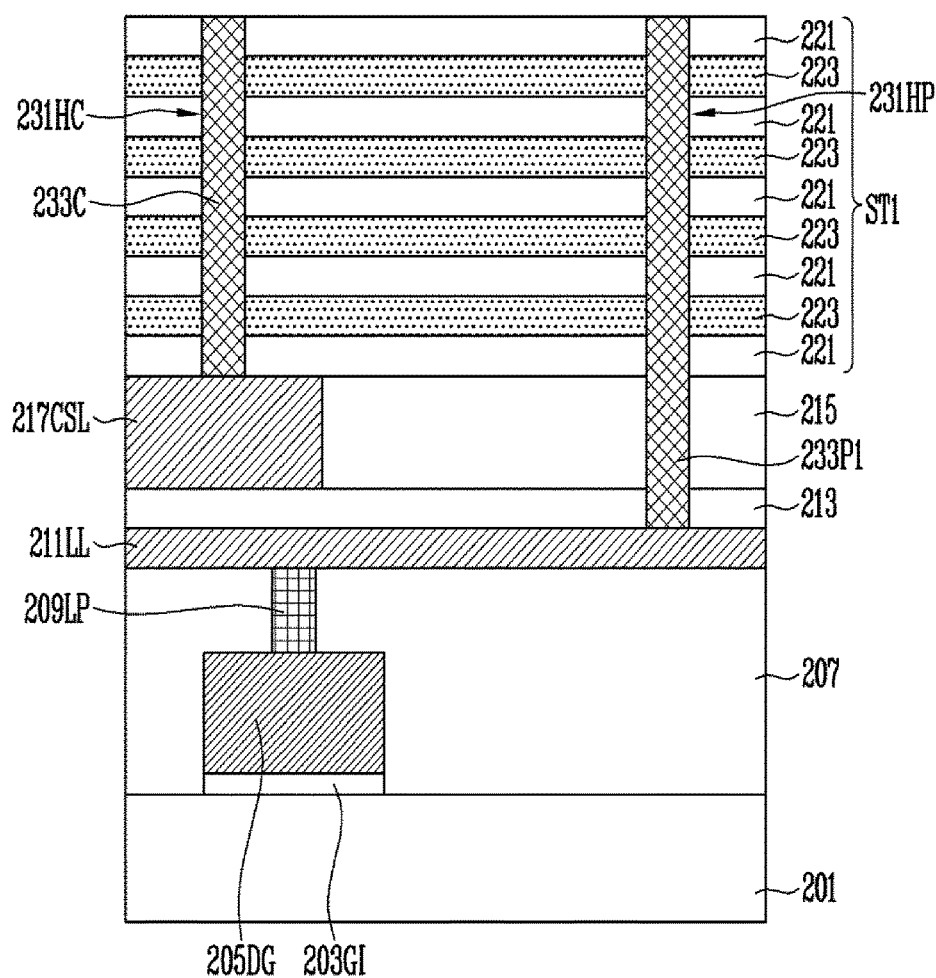

Referring to FIG. 7B, the second lower insulating layer 213 may be formed on the connection wire 211LL. Subsequently, the common source line CSL may be formed by patterning the conductive layer.

After forming the common source line CSL, a third lower insulating layer 215 with same height as the common source line CSL may be formed on the second lower insulating layer 213.

Subsequently, the first stacked structure ST1 may be formed by alternately stacking the first material layers 221 and the second material layers 223 on the third insulating layer 215.

The first material layers 221 and the second material layers 223 may be formed of materials different from each other. More specifically, the first material layers 221 and the second material layers 223 may be formed from different insulating materials which have an etch selectivity against each other. For example, the first material layers 221 may be formed of the oxide layer, the second material layers 223 may be formed of the nitride layer.

Subsequently, the first lower through hole 231HP and the second lower through hole 231HC penetrating at least one of the first stacked structure ST1, and the third and second lower insulating layer 215 and 213 may be formed. The first lower through hole 231HP may expose the connection wire 211LL by penetrating the portions of the first stacked structure ST1 and the third and the second lower insulating layers 215 and 213 which do not overlap with the driving transistor. The second lower through hole 231HC may expose the common source line CSL by penetrating the portion of the first stacked structure ST1 which overlaps with the driving transistor.

Subsequently, after forming the conductive material to fill the first and second lower through holes 231HP and 231HC, the conductive material may be planarized to expose the upper part of the first stacked structure ST1. Hereby, the first lower buried layer 233P1 and the second lower buried layer 233C may be formed of the conductive material. The conductive material to form the first and second lower buried layers 233P1 and 233C may be formed of the material having an etch selectivity against the first and second material layers 221 and 223 and the third and fourth material layers to be formed in a subsequent process. More specifically, the first and second lower buried layers 233P1 and 233C may be formed of the conductive material including at least one of Silicon Germanium (SiGe) and Carbon (C).

The first lower buried layer 233P1 may be electrically coupled to the connection wire 211LL. The first lower buried layer 233P1 may be electrically coupled to the driving transistor via the connection wire 211LL and the lower plug structure 209LP.

Figure 7C:
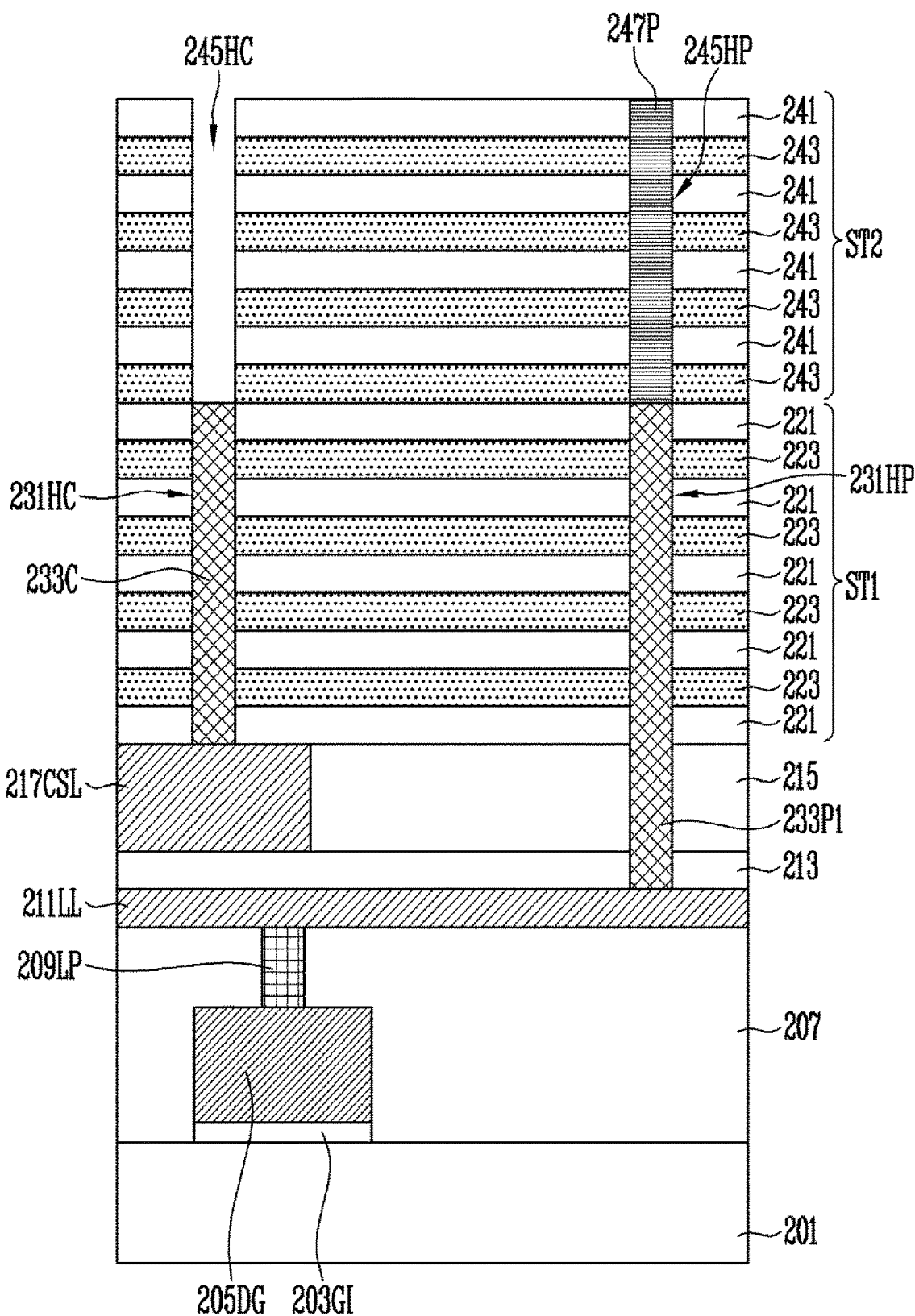

Referring to FIG. 7C, the second stacked structure ST2 may be formed by alternately stacking the third material layers 241 and the fourth material layers 243 on the first stacked structure ST1, where the first stacked structure ST1 may be penetrated by the first and second lower buried layers 233P1 and 233C. The third material layers 241 may be formed of the same insulating layer as the first material layers 221 and the fourth material layers 243 may be formed of the same material as the second material layers 223.

Subsequently, the first upper through hole 245HP and the second upper through hole 245HC penetrating the second stacked structure ST2 may be formed. Hereafter, the first upper through hole 245HP may be coupled to the first lower through hole 231HP and expose the first lower buried layer 233P1, and the second upper through hole 245HC may be coupled to the second lower through hole 231HC and expose the second lower buried layer 233C.

Subsequently, the upper buried layer 247P may fill in the first upper through hole 245HP. The upper buried layer 247P may be formed so as to not fill the second upper through hole 245HC. For example, after filling the first and second upper through holes 245HP and 245HC with the material layer for the upper buried layer 247P, the second buried layer 233C may be exposed by removing the material layer in which the second upper through hole 245HC is filled. Hereby, the upper buried layer 247P may be formed in the first upper through hole 245HP, and the second lower buried layer 233C may remain exposed.

As the sacrificial material, the upper buried layer 247P may be formed from the material layer having the etch selectivity against the first to fourth material layers 221, 223, 241 and 243 and the first and second lower buried layers 233P1 and 233C.

Figure 7D:
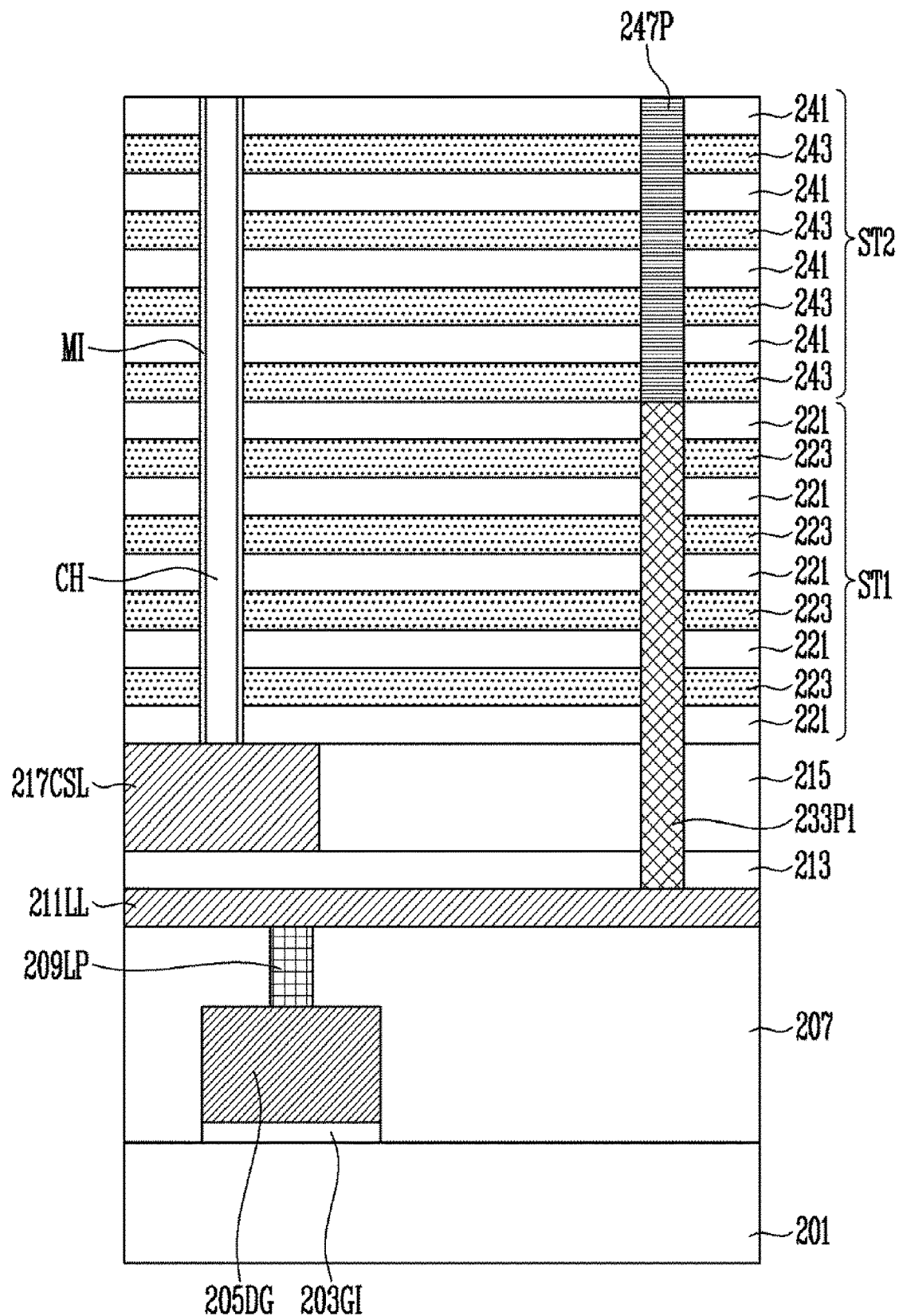

Referring to FIG. 7D, after removing the second lower buried layer (233C of FIG. 7C), the channel layer CH may be formed in the second upper through hole (245HC of FIG. 7C) and the second lower through hole (231HC of FIG. 7C). Before forming the channel layer CH, the memory layer MI may be further formed. The channel layer CH and the memory layer MI may be formed using the method and the material described in FIG. 5C.

Figure 7E:
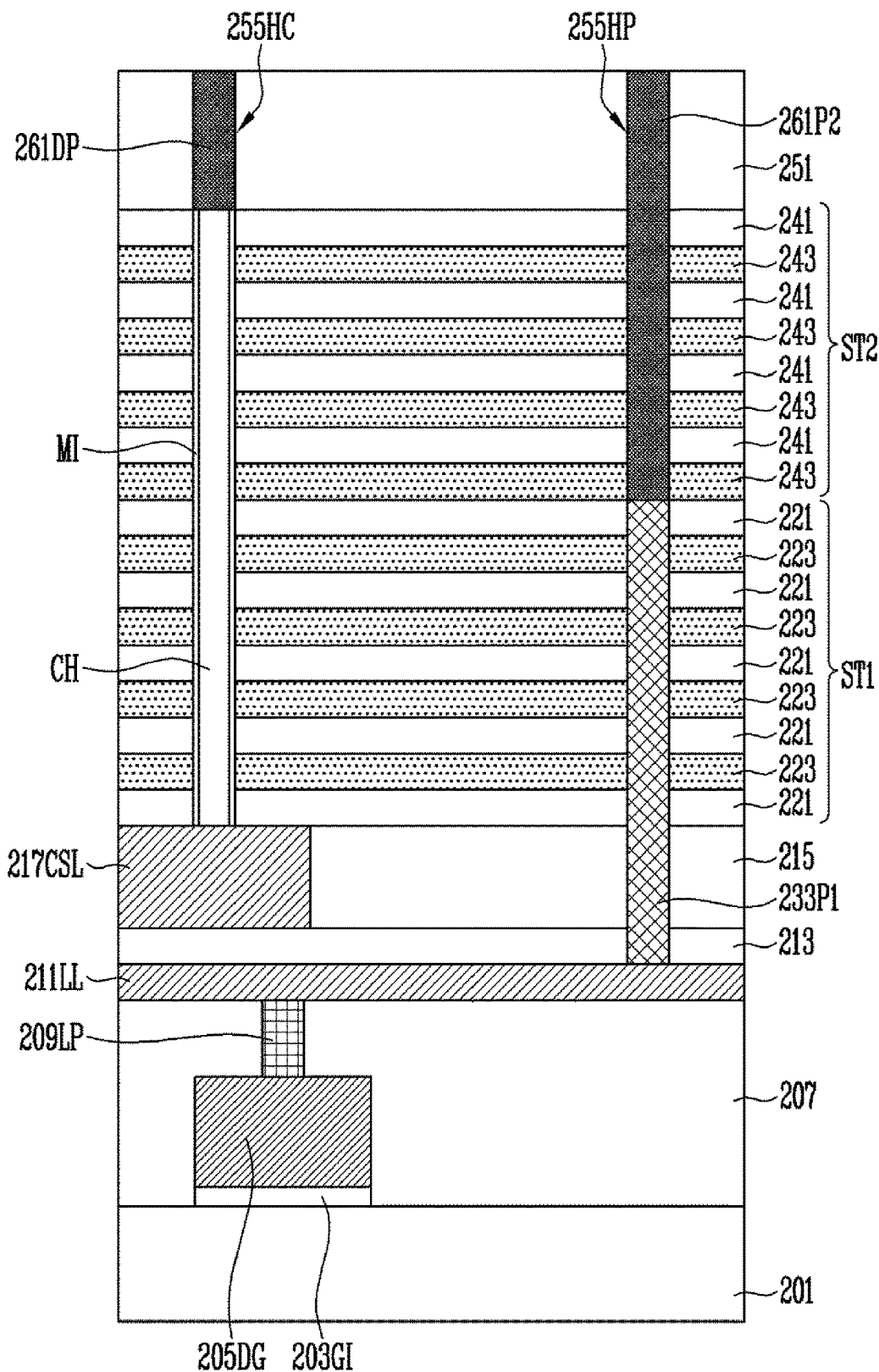

Referring to FIG. 7E, the upper insulating layer 251 may be formed on the second stacked structure ST2 penetrated by the channel layer CH and the upper buried layer (247P of FIG. 7D). Subsequently, the first contact hole 255HP and the second contact hole 255HC penetrating the upper insulating layer 251 may be formed. Hereby, the upper buried layer (247P of FIG. 7D) may be exposed by the first contact hole 255HP, and the channel layer CH may be exposed by the second contact hole 255HC.

Subsequently, the first lower buried layer 233P1 may be exposed by removing the upper buried layer 247P which is exposed by the first contact hole 255HP. Hereafter, channel contact plug 261DP and the second contact plug 261P2 may be formed by filling the first contact hole 255HP and the second contact hole 255HC with the conductive material. The second contact plug 261P2 may be coupled to the first lower buried layer 233P1 used as the first contact plug. The channel contact plug 261DP may be coupled to the channel layer CH.

Figure 7F:
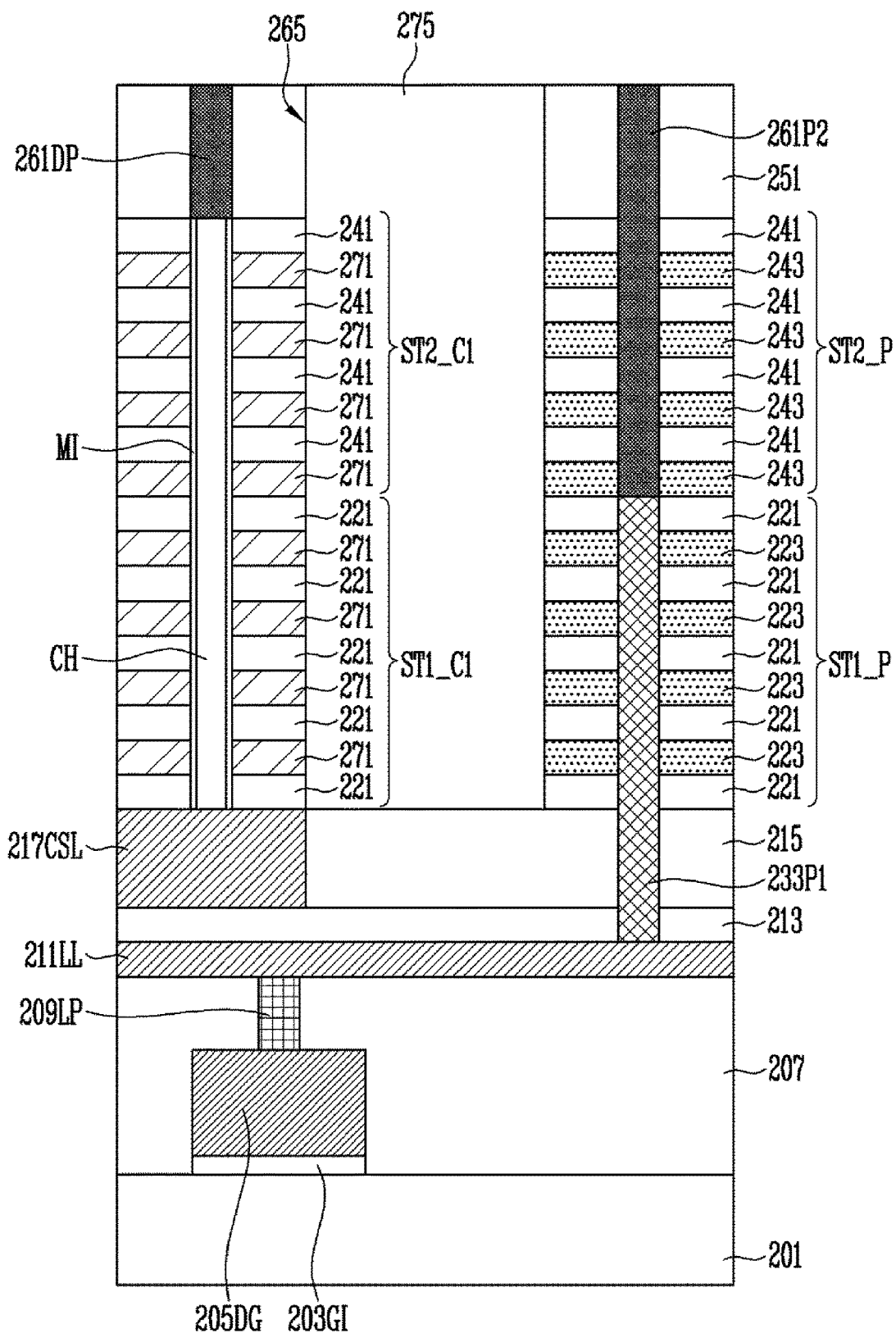

Referring to FIG. 7F, a separation trench 261 penetrating the upper insulating layer 251 and the first to fourth material layers 221, 223, 241 and 243 may be formed. The upper insulating layer 251 may be separated by the separation trench 265, the first to the fourth material layers 221, 223, 241 and 243 may be separated as the pre-cell stacked structures and the peripheral stacked structures ST1_P and ST2_P. The pre-cell stacked structure may be arranged in the cell region which overlaps with the driving transistor and the peripheral stacked structures ST1_P and ST2_P may be arranged in the dummy region (DA of FIG. 3B) separated from the cell region. The peripheral stacked structures ST1_P and ST2_P may include the first peripheral stacked structure ST1_P and the second peripheral stacked structure ST2_P. The first peripheral stacked structure ST1_P may include the first the second material layers 221 and 223 and may be penetrated by the first lower buried layer 233P1. The second peripheral stacked structure ST2_P may include the third and fourth material layers 241 and 243 and may be penetrated by the second contact plug 261P2.

Hereafter, the separation trench 265 may be filled with an interlayer stacked structure insulating layer 275.

Subsequently, the slit forming process and the process of replacing the second and the fourth material layers of the pre cell stacked structure with the fifth material patterns 271 through the slit may be performed as described in FIG. 5D. Hereby, the structural material in which the first and second cell stacked structures ST1_C1 and _C1 are stacked in the cell region overlapping with the driving transistor. The first cell stacked structure ST1_C1 may include the first material layer 221 and the fifth material patterns 271 alternately stacked, and the second cell stacked structure ST2_C1 may include the third material layers 241 and the fifth material patterns 271 alternately stacked.

Figure 7G:
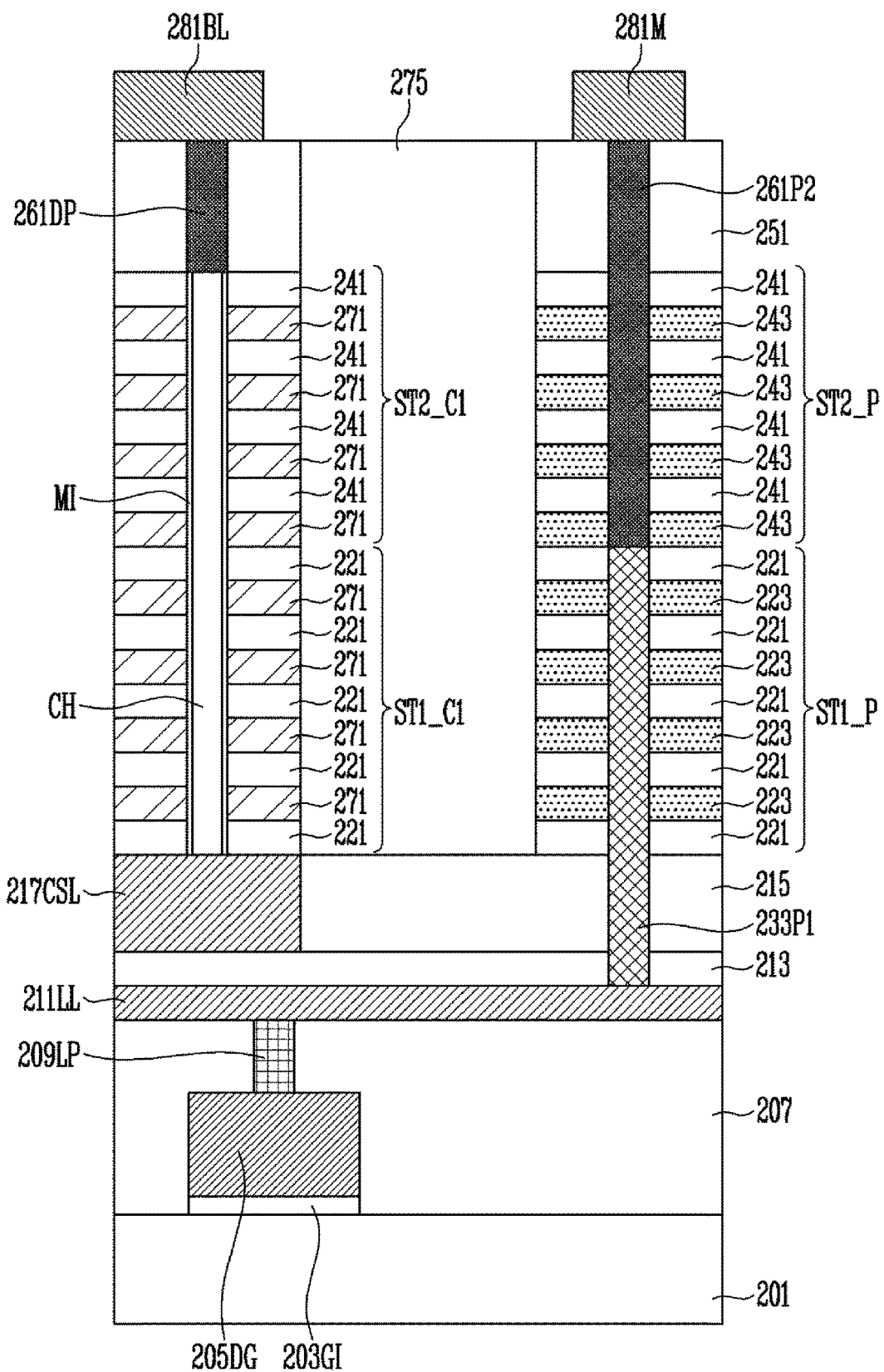

Referring to FIG. 7G, a peripheral wire 281M coupled to a second contact plug 261P2 and a bit line 281BL coupled to a channel contact plug 261DP may be formed on the upper insulating layer 251.

Figure 8A:
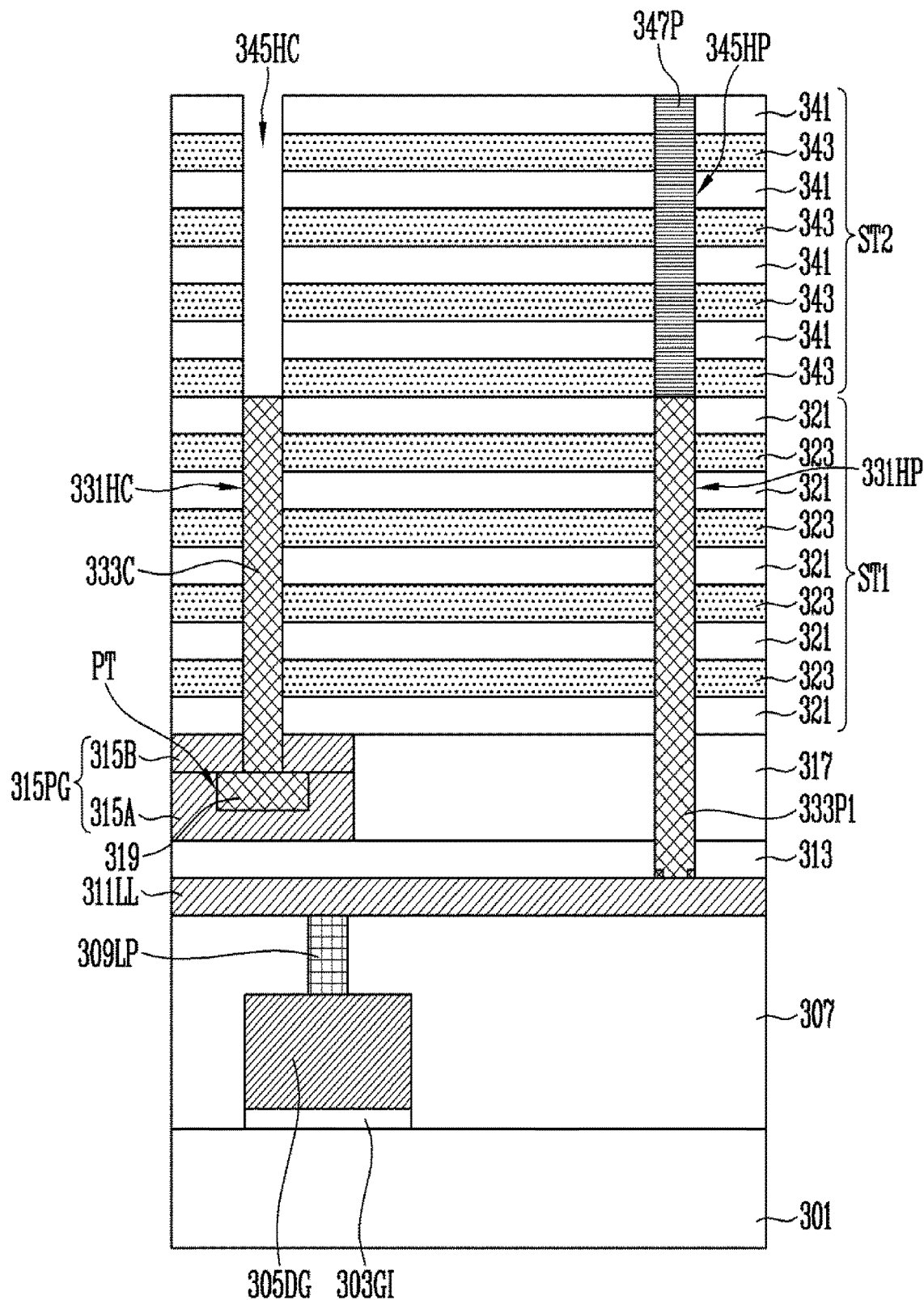
FIGS. 8A to 8C are cross-sectional views illustrating a manufacturing method of the driving transistor, the plug structure and the memory string structure of a semiconductor device according to an embodiment of the disclosure.
Figure 8B:
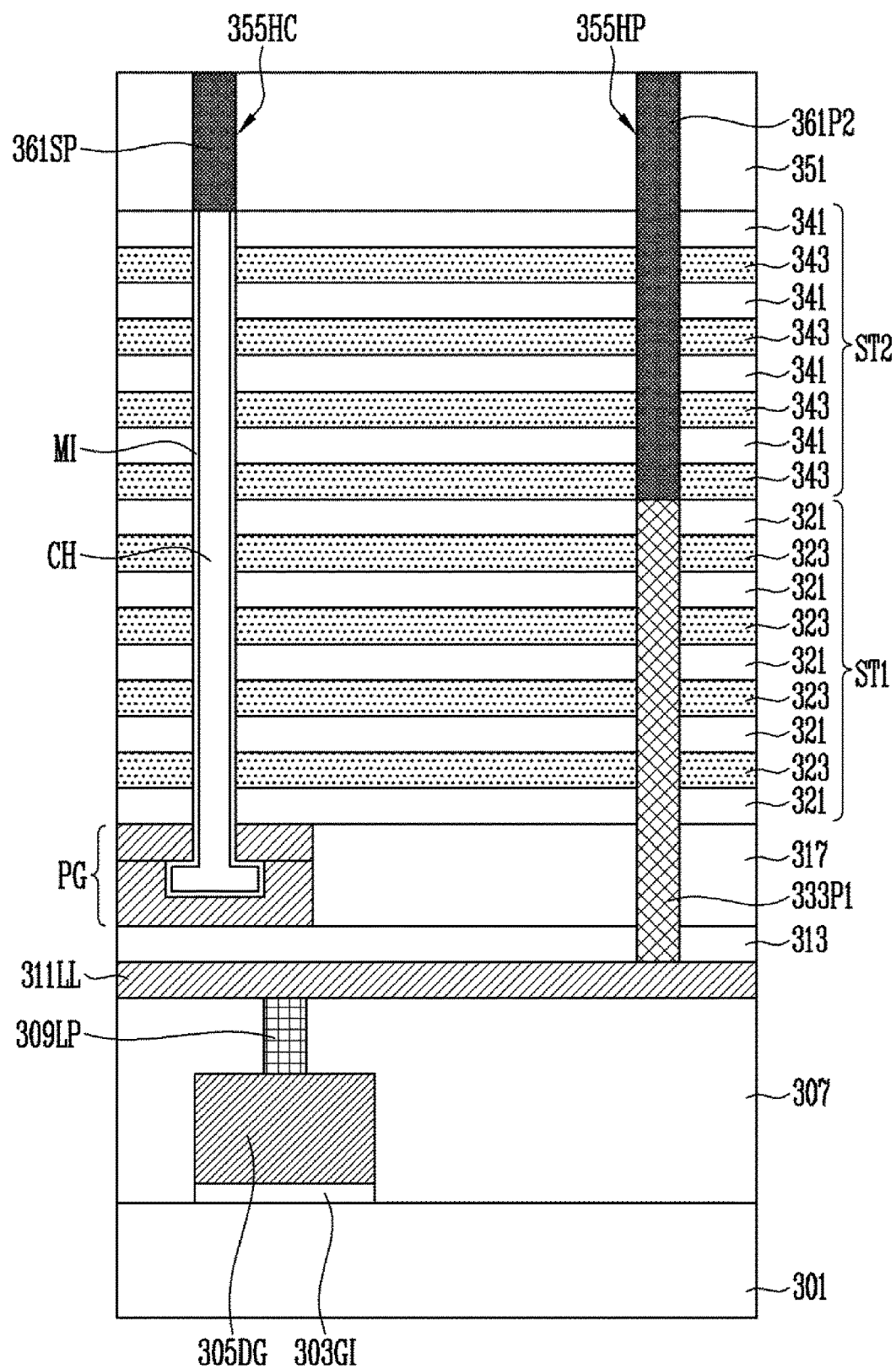
Figure 8C:
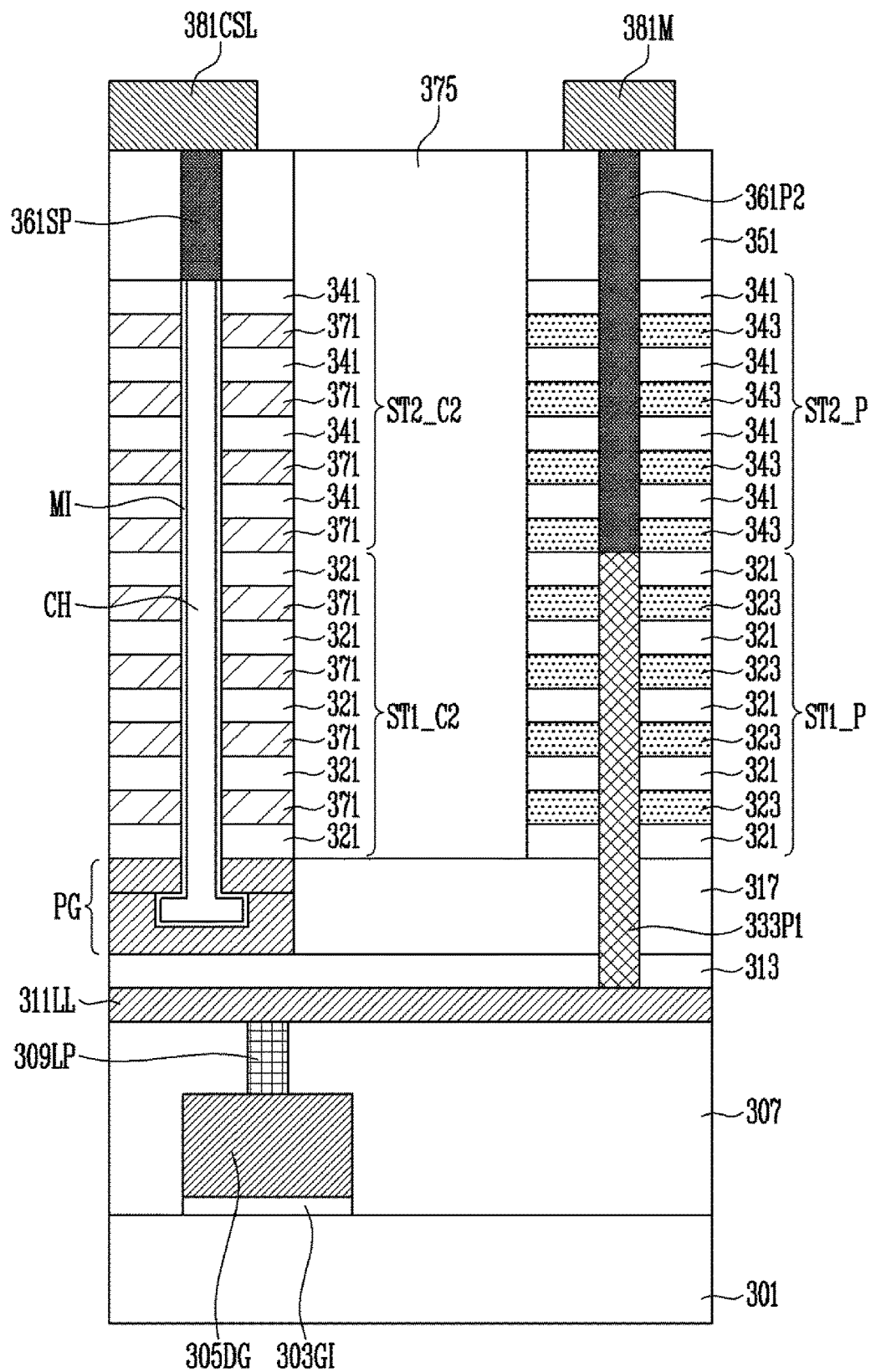

FIGS. 8A to 8C are cross-sectional views illustrating a manufacturing method of the driving transistor, the plug structure and the memory string structure of the semiconductor device according to an embodiment of the disclosure. FIGS. 8A to 8C illustrate an example where the cell region and the peripheral regions overlap with each other, and the memory string structure described in FIG. 2B is formed in the cell region.

Referring to FIG. 8A, the driving transistor including the driving gate 305DG may be formed on the substrate 301. The gate insulating layer 303GI may be formed between the driving gate 305DG and the substrate 301. A method of forming the driving transistor may be described in FIG. 7A.

Subsequently, the first lower insulating layer 307, the lower plug structure 309LP and the connection wire 311LL may be formed with the same method as described in FIG. 7A. The lower plug structure 309LP may be electrically coupled to the driving gate 305DG by penetrating the first lower insulating layer 307, and the connection wire 311LL may be electrically coupled to the lower plug structure 309LP.

Subsequently, the second lower insulating layer 313 may be formed, and first conductive layer 315A may be formed on the second lower insulating layer 313. The pipe trench PT filled with the pipe buried layer 319 in the first conductive layer 315A may be formed. Hereafter, the second conductive layer 315B covering the pipe buried layer 319 may be formed. Subsequently, the pipe gate 315PG may be formed by etching the first and second conductive layers 315A and 315B. Hereafter, the region in which the first and second conductive layers 315A and 315B are removed may be filled with the third upper insulating layer 317.

Subsequently, the first stacked structure ST1 penetrated by first and second lower buried layers 333P1 and 333C spaced apart from each other with the same process described in FIG. 7B may be formed. The first stacked structure ST1 may include the first and second material layers 321 and 323 alternately stacked. The properties of the first and second material layers 321 and 323 may be as described in FIG. 7B.

The first stacked structure ST1 may be penetrated by the first and second lower through holes 331HP and 331HC. The first lower penetration hole 331HP may penetrate the second and third lower insulating layers 321 and 317 to expose the connection wire 311LL. The first lower through hole 331HP may be filled with the first lower buried layer 333P1. The first lower buried layer 331P1 may be electrically coupled to the connection wire 311LL.

The second lower through hole 331HC may be coupled to the pipe trench PT by further penetrating the second conductive layer 315B. The second lower through hole 331HC may be filled with the second lower buried layer 333C.

Subsequently, the second stacked structure ST2 penetrated by the first and second upper through holes 345HP and 345HC on the first stacked structure ST1 penetrated by the first and second lower buried layers 333P1 and 333C may be formed using the process as described in FIG. 7C. The second stacked structure ST2 may include the third material layers 341 and the fourth material layers 343 alternately stacked. The first upper through hole 345HP may be coupled to the first lower through hole 331HP, and the second upper through hole 345HC may be coupled to the second through hole 331HC.

Hereafter, the upper buried layer 347P may fill in the first upper through hole 345HP using the process described in FIG. 7C. Hereby, the second upper through hole 345HC may leave the second lower buried layer 333C exposed.

Referring to FIG. 8B, the second lower buried layer (333C of FIG. 8A) and the pipe buried layer (319 of FIG. 8A) may be removed via the second upper through hole 345HC. Hereafter, the memory layer MI and the channel layer CH may be formed by the same process as described in FIG. 5C.

Subsequently, the first upper insulating layer 351, penetrated by the first contact hole 355HP and the second contact hole 355HC, may be formed by the same process described in FIG. 7E. Hereafter, the second contact plug 361P2 coupled to the first lower buried layer 333P1 penetrating the first upper insulating layer 351 and the second stacked structure ST2 may be formed using the process described in FIG. 7E. Further, the channel contact plug 361SP coupled to the channel layer CH penetrating the first upper insulating layer 351 may also be formed by the same process described in FIG. 7E.

Referring to FIG. 8C, an inter-stacked structure insulating layer 375 penetrating the first upper insulating layer 351, and the first to fourth material layers 321, 323, 341 and 343 may be formed. By the inter-stacked structure insulating layer 375, the first to fourth material layers 321, 323, 341 and 343 may be separated as the pre-cell stacked structures and the peripheral stacked structures ST1_P and ST2_P.

Subsequently, the first cell stacked structure ST1_C2 and the second cell stacked structure ST2_C2 may be formed by performing the forming process of the slit (not illustrated) penetrating the pre cell stacked structures and the replacing the second and fourth material layers 323 and 343 through the slit as described in FIG. 6E with the fifth material patterns 371. The fifth material patterns 371 may be conductive patterns.

Hereafter, the peripheral wire 381M coupled to the second contact plug 361P2 and the common source line 381CSL coupled to the channel contact plug 361DP may be formed on the first upper insulating layer 351.

Although not shown in the figure, the second upper insulating layer (not illustrated) covering the common source line 381CSL, the drain-side contact plug coupled to the channel layer CH penetrating the first upper insulating layer 351 and the second upper insulating layer, and the bit line BL (not illustrated) arranged on the second upper insulating layer and coupled to the drain-side channel contact plug are further formed.

Figure 9:
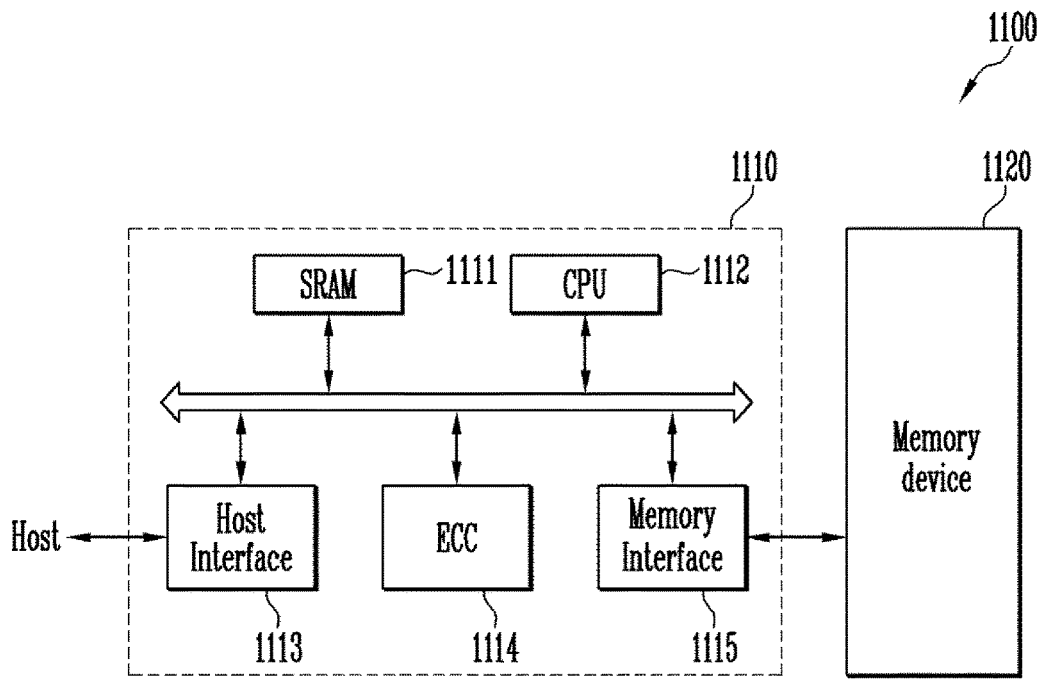
FIG. 9 is a configuration view illustrating a memory system according to an embodiment of the disclosure.

FIG. 9 is a perspective view illustrating a memory system according to an embodiment of the disclosure.

Referring to FIG. 9, the memory system 1100 according to an embodiment of the present disclosure may include a memory device 1120 and a memory controller 1110.

The memory device 1120 may include the structure described in the embodiment described in FIGS. 2A to 8C. Further, the memory device 1120 may be a multi-chip package including a plurality of flash memory chips.

The memory controller 1110 may be configured to control the memory device 1120, and include a SRAM 1111, a CPU 1112, a host interface 1113, an ECC 1114, and a memory interface 1115. The SRAM 1111 may be used as an operation memory of the CPU 1112, and the CPU 1112 may perform the general control operation for data exchange of the memory controller 1110, the host interface 1113 may include a data change protocol of a host coupled to the memory system 1100. Further, the ECC 1114 may detect or correct errors included in data read from the memory device 1120, and the memory interface 1115 may perform interfacing with the memory device 1120. In addition, the memory controller 1110 may further include ROM a storing code date for interfacing with the host.

As such, the memory system 1100 may be a memory card in which the memory device 1120 and the controller 1110 are combined with, or the memory system 1100 may be a solid state disk SSD. For example, when the memory system 1100 is the SSD, the memory controller 1110 may communicate with an external device (for example, a host) through one of the various interface protocol such as USB, MMC, PCI-E, SATA, PATA, SCSI, ESDI and IDE.

Figure 10:
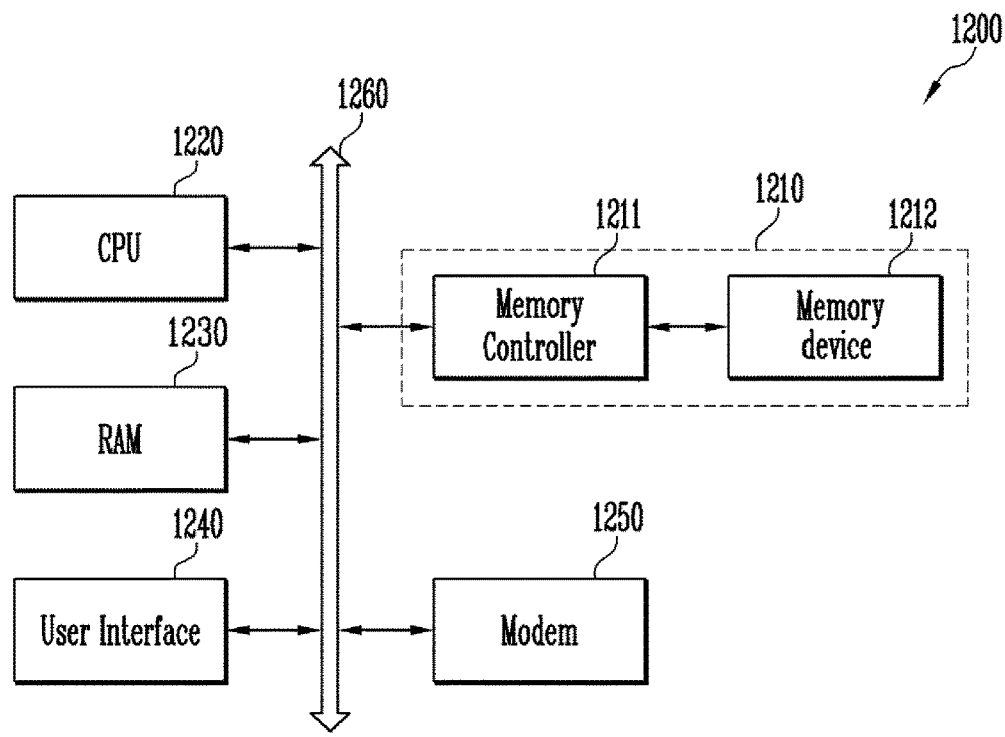
FIG. 10 is a configuration view illustrating a computing system according to an embodiment of the disclosure.

FIG. 10 is a perspective view illustrating a computing system according to an embodiment of the present disclosure.

Referring to FIG. 10, the computing system 1200 according to the embodiment of the present disclosure may include CPU 1220, RAM 1230, a user interface 1240, a modem 1250 and a memory system 1210 electrically coupled to a system bus 1260. Further, when the computing system 1200 is a mobile device, a battery to provide an operation voltage to the computing system 1210 may be further included, and an application chipset, a camera image processor CIS and a mobile D-ram may be further included.

The memory system 1210 may include a memory device 1212 and a memory controller 1211 as described referring to FIG. 9.

According to embodiments, the plug structure coupled to the driving transistor may be formed as the stacked structure including at least two of the contact plugs shorter than the length of the channel layer of the cell string. Therefore, a height of each contact plug constituting the plug structure may be prevented from being excessively increased although the number of a cell stacked structures increases. Accordingly, structural stability of the plug structure may be improved.

According to embodiments, the height of each contact plug constituting the plug structure may be prevented from being excessively increased, and the uppermost plug structure may have a small width. Therefore, the size of the semiconductor device may be reduced.

According to embodiments, the height of the contact plug constituting the plug structure may be prevented from being excessively increased, and the lowermost plug structure may have a large width. Therefore, contact area of the lowermost part of the plug structure may be wide.

According to embodiments, the forming process of the plug structure with improved structural stability may be simplified by forming the buried layer for a sacrificial layer for penetrating one of the cell stacked structures, and forming the buried layer for the contact plug coupled to the driving transistor in the peripheral region at the same time.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the disclosure as set forth in the following claims.

What is claimed is:

1. A semiconductor device, comprising:
   a substrate including a first region and a second region;
   a cell stacked structure connected with a memory string, wherein the cell stacked structure includes interlayer insulating layers and conductive patterns alternately stacked over the substrate in the first region;
   a driving transistor disposed between the cell stacked structure and the substrate in the first region;
   a connection wire coupled to the driving transistor under the cell stacked structure and extending over the substrate in the second region;
   a plug structure coupled to the connection wire over the substrate in the second region and extending parallel to the cell stacked structure; and
   first insulating layers and second insulating layers alternately stacked over the substrate in the second region,
   wherein the first insulating layers are disposed on same layers as the interlayer insulating layers of the cell stacked structure, respectively,
   wherein the second insulating layers are disposed on same layers as the conductive patterns of the cell stacked structure, respectively, and
   wherein the plug structure penetrates the first insulating layers and the second insulating layers.

2. The semiconductor device of claim 1, further comprising:
   a channel layer penetrating the cell stacked structure;
   a channel contact plug disposed above the cell stacked structure and coupled to the channel layer;
   a cell metal wire coupled to an upper surface of the channel contact plug; and
   a peripheral metal wire coupled to an upper surface of the plug structure and arranged on a same layer as the cell metal wire.

3. The semiconductor device of claim 2, wherein the plug structure includes first and second contact plugs shorter than the channel layer stacked on each other.

4. The semiconductor device of claim 3, wherein the second contact plug is formed of a different conductive material from the first contact plug.

5. The semiconductor device of claim 3, wherein each of the first and second contact plugs has a portion parallel to the cell stacked structure.

6. The semiconductor device of claim 3,
   wherein the first contact plug is coupled to an upper surface of the connection wire and extends toward the second contact plug, and
   wherein the second contact plug is coupled to an upper surface of the first contact plug and extends to contact the peripheral metal wire.

7. The semiconductor device of claim 6, wherein the second contact plug is formed of a same conductive material as the channel contact plug.

8. The semiconductor device of claim 2, further comprising:
   a common source line disposed between the cell stacked structure and the connection wire, and contacting the channel layer; and
   a memory layer extending along an interface between the cell stacked structure and the channel layer.

9. The semiconductor device of claim 2, further comprising:
   a pipe channel downwardly protruding from the channel layer;
   a pipe gate disposed between the cell stacked structure and the connection wire, and surrounding the pipe channel; and
   a memory layer extending along an interface between the pipe gate and the pipe channel and an interface between the cell stacked structure and the channel layer.

10. The semiconductor device of claim 1,
    wherein the plug structure includes at least one of silicon germanium and carbon.

11. A semiconductor device, comprising:
    a substrate including a first region and a second region;
    at least two groups of cell stacked structures stacked in a first direction over the substrate in the first region and connected with a memory string;

a driving transistor disposed between the cell stacked structures and the substrate in the first region;

a connection wire coupled to the driving transistor under the cell stacked structures and extending over the substrate in the second region; at least two contact plugs coupled to the connection wire above the substrate in the second region and stacked in the first direction; and at least two groups of peripheral stacked structures stacked in the first direction over the substrate in the second region and penetrated by the contact plugs, wherein the contact plugs include a lower contact plug formed of a conductive material having an etch selectivity against material layers of the peripheral stacked structures, wherein each of the cell stacked structures includes interlayer insulating layers and conductive patterns alternately stacked in the first direction, and wherein the material layers of the peripheral stacked structures are disposed on same layers as the interlayer insulating layers and the conductive patterns.

12. The semiconductor device of claim 11, further comprising:

a channel layer penetrating the cell stacked structures;

a channel contact plug disposed above the cell stacked structures and coupled to the channel layer;

a cell metal wire coupled to an upper surface of the channel contact plug; and a peripheral metal wire arranged on a same layer as the cell metal wire, wherein the contact plugs further include an uppermost contact plug between the peripheral metal wire and the lower contact plug.

13. The semiconductor device of claim 12, wherein the uppermost contact plug extends from a bottom surface of the peripheral metal wire toward the lower contact plug to have a length greater than that of the channel contact plug.

14. The semiconductor device of claim 12, wherein the uppermost contact plug is formed of a same conductive material as the channel contact plug.

15. The semiconductor device of claim 12, further comprising:

a common source line disposed between the cell stacked structures and the connection wire, and contacting the channel layer; and a memory layer extending along interfaces between the cell stacked structures and the channel layer.

16. The semiconductor device of claim 12, further comprising:

a pipe channel downwardly protruding from the channel layer;

a pipe gate disposed between the cell stacked structures and the connection wire, and surrounding the pipe channel; and a memory layer extending along an interface between the pipe gate and the pipe channel and interfaces between the cell stacked structures and the channel layer.

17. The semiconductor device of claim 11, wherein the lower contact plug includes at least one of silicon germanium and carbon.

18. A semiconductor device, comprising:

a substrate including a first region and a second region;

at least two groups of cell stacked structures stacked in a first direction over the substrate in the first region and connected with a memory string;

a driving transistor disposed between the cell stacked structures and the substrate in the first region;

a connection wire coupled to the driving transistor under the cell stacked structures and extending over the substrate in the second region;

at least two contact plugs coupled to the connection wire above the substrate in the second region and stacked in the first direction; and at least two groups of peripheral stacked structures stacked in the first direction over the substrate in the second region and penetrated by the contact plugs, wherein the contact plugs include a lower contact plug formed of a conductive material having an etch selectivity against material layers of the peripheral stacked structures, and wherein an interface between the at least two groups of the cell stacked structures and an interface between the at least two contact plugs are arranged at a same height.

* * * * *